United States Patent [19]
Khominich

[11] Patent Number: 6,103,074
[45] Date of Patent: Aug. 15, 2000

[54] CATHODE ARC VAPOR DEPOSITION METHOD AND APPARATUS

[75] Inventor: Viktor N. Khominich, Minneapolis, Minn.

[73] Assignee: Phygen, Inc., Minneapolis, Minn.

[21] Appl. No.: 09/024,004

[22] Filed: Feb. 14, 1998

[51] Int. Cl.[7] .................................................. C23C 14/32
[52] U.S. Cl. ................................ 204/192.38; 204/298.41
[58] Field of Search ........................... 204/192.38, 298.41

[56] References Cited

U.S. PATENT DOCUMENTS

| | | |
|---|---|---|
| 3,783,231 | 1/1974 | Sablev et al. . |
| 3,793,179 | 2/1974 | Sablev et al. . |
| 3,836,451 | 9/1974 | Snaper . |
| 4,448,799 | 5/1984 | Bergman et al. . |
| 4,452,686 | 6/1984 | Axenov et al. . |
| 4,485,759 | 12/1984 | Brandolf . |
| 4,511,593 | 4/1985 | Brandolf . |
| 4,512,867 | 4/1985 | Andreev et al. . |
| 4,551,221 | 11/1985 | Axenov et al. . |
| 4,556,471 | 12/1985 | Bergman et al. . |
| 4,619,755 | 10/1986 | Hessberger et al. . |
| 4,620,913 | 11/1986 | Bergman . |
| 4,622,452 | 11/1986 | Bergman et al. . |
| 4,724,058 | 2/1988 | Morrison, Jr. . |
| 4,929,321 | 5/1990 | Buhl . |
| 4,929,322 | 5/1990 | Sue et al. . |
| 4,952,843 | 8/1990 | Brown et al. . |
| 5,037,522 | 8/1991 | Vergason . |
| 5,126,030 | 6/1992 | Tamagaki et al. . |
| 5,203,980 | 4/1993 | Cremer et al. . |
| 5,269,896 | 12/1993 | Munemasa et al. . |
| 5,269,898 | 12/1993 | Welty . |
| 5,277,778 | 1/1994 | Daube et al. . |
| 5,279,723 | 1/1994 | Falabella et al. . |

(List continued on next page.)

FOREIGN PATENT DOCUMENTS

| | | |
|---|---|---|
| 265506 | 3/1989 | Germany . |
| 2037562 | 6/1995 | Russian Federation . |
| 2039849 | 7/1995 | Russian Federation . |
| 2046836 | 10/1995 | Russian Federation . |
| 284883 | 7/1976 | U.S.S.R. . |
| 359977 | 7/1976 | U.S.S.R. . |
| 563826 | 3/1978 | U.S.S.R. . |
| 1062308 | 9/1992 | U.S.S.R. . |
| 1074145 | 9/1992 | U.S.S.R. . |

OTHER PUBLICATIONS

Symposium of Plasma Dynamics. (Clauser, F.H., ed.); Addison–Wesley Publishing Co., Inc., 1957, pp. 22–23.

(List continued on next page.)

*Primary Examiner*—Nam Nguyen
*Assistant Examiner*—Gregg Cantelmo
*Attorney, Agent, or Firm*—Shanks & Herbert

[57] ABSTRACT

The present invention relates to an apparatus and method for enhancement of the stream of plasma particles created by the process of cathode arc vapor deposition. The apparatus is designed to control through trapping the plasma particles generated from a sacrificial cathode plasma source and focus the plasma particle stream to collide with and deposit upon the substrate to be coated. The apparatus includes a magnetic field generator for generating a magnetic field of a distinctive cusp shape. The anode is insulated from the chamber to strengthen and sharpen the electric field potential created in the chamber. This stronger, sharper electric field potential is contoured to create an electron trap having an aperture through which the plasma ions are directed at the substrate to be coated. The specific configuration described directs the plasma particles efficiently in that the plasma deposition rate is higher per unit of magnetic field strength than can be obtained with other commercial designs. In addition, a smoother, more stable arc discharge per unit of applied electric current to the system is possible. The distinctive electric field potential created by the instant invention results in a more enhanced stream of vaporized source material, which improves the quality and corrosion resistance of the product coatings. A more stable cathode arc discharge is also possible.

55 Claims, 26 Drawing Sheets

U.S. PATENT DOCUMENTS

| | | |
|---|---|---|
| 5,282,944 | 2/1994 | Sanders et al. . |
| 5,298,136 | 3/1994 | Ramalingam . |
| 5,306,408 | 4/1994 | Treglio . |
| 5,317,235 | 5/1994 | Treglio . |
| 5,380,421 | 1/1995 | Gorokhovsky . |
| 5,387,326 | 2/1995 | Buhl et al. . |
| 5,433,836 | 7/1995 | Martin et al. . |
| 5,435,900 | 7/1995 | Gorokhovsky . |
| 5,441,624 | 8/1995 | Chan et al. ............ 204/298.41 |
| 5,451,308 | 9/1995 | Sablev et al. . |
| 5,458,754 | 10/1995 | Sathrum et al. . |
| 5,468,363 | 11/1995 | Falabella ............ 204/298.41 |
| 5,480,527 | 1/1996 | Welty . |
| 5,531,877 | 7/1996 | Latz et al. . |

OTHER PUBLICATIONS

Haines, M.G., "Plasma Containment in Cusp–Shaped Magnetic Fields," Nuclear Fusion, 1977;17(4):811–858.

Dorodnov, A.M., "Technical applications of plasma accelerators," Sov. Phys. Tech. Phys., 1978; 23(9):1058–1065.

Stirling, W.L., et al., "Magnetic multipole line–cusp plasma generator for neutral beam injectors," Rev. Sci. Instrum., 1979;50(1):102–108.

Sanders, D.M., Pyle, E.A., "Magnetic enhancement of cathodic arc deposition," J. Vac. Sci. Tech. A., 1987;5(4):2728–2731.

Popov, V.F., Gorin, Yu. N., "Processes and Installations for Electron–Ion Technologies," Moscow, Vyshay Shkola, 1988, pp. 203–213.

Sanders, D.M., et al., "Coating Technology Based on the Vacuum Arc—A Review," IEEE Transactions on Plasma Science, 1990;18(6):883–894.

Munz, W–D., "The unbalanced magnetron: current status of development," Surface and Coatings Technology, 1991;48:81–94.

Munz, W–D., et al., "A new concept for physical vapor deposition coating combining the method of arc evaporation and unbalanced–magnetron sputtering," Surface and Coatings Technology, 1991;49:161–167.

Falabella, S., Karpov, D.A., "Continuous Cathodic Arc Sources," Handbook of Vacuum Arc Science and Technology, 1995 (Boxman, R.L., Sanders, D.M., Martin, P.J., eds.), pp. 397–423, Noyes Publication, Park Ridge, NJ.

Semenyuk, V.F., Khominich, V.N., "Influence of Inhomogenious Magnetic Field on Characteristics of Vacuum Arc Discharge with Cold Cathode," Ukrainian–French Symposium: Condensed Matter: Science and Industry, Lviv, 1993, p. 357.

Kustov, V.V., Marahtanov, M.K., "Spatial Nonuniformity of Process Characteristics of an Arc Evaporator of 'BULAT–6' installation," Physics and Chemistry of the Material Treatment, 1994;6:155–157.

Barinok, B.A., "Stressed State Control and Properties of Plasma Coatings," Moscow, Mashinostroenie, 1990, 37–40.

Mozgrin, D.V., et al., "Experimental evaluation of high–current modes of quasi–stationary low pressure discharge in the magnetic field," Soc. J. Plasma. Phys., 1995;21(5):422–433.

Rusakov, A.I., et al., "Controlling the Locations of the Channel of an Arc Discharge in Vacuum–Arc Devices," XVIIth Internat'l Symp. on Discharges and Electrical Insulation in Vacuum, Berkeley, CA,1996,pp. 109–120.

Abramova, K.B., et al., "Rotating Plasma in Closed Magnetic Trap," XVIIth Internat'l Symp. on Discharges and Electrical Insulation in Vacuum, Berkeley, CA, 1996, pp. 459–461.

Semenyuk, V., et al., "Physical and Technological Features of the Arc Vacuum System for Coating Deposition Based on the Plasma Arc Accelerator," XVIIth Internat'l Symp. on Discharges and Electrical Insulation in Vacuum, Berkeley, CA, 1996, pp. 871–875.

Zhitomirsky, V.N., et al., "Role of the Magnetic Field in the Cathode Region During Vacuum Arc Operation," XVIIth International Symp. on Discharges and Electrical Insulation in Vacuum, Berkeley, CA, 1996, pp. 876–880.

Aksenov, I.I., et al., "Formation of Filtered Intence Vacuum–Arc Plasma Flows," XVIIth Internat'l Symp. on Discharges and Electrical Insulation in Vacuum, Berkeley, CA, 1996, pp. 895–899.

Anders, S., et al., "Modification of Cathodic Arc Deposition Profiles by Magnetic Multicusps," XVIIth Internt'l Symp. on Discharges and Electrical Insulation in Vacuum, Berkeley, CA, 1996, pp. 909–913.

Rybnikov, A.I., et al., "Protective Coatings Produced by Vacuum Arc Deposition," XVIIth Internat'l Symp. on Discharges and Electrical Insulation in Vacuum, Berkeley, CA, 1996, pp. 918–921.

Coll, B.F., Sanders, D.M., "Design of vacuum arc–based sources," Surface and Coatings Technology, 1996;81:42–51.

Karpov, D.A., et al., "Experiments on thick coatings deposited by means of arc technology," Surface and Coatings Technology, 1997;89:58–61.

Hurkmans, T., et al., "A new large volume PVD coatings system using advanced controlled arc and combined arc/unbalanced magnetron (ABS) deposition techniques," Surface and Coatings Tech., 1997;92:62–68.

"Magnetic traps," Plasma Physics andNuclear Fusion Problems, Academy of Science of UKr. SSR, Kiev 1965, pp. 5–17.

Morozov, A.I., Plasma Accelerators, (Artzimovich, I.A., et.), Moscow, Mashinostroenie, 1972, pp. 5–15.

Lavrentiev, O.A., "Electrostatic and Electromagnetic Traps of High–Temperature Plasma," AN Ukr.SSR, KhPhTI 74–37, Kharkov, 1974, pp. 3–39.

Lavrentiev, O.A., et al., "Injection of Electron and Plasma Confinement within the Multiple–Slot Electro magnetic Trap," Ph. Tech. Inst. of Sci. of Ukr.SSR, KhPh.Tech. Inst., 76–3, Kharkov, 1974, pp. 1–18.

Dorodnov, A.M., Miroshkin, S.I., "Vacuum Erosion–Type Generators and Plasma Accelerators Working on Alternating Current," N.E. Bauman Moscow Higher Tech. School, 1980;18(5):821–830.

Morozov, A.I., "Plasma Accelerators and Ion Injectiors," Moscow, Nauka, 1984, pp. 82–105.

Bergman, C., "Ion Flux Characteristics in Arc Vapor Deposition of Tin," Surface and Coatings Tech., 1988;36:243–255.

Sanders, D.M., "Review of ion–based coating processes derived from the cathodic arc," J. Vac. Sci. Technol., 1989;A7(3):2339–2345.

Anders, A., et al., "Transport of vacuum arc plasmas through magnetic macroparticle filters," Plasma Sources Sci. Technol., 1995;4:1–12.

U.S.S.R. Author's Certificate No. 236216 Issued on May 5, 1986, based on application No. 3093618.

R < 1   R ≤ 1   R > 1   R >> 1

CATHODE ARC VAPOR DEPOSITION METHOD AND APPARATUS

BACKGROUND OF THE INVENTION

1. Field of the Invention

The invention relates to sacrificial cathode-type electric arc vapor deposition.

2. Description of Related Art

The technique of electric arc physical vapor deposition is not new. The elements present in such apparatuses can be generalized to include an electrically biased coating source material serving as a cathode, an anode positioned apart from the cathode, and an initiator to initiate the arc discharge. The arc provides the energy for vaporizing the solid source material constituting the cathode. The vaporization from the cathode surface is very localized, and the high energy point at which the vaporization is occurring is often called the "cathode spot." The discharge is carried out in a chamber maintained at negative pressure. The vaporized source material or plasma, includes atoms of the source material, ions of such atoms, molecules containing atoms of the source material, and ions of such molecules. The process of depositing such plasma particles onto the substrate can be enhanced by creating an ionic attraction between the plasma particles and the substrate surfaces. Typically, this is accomplished by applying a bias voltage to the substrate.

Several techniques are known for coating by physical vapor deposition using the vacuum arc discharge. The various techniques can be differentiated by their attempts to improve design performances and coating process parameters. Historically, the first attempts employed only the natural physical properties of an arc discharge plasma produced by cathode spots for a coating deposition. The design efforts focused on stabilization of the discharge on the cathode surface, improving cathode material utilization, and improving the reliability of the arc ignition. Stabilization was usually achieved using some magnetic, electrostatic, or physical method for controlled movement of the cathode spot. The resulting plasma stream generated by the cathode spots diffused during propagation. Plasma density naturally decreased with the square of the distance between the cathode and the substrate. The magnetic fields that were used to control cathode spot movement were not strong enough to change substantially the plasma flow parameters.

U.S. Pat. No. 3,625,848 describes a beam gun for use in creating an arc discharge in which electrodes are positioned at different locations to increase the deposition rate. U.S. Pat. No. 3,793,179 describes an apparatus in which random motion of arc spots on the cathode surface are extinguished by a shield when the arc spot moves off the desired evaporative cathode surface.

The cathode electrode can be made of different electroconductive materials and may have different shapes and positions relative to the anode electrodes. The process vacuum chamber is often used as an anode or as a portion of the anode electrode assembly. The anode is sometimes positioned within the vacuum chamber, preferably along the magnetic force lines that are crossing the cathode surface to minimize the arc voltage and provide a certain stability of the arc discharge. The arc discharge is usually powered by low voltage welding power supplies. Such power supplies were used to sustain arc discharges of low voltage to prevent cascade arcing. Such discharge voltages were close to the cathode voltage drop. As a result, there were not significant electric fields existing in the plasma.

An arc discharge can be ignited by injection of plasma into the gap between the discharge electrodes. Ignition has been accomplished by means of electromechanical or pneumatic-driven current disconnectors or by high voltage pulsed devices. Reliability of the ignition devices depends on the geometry of the discharge electrodes and other, mostly empirical parameters. Positioning of the igniter can also be critical in determining the probability that ignition will occur. Igniter positioning is important because arc spots originate from the igniter and can severely damage the igniter assembly. It has been discovered that exposure of the small metallized ceramic elements of the high voltage pulsed igniter device to the arc discharge current while it is positioned in direct electrical and mechanical contact with the cathode electrode is common and problematic. Such positioning decreases the productivity and reliability of the apparatus and results in unnecessary expense due to the need to remove the igniter before replacing the consumable cathode.

Another area of work has focused on improving the quality of the plasma flow generated by the cathode spots through control of the movement of the cathode spots by external static or dynamic magnetic fields. Movement of the cathode spots would have the effect of reducing the overheating that occurs around static cathode spots and decreasing the droplet, or macroparticle, contamination of the plasma flow. Different designs have created a magnetic field whose tangential component is located just over the cathode surface. The magnetic field is then used to steer the motion of the cathode spots in the −j×B or "retrograde" direction, seemingly contrary to Ampere's law. Another approach to the problem has involved use of the internal magnetic fields created by non-uniform arc current distributions in an extended cathode body, a flat rectangular plate, or an elongated rectangular bar or cylinder. These internal magnetic fields interact with an internal magnetic field of the arc discharge column or a small external magnetic field to allow a plasma generation area over the surface of these extended cathodes, thereby improving process productivity and coating uniformity on the substrate. This approach, however, involves the use of magnetic fields which are localized near the cathode surface. These magnetic fields are of such shape and spatial distributions that they cannot change substantially the plasma energy characteristics in the volume. An increase in magnetic field strength in such designs in which the magnetic field means is below the cathode working surface causes arc discharge destabilization or extinction.

Various cathode shapes have been investigated in the prior art. U.S. Pat Nos. 4,609,564, 4,859,489, and 5,037,522 describe the use of a long cylindrical cathode or rod which uses the magnetic field of the arc current itself to induce motion of the arc along the cathode surface. The systems employing flat planar and cylindrical cathodes without external magnetic fields are not stable enough to permit increases in arc current without a tendency of the plasma column to be pinched by the forces of an internal magnetic field of the discharge current and without causing damage by localized melting of the cathode and adjacent elements of the apparatus. When such systems are operated at low arc currents the associated process productivity and flow plasma characteristics are considerably reduced.

The need to induce movement of the arc spots on the cathode surface for the purpose of uniformly consuming the cathode has also been addressed in the prior art. U.S. Pat Nos. 4,673,477 and 4,849,088 induce cathode spot movement through mechanical movement of magnets generating the fields which move the arc spots. U.S. Pat. No. 4,724,058 accomplishes this by use of multiple electromagnets. Cathode size and geometry have also been used to accomplish this arc spot movement and more uniform cathode consumption. German Democratic Republic Pat. No. 265,506 claims the use of axially symmetric magnetic fields parallel to the working surface of a cylindrical or conical cathode. These parallel fields can be created either by the use of oppositely polarized Helmholtz coils arranged above and below the working surface or a toroidal coil configured coaxial to the cathode at the height of the working surface. Helmholtz coils are known to produce a highly homogeneous magnetic field in a large volume of space. They consist of a pair of equal strength and similarly polarized, i.e., parallel co-axial magnetic coils connected in series which are separated from one another by their mean radius. If the Helmholtz coils are polarized oppositely, i.e., in an anti-parallel fashion, the radial magnetic field between the coils will be substantially less than the axial component of the magnetic field inside the coils because the flux created by the currents in both coils has passed through the openings of the coils and must pass also through the radial slot between the coils. A ratio of cross sectional areas of the coil openings and the radial slot between the coils determines the ratio of the axial and the radial components of the magnetic field strength. The invention is characterized by a cross sectional area of the radial slot between the coils that substantially exceeds the area of the coil openings, and this results in a small radial magnetic field component of only about 0.1–1.0 milli Teslas near the cathode surface, which is not sufficient to effectively control cathode spot motion.

Many attempts have been made to channel and improve the quality of the plasma stream during propagation between the cathode and the substrate surfaces. The plasma stream generated by cathode spots diffuses as it moves towards the substrate, and the plasma density naturally decreases with the square of this distance. The beam pattern of the plasma stream is slightly different from that predicted by the cosine law because of the combination of neutral and ion components. An increase in the arc current increases this difference due to the focusing action of an internal magnetic field produced by this arc discharge current. Application of an external longitudinal magnetic field focuses the plasma components of the plasma stream and improves, to some extent, the cathode material utilization. The plasma characteristics, however, remain the same as they would be without a magnetic field because the magnetic fields applied are not strong enough to change substantially the ionization processes in the volume.

Stronger magnetic fields have been applied to separate the plasma component from the macroparticles by deflection of the plasma through the use of curvilinear and/or rectilinear magnetic filters. These filters are typically a combination of solenoids which guide the plasma component along the magnetic force lines and a set of baffles along the chamber walls to collect the relatively massive macroparticles. Use of such a curvilinear magnetic filter approach can improve the coating quality substantially. However, this approach is difficult to apply when coating using relatively low melting-, or multicomponent-cathode electrodes, where the degree of ionization of the plasma is low or may differ substantially for the different components of the alloy. In these cases, coating deposition rates drop substantially from the conventional cathodic arc value or change the composition of the coating from that of the alloy. As a result, this filtering technique may be only of academic interest.

A completely different approach was proposed in the late 1970's to improve the arc coating technique. The technique involved the use of an externally applied magnetic field to accelerate the plasma using the principle of the Hall plasma accelerator. A steady state Hall accelerator is described as a co-axial system of electrodes including a butt-end central cathode electrode made of the material to be transformed into the plasma state by vacuum arc discharge from the cathode spots and a copper anode shaped as a cone nozzle positioned outside the cathode electrode. A gas injecting distributor positioned close to the substrate is described and used for injecting a working or ionizable gas into the process chamber. The plasma acceleration was carried out using an internal azimuthal magnetic field created by a discharge current in excess of 1000 Amps or in an externally imposed axially diverging magnetic field. In the latter case the accelerator is provided with a magnetic coil on the anode that creates a magnetic field distribution of a shape that looks similar to that described much later in U.S. Pat. No. 5,126,030. An electrically insulated screen and the magnetic field created by the coil provides stabilization of the cathode spots on the central part of the cathode flat surface, and the plasma stream is focused along the accelerator axis. When the magnetic field is applied a general rotation of the plasma can be observed. This rotation is believed to be due to a revolving pattern of the cathode spots over the surface of the cathode. An increase of the magnetic field strength to over 50 Gauss, however, causes an overheating of the cathode and a corresponding increase in the droplet or macroparticle component of the plasma flow. These effects limit the performance of the accelerator in the useful magnetic field intensity range. At field intensities less than 50 Gauss, a certain separation of the droplet component of the plasma flow was described as the magnetic field was increased. This was explained as being due to the charging of the droplets by collision with plasma electrons followed by an electric field action that pushes the droplets out of the plasma stream.

U.S. Pat. No. 5,126,030 issued to Tamagaki et al. describes a cathodic arc deposition method and apparatus comprising at least one magnetic coil means to produce a magnetic field arranged between the arc evaporation source and the substrate. The magnetic field lines are constricted in the space between the evaporation source and the substrate. The vacuum chamber, acting as the anode, is connected to the positive pole of the power supply. The coating deposition rate increases up to about the "saturation value" of 0.25 $\mu$m/min as the magnetic current is increased. The increase of plasma density and the existence of a comparatively low deposition rate at the "saturation" level at such a short distance from the coil can only be explained by the focusing action of the magnetic field on the plasma stream generated by the arc discharge. Such focusing does not increase the productivity, or deposition rate, above that which would be expected from an apparatus without these features, and the focusing does not increase the quality of the coatings. In fact, such focusing might even be expected to result in considerable non-uniformity of coating thickness across the substrate surface.

U.S. Pat. No. 5,458,754 of Sathrum et al. discloses a plasma enhancement apparatus and method for coating deposition. A tubular plasma guide is connected to the face of the cathode with a solenoid arranged around the non-magnetic stainless steel duct. The magnetic field created by the solenoid is purposely non-homogeneous to create a strong and confined "bottleneck" magnetic field within the plasma guide. The geometrical factors influencing the magnetic field orientation and gradient include the number and the separation distance of the air gap. An independent direct current up to 70 Amps through the solenoid can produce magnetic fields as high as 150 mT. With the design described, the magnetic field maximum intensity is located axially just in front, that is, to the substrate facing side, of the consumable cathode. An increased velocity of arc spot motion is achieved by magnetic pole pieces housed inside the coil to create a transverse component of the magnetic field in the vicinity of the cathode face. The necessity to increase the axial component of the magnetic field up to 150 mT causes extreme compression of the plasma flow. This fact, combined with the high magnetic field strength required for the cathode spot motion control simultaneous with the need for stable arc discharge operation limits the cathode dimension and, therefore, the coating productivity of the apparatus. The observed decrease in droplet concentration in the plasma stream is mainly due to the high magnetic field which causes constriction of the stream and the physical dimensions of the outlet aperture. Such a geometry results in extremely high non-uniformity of the coating thickness on the substrate, in turn limiting the industrial applicability of the apparatus.

Semenyuk has described a discharge system which uses a water-cooled co-axial cathode and anode. The side surfaces of the cathode are bordered by a single screening electrode which is not in electrical contact with the other electrodes of the discharge system. The external magnetic field is created by two magnetic coils located above and below the active cathode surface. The coils are energized in contrary. The arc discharge is initiated by injection of the plasma "clot," or portion of plasma, and appears when the impulse discharge occurs over the surface of the metal coated ceramic bar placed between the cathode and the screen electrode. A plasma flow was formed using these conditions with an angle of divergence of 20 degrees. An increase in the external magnetic field up to 125–250 Gauss causes ion current densities along the plasma stream axis to increase by about five times. However, by using a magnetic field of 125 Gauss the ion current density in the radial direction decreases from 10 mA/cm$^2$ at the axis to 5 mA/cm$^2$ at a radius of only 5 cm. This spatial non-uniformity leads to undesired coating non-uniformity. The high magnetic fields required to make this apparatus work limits cathode surface utilization and adds to non-uniformity because the area over which the arc can exist is limited by induction. The design described causes at least a 1.5-fold increase in discharge voltage, which in turn causes cascade arcing and damage to the screen electrode, electrical insulators, vacuum seals, and other elements, making the design less commercially practical. The positioning of the metallized ceramic "igniter" between the cathode and the screen electrode exposes the igniter to cathode spot action. Operation of the device in this manner continually severely damages the igniter device thereby preventing efficient operation of the arc discharge device.

It does not appear to be recognized in the prior art that geometrical design factors for the apparatus described above could result in sub-optimal performance. I have observed that improper positioning of the entire magnetic field configuration relative to the positioning of the cathode and the anode can result in dramatically sub-optimal coating deposition rates in the case where plasma ions evaporated from the cathode surface are trapped inside the apparatus for reasons that will become clear in light of the disclosure below.

Some applications of the cusp-shaped magnetic field are known in the prior art. U.S. Pat. No. 4,952,843 of 1990 of Brown et al. describes an ion source in which a multi-pole cusp magnetic field produced by a number of a permanent magnets arranged in the vacuum chamber 4, where the plasma is expanded, is used to flatten the ion current flow generated by this source. An article by Askenov, "Formation of Filtered Intent Vacuum-Arc Plasma Flows," XVII$^{th}$ International Symposium on Discharges and Electrical Insulation in Vacuum, Berkeley, Calif., Vol. 1,895–899, 1996, describes an apparatus in which an axially symmetric magnetic field of an acute angle configuration was used for filtered coating deposition. This cusp magnetic field configuration is arranged inside the vacuum chamber between two axially cathodic arc discharge devices so that plasma of the cathode material generated there flows into the cusp through the axial cusp "openings," is treated in some fashion inside the cusp, and thereafter flows out of the cusp through the radial (ring) slot of the cusp to the substrate being coated.

There are instances of prior art disclosures in which the magnetic field strength has been intentionally varied at different points along the central axis of line-of-sight type cathode arc devices. U.S. Pat. No. 4,551,221 to Axenov et al. ("Axenov '221") describes a cathodic arc vapor deposition device having a single solenoid disposed co-axially along the central axis at one end of which is the consumable cathode and the substrate at the other end. The solenoid extends from a point behind the cathode working surface and ceramic jumper of the igniter to a point very near the substrate. The "front" cathode surface faces the substrate. The number of turns per unit length of the solenoid adjacent the cathode behind the working surface is twice that of the rest of the solenoid. Such arrangement produces a magnetic field that is stronger in the vicinity of the cathode behind the working surface and weaker between the working surface and the substrate. According to the patent, with this arrangement the plasma flow generated by the consumable cathode is injected into a longitudinally axially symmetrical magnetic field with a "plug" behind the working end surface of the cathode. The equipotential surfaces converging behind the working surface reflect the ion component of the plasma towards the target. According to the patent, such arrangement of the solenoid provides "optimum conditions required for stable ignition and maintenance of the arc discharge" (emphasis supplied). As will be apparent in light of the following disclosure, the Axenov '221 patent teaches away from the magnetic field arrangement of the instant invention. In the disclosure which follows, the arc discharge is quite suitably stabilized even when the front magnetic field strength exceeds that of the field behind the cathode working surface.

Another example of non-uniform magnetic field strength along the central axis is described in U.S. Pat. No. 4,452,686 to Axenov et al. A single plasma-focussing solenoid encompasses the tubular section. The solenoid is connected in opposition to the coil of the magnet. The coil of the magnet is arranged in the tubular plasma guide on the axis thereof. The number of turns of that portion of the solenoid between the centrally disposed magnet coil and the substrate is higher than the number of turns of the portion closest the plasma source. The patent states this arrangement enables the most effective focusing of the outgoing plasma flow, results in higher density, and consequently increases the coating deposition rate. No portion of the solenoid appears to be positioned axially behind the working surface of the cathode.

U.S. Pat. No. 4,724,058 to Morrison, Jr. describes adjacent sections of magnetic fields having reverse polarity provided by adjacent linear lengths of a continuous closed loop conductor carrying current flowing in opposite directions. The conductors are positioned on the side of the target opposite the evaporative surface. The purpose of this arrangement is to control cathode spot movement.

While many commercial cathode arc systems employ cylindrical co-axially aligned cathodes, other cathode shapes are known. For example, U.S. Pat. No. 5,269,898 to Welty describes controlling the movement of the cathode spot along the surface of a cathode rod using a helical magnet coil coaxially aligned with the cathode. U.S. Pat. No. 5,480,527 to Welty describes a rectangular shaped cathode source.

While one goal of the various cathode spot control techniques described above has been reduction of macroparticle generation, others have attempted to filter or block the passage of the macroparticles once formed from depositing on the substrate. U.S. Pat. No. 4,511,593 to Brandolf, for example, describes a shield which blocks all line-of-sight plasma particles from depositing on the substrate. Undesired agglomerates are intercepted in this manner. Desired atoms, ions, and molecules are said to reach the substrate by diffusing around the shield. U.S. Pat No. 4,452,686 to Axenov et al. describes a tubular section of the vacuum chamber through which the plasma particles pass prior to deposition on the substrate. A series of ribs extending radially inwardly a short distance from the inner wall, preferably formed by rings arranged one after another in parallel planes perpendicular to the section axis, are arranged immediately adjacent the interior wall of this section. The ribs inhibit passage of macroparticles through the tubular section.

There remains a significant need in the electric arc vapor deposition art for improved plasma flow control in the generator to achieve higher value-added coated products at a competitive price.

SUMMARY OF THE INVENTION

The present innovation provides a plasma enhancement method and apparatus for electric arc vapor deposition. The plasma enhancement is achieved by use of an apparatus arranged and positioned to act upon the plasma generated from a plasma source before the plasma reaches a substrate to be coated by the plasma. The component parts of the apparatus responsible for the enhancement include at least one current carrying conductor positioned to generate a cusp-shaped magnetic field, one half of which defines a plasma trap with an aperture directed towards the substrate between the cathode working surface and the substrate. An anode that is insulated electrically from the chamber permits the development of an electric field along as well as across the magnetic field lines defining the aperture of the plasma trap. This anode is physically separated from the cathode by use of double screen electrodes to prevent cascading arc discharges. An injection port for injection into the chamber of ionizing gases is positioned at a point where the electrons in the electric field possess maximum kinetic energy and thereby maximizing ionizing efficiency. A trigger device for initiating arc discharge is positioned between the screen electrodes and is not in physical contact with the cathode.

Two anti-parallel magnetic field generators produce a distinctive magnetic field. In combination with an insulated anode positioned across from the high-gradient portion of the magnetic field, the apparatus produces an electric field potential which is sharply contoured along the magnetic field lines. The instant invention creates conditions in the chamber between the cathode and the anode which impart energy to the plasma particles and focus and accelerate them in the direction of the substrate. High ionizing efficiency is achieved through injection of the ionizing gas according to the method of the invention. The distinctive shape of the magnetic field, combined with the strong electric conductivity along the magnetic field lines, results in an electric field potential of distinctive shape and strength. The plasma is in this way favorably enhanced by interaction with this distinctive electric field. The invention, therefore, relates to improved plasma flow control, increased coating deposition rate, and improved coated products accomplished in part by forming and controlling the shape of the magnetic cusp resulting from a pair of anti-parallel magnetic fields near the cathode evaporative surface. The resulting coated substrates are improved in that they have higher density, higher adhesion, more uniform thickness, more corrosion resistance and, in certain important cases, improved control of the precise chemical composition of the resulting coatings.

The present invention is directed to an apparatus for cathode arc vapor deposition, a cathode arc vapor deposition coating process, and coated substrates including those made by the process. The invention also relates to an anode especially designed to enhance efficient ionization of gas admitted to the vapor deposition chamber. The invention also relates to a plasma generator assembly especially adapted for use in combination with the plasma deposition coating apparatus.

Without being bound to any particular theory, a discussion of the nature of the magnetic cusp and its characteristics will assist the skilled artisan in appreciating the significance of the present invention. As is known from the prior art, an application of an external magnetic field is able to change plasma properties significantly. When a magnetic field is applied under high vacuum conditions so that one can neglect the collisions with neutral atoms, the electrons execute a rotational motion around the magnetic field lines with a cyclotron frequency $$\omega_e = eB/m$$

where e is the electrical charge of the electron, B is the magnetic field induction value and m is the mass of the electron. The radius of the electron gyrations known as an electron Larmor radius $r_{Le}$ is proportional to the electron's component of the velocity $v_\perp$ that is perpendicular to the magnetic field B $$r_{Le} = v_\perp / \omega_e.$$

When an external force, e.g., an electric field, is applied to the plasma across the magnetic field, the motion of the gyrating electrons becomes more complicated. The guiding center of the electron gyration is moved in the direction that is perpendicular to both the magnetic field and the external force. The electrons exhibit what is called "electrical drift" motion. This cyclotron motion of electrons results in a strongly limited conductivity of the medium across the magnetic field when an external electric field is applied to plasma while along the magnetic field lines the conductivity remains the same as it was without the magnetic field. Under real plasma conditions due to collisions with neutral atoms/molecules that are always present in real plasma and are able to change the direction of the electron's motion because of mass differences, the electrons exhibit a so-called collisional drift motion jumping after each collision across the magnetic field. In this manner, conductivity of plasma across the magnetic field is provided. As the magnetic field value increases to a certain level, the electron component of plasma becomes trapped by the magnetic field (tied to the magnetic field lines) and the conductivity of the plasma across the magnetic field decreases. Electrons are considered to be magnetized when the collision electrons have time to execute at least one turn around the magnetic field line. This condition can be expressed as:

$$\omega_e \tau_e \geq 1,$$

where $\omega_e\tau_e$ is known as Hall parameter, or parameter of plasma magnetization, $\omega_e$ is an electron cyclotron frequency, and $\tau_e$ is the mean time between the collisions of the electrons with atoms/molecules in the plasma. Furthermore, the Larmor radius $r_{Le}$ for the electrons should not exceed the characteristic dimension of the plasma. Under this condition, a directed motion of the drifting across the magnetic field electrons can be considered as an electrical current, i.e., a directed motion of charged particles (electrons in our case). This electron drift current is directed perpendicularly to both the magnetic field and external force that makes the electron move across the magnetic field. Due to magnetization of plasma, the value of the drift current in about $\omega_e\tau_e$ times exceeds the value of the electron current in the direction of the applied force. The magnetic field produced by this electron drift current is always oppositely directed relative to the externally applied magnetic field as trying to decrease the influence of the external magnetic field on plasma, or trying to push plasma out of the magnetic field. As a consequence of opposite charge and higher mass compared with electrons, a directed motion of ions can also create a current which decreases the magnetic field produced by electron drift current. The differential current incorporating both the ion directed motion and electron drift current is known as Hall current. Under many actual conditions, when the velocity of the electrons exceeds the velocity of the electron drift current is very close to Hall current value due to the natural difference of the mobility of ions and electrons. Such effect occurs when ions electrons are moving though the crowd of heavy and immobile ions. This current exists in the magnetized plasma due to collisions of the electrons with a neutral component of plasma Such collisions with a certain probability cause ionization of the neutral atom or molecule with which the electron has collided. The probability of such ionization is a sharp function of the electron energy. The rate of this ionization process in plasma is proportional to the frequency of such collisions. If between collisions the electron has time to get enough energy from the electrical field to ionize the atom, ionization can occur. Increased frequency of the electron collisions with neutral components of the plasma usually causes increased plasma density. The magnetic field is a good tool to increase the frequency of such collisions.

Magnetic field configurations, known in the fields of plasma physics and nuclear fusion as magnetic traps, are another good tool to work with plasmas. A distinct class of magnetic traps includes cusped magnetic fields or "cusps." The magnetic trap is able to provide an additional and several-fold increase in the plasma density inside the relatively large volume of the magnetic trap through a substantial decrease of the plasma losses.

A useful result can be achieved when the cusp-shaped magnetic field is arranged around the cathode electrode of an apparatus used for the arc coating deposition so that the substrate to be coated is disposed outside the cusp in front of the axial cusp opening. An insulated anode is placed across the cusp-shaped magnetic field apart from the cathode electrode and is energized to produce inside the plasma an electromagnetic field of a distinctive shape. As described in the present invention, the electromagnetic field enables optimally increasing the plasma flow density near the substrate being coated with the plasma of the material evaporated from the cathode.

According to the present invention, the cusp-forming magnetic field is strong enough to magnetize the plasma, i.e., $\omega\tau \geq 1$, but only the electron component of the plasma. The ion component of the plasma remains non-magnetized to achieve the benefit of the present invention. Only half of the cusp-shaped magnetic field configuration is used for the plasma treatment. The arc discharge plasma inside this half-cusp configuration is produced using the cathode positioned inside the cusp and the arc discharge is supported with an anode that is positioned outside the cusp. A controlled electromagnetic trap is formed in the area between the cathode working surface and the half-cusp-shaped sheath of a magnetized plasma where an electric field exists across the magnetic field sheath which separates the anode and cathode. The useful application of the plasma according the present invention is achieved in the area of the substrate located outside the cusp-shaped magnetic field due to a mechanism of the plasma escaping from the cusp. In contrast to the present invention, the usefulness of a magnetic cusp in nuclear fusion technologies relates to confinement of the plasma.

An axially symmetrical cusp-shaped magnetic field configuration may be produced by two anti-parallel currents flowing symmetrically about the axis of a cylindrical cathode having a cathode working surface on its butt-end. The currents may flow through the same or different current carrying conductors or may be produced by magnets alone. The lateral non-working surface of the cathode is embraced by a double-screen electrode assembly for preventing cascade arcing there. The anode is positioned outside the double-screen electrode assembly and around the cathode working surface. The anti-parallel currents flowing in conductors of the magnetic field generators produce a magnetic field with lines of force which intersect the anode working surface at approximately the plane of the cathode working surface. From there, the lines of force smoothly diverge in opposite directions towards the cathode axis. They diverge further along the cathode axis to the substrate. The cathode working surface is embraced from both sides by the convex magnetic field lines which constitute the cusp-shaped magnetic field configuration (cusp) around the cathode. The plasma flows emanating from the cathode follow the shape of the magnetic field lines and several specific zones can be found there. A bright cathode jet of the dense plasma extending from the cathode to the substrate is contoured by the magnetic field lines intersecting the boundary of the cathode working surface. A less bright anode sheath having good conductivity is located outside the cathode jet where the electrons carrying the arc current can easily reach the anode working surface along the magnetic field lines. An intermediate sheath is located between the cathode jet and the anode sheath. The cusp-shaped intermediate sheath surrounds the cathode jet. The arc current flows across the intermediate sheath in which the electric field exists. The outer dimension of the screen electrode assembly defines the outer boundary of the intermediate sheath in that case. The inner boundary of the sheath is defined by the magnetic field lines intersecting the cathode working surface boundary. The shape of the magnetic field lines in this cusp configuration is determined by the ratio of currents flowing in the current carrying conductor and geometrical factors, such as number of coil turns, the distance between coils, mean radius, length and height. When the geometrical factors are the same for the anti-parallel currents the shape of the cusp can be characterized by the ratio of the intensity of the anti-parallel currents, or by the ratio of the magnetic fields produced on both sides of the cathode surface. It was discovered that the measurements of the ion current density for different values of the magnetic fields shows the existence of an optimal ratio of the magnetic field strengths. The magnetic field ratio is the ratio of the magnetic field strength of the field positioned between the cathode and substrate, i.e., the front field, to the strength of the field positioned on the opposite or rear side of the cathode working surface.

Without being bound to any particular theory, it is believed that the optimal ratio of the magnetic fields is a result of several rival processes that act simultaneously. When the ratio decreases the plasma density in the area of the magnetic trap increases as the "opening" of the trap becomes smaller and more volume of plasma is trapped in this area This conditional "opening" is determined by "mirror" action of the converging magnetic field lines of the cusped configuration on the motion of the electrons emitted from the cathode. This property of the cusped magnetic field to trap the charged particles was known and used in high temperature plasma confinement in the area of nuclear fusion. The transmissivity of such a converging magnetic field configuration is defined by the value of some solid angle θ:

$$\sin^2\theta = B/B_m$$

where $B_m$ is the magnetic field value at the cusp point and B is the magnetic field value at the location of the charged particle considered. This solid angle θ, as applied to the problem of the high temperature plasma confinement, was called a "cone of losses" because the plasma leaked through this opening of the magnetic field configuration and was lost. In our case this leakage of plasma through the "opening" is a useful process. Moreover, this plasma escape can even be optimized to the level of commercial applicability with proper adjustment of the shape of the magnetic field configuration. If we neglect the collisions with neutral atoms for simplicity then only those charged with velocity vectors within the solid angle θ can escape along the magnetic field lines through the cusp point. In our consideration, these charged particles are only electrons because the ions are not sufficiently magnetized. All other electrons will be reflected and trapped by this magnetic field configuration. In fact, because the magnetic field cannot change the kinetic energy of the electrons directly, it can change only the direction of their motion. Under conditions of constant kinetic energy, it causes a transformation of the kinetic energy of the radial motion into kinetic energy of either the azimuth motion or even further into the axial motion but in the opposite direction. The reason for these energy transformations is the presence of the radial component of the electron's velocity (relative to the cusp axis and radius). Due to this component the angle θ is bigger than the value in $\sin^2\theta = B/B_m$. The energy related to this component causes the transformation from axial motion (with angle θ to the axis) into azimuthal motion (rotation). If the θ is big enough then the rotation will transform further into rearwardly-directed axial motion. These trapped electrons, regardless of their energy, continue their endless motion inside the magnetic trap until their motion is directed within the solid angle θ. While trapped, these electrons make an additional contribution to the process of neutral atom ionization that results in an increase of the plasma density. In addition, these trapped electrons also confine the ion component of the plasma by electrical field forces which keeps the charged particles together to provide the neutrality of the entire plasma. These trapped plasma particles can escape along the magnetic field lines only as allowed by the electron component of the plasma confined by the magnetic field.

At the same time, when the "opening" becomes smaller, the plasma flow escaping from the magnetic trap opening towards the substrate becomes smaller also. As a result, we observe an optimal value of the ratio when the "opening" of the trap is small enough to confine the electrons and the plasma respectively inside the trap and the "opening" is big enough to allow the plasma to escape from the magnetic trap.

Another process taking place relates to the anode state and position. When an insulated anode is positioned apart from the cathode so that the anode and cathode are separated with some sheath of this cusp-shaped magnetic field, the arc discharge current is forced to flow across the magnetic field therebetween. As a result, a significant electric field rises up inside this intermediate sheath to sustain the arc across the magnetic field. The value of the voltage drop across this sheath can exceed the cathode voltage drop. This electric field supplies the electrons with an additional energy to overcome the obstacle in the form of the transverse magnetic field. This additional energy accumulated by electrons dissipates on collisions with neutral atoms which also contribute to the increase in plasma density due to the additional ionization. This electric field directed inward pushes inside and helps to hold the ion component of plasma inside the trap. As a result of this, the "wall" of the magnetic trap (or more exactly, electromagnetic trap) becomes higher for the plasma escaping from the cathode. The only way for plasma to escape is along the magnetic field lines through the "opening" controlled by the magnetic field shape, i.e., the ratio of the magnetic fields. When the ratio of the magnetic fields decreases, the value of the magnetic field inside the intermediate sheath also decreases because of the high gradient of the spatial distribution of the magnetic field value in the cusp-shaped magnetic field configuration. The magnetic field value increases practically linearly with the distance in all directions from zero point in the vicinity of the cathode surface center with a gradient of about 20–60 Gs/cm. The decrease of the magnetic field inside the intermediate sheath causes the correspondent decrease of the electrical field that act upon the plasma as described above.

Certain geometrical principles should be observed in order to gain the full benefit of this invention. The best results can be achieved when an insulated anode is positioned relative to the cathode that is surrounded with a cusp-shaped magnetic field configuration in a such way that the anode and cathode are separated with an intermediate sheath of the cusp-shaped magnetic field. Positioning a double screen electrode and trigger there substantially increases the reliability of the apparatus, thereby making commercial applications feasible. The injection of the working gas near the anode working surface area, where a significant radial magnetic field exists to provide more efficient ionization of the gas by electrons, allows about a ten-fold decrease in the working pressure during reactive coating deposition. This benefit results in better vacuum conditions for the plasma flow propagation and also allows a decrease in the gas consumption correspondingly.

An investigation of the influence of different parameters, such as ballast gas pressure, magnetic field value, arc current, screen design, and anode design on the optimal ratio and ion current density were made to find an explanation of the optimality of the ratio obtained from the coating deposition when the present invention is used. Without being bound to any particular theory, the following model was developed and supported by the experimental results of this investigation.

The magnetic cusp is a result of the balance of the magnetic fields produced by the anti-parallel currents. And a specific feature of the cusp is that the magnetic field spatial distribution inside the cusp is very sensitive to any change of the balance. Hall current, existing only in a half of the cusp volume filled with the magnetized plasma, changes the balance of the magnetic fields produced. The direction of Hall current always is always opposite to the direction of the outer current producing the magnetic field. Accordingly, Hall current acts to break the balance through a decrease of the outer magnetic field produced by one of the currents. As a result of Hall current action, the real cusp configuration in plasma is slightly different from the expected one. The plasma rotation caused by the arc discharge current flowing across the magnetic field results in a considerable decrease of Hall current inside the magnetic trap because the Hall current, in fact, is a round current of drifting electrons from which a current of the ion rotational motion is subtracted. For example, an optimal ratio obtained in high vacuum conditions is about 1.5–2 times different from the same ratio obtained when argon is used as a ballast gas. The presence of the ballast gas slows down the plasma rotation and breaks the balance of the magnetic fields there.

Another important consequence of plasma rotation is that the ion components of plasma accumulate a considerable amount of kinetic energy in their rotation. Lorentz forces acting on these spinning plasma ions and electrons have opposite directions $$F=q[v\times B]$$

where q is an electrical charge of the particle considered, v is the particle velocity vector, B is the magnetic field induction vector at the particle location. Because an ion's mass is much larger than an electron's mass, the spinning ion components of plasma possess more momentum than the plasma electrons. Through the electrical field forces confining the plasma components together, the ions "pull" the electron component of the plasma against the Lorentz forces acting on the electrons. Due to kinetic energy and momentum conservation, the kinetic energy accumulated in the plasma rotation is transferred into the linear motion of the plasma out of the cusp magnetic field configuration through the "opening." The plasma, rotated inside the cusp, is being sucked into the "opening" of the trap as water is sucked into a whirlpool. The escaping plasma appears in the area of the diverging magnetic field extended toward the substrate. In that diverging area, an interaction of the Hall current with the radial component of the magnetic field causes an axial acceleration of the plasma by the Lorentz force acting on the electron component of plasma. The electron component of the plasma pulls the ion component which has already has spent its previously accumulated kinetic energy in the rotation overcoming the electron drag within the cusp. When the plasma rotation exceeds a certain level, the excess kinetic energy accumulated in plasma rotation causes a decrease of Hall current in the area of the diverging magnetic field and the Hall acceleration effect will be decreased in this case. As a result of a balance of these processes, we observe an optimal value of the cusp shape, i.e., an optimal ratio of the magnetic fields when the plasma escaping the cusp has a minimal rotation. The fact that we observe a maximum on the curve of ion current density vs. magnetic field ratio supports this model of plasma processes.

When the anode, positioned across the magnetic field, is insulated from the vacuum chamber wall the ion current density measured at the substrate reaches a higher value than when the anode is grounded. The grounded anode design results in a less effective interaction of the arc current with the cusp-shaped magnetic field because the arc discharge flows mostly along the direction of the magnetic field lines. When the vacuum chamber is used as an anode the value of the plasma flux is even less than in the case of the grounded anode design because of arc current flowing only along the magnetic field lines with a minimal interaction with the cusp-shaped magnetic field.

An increase of the outer diameter of the screen electrode causes the value of the magnetic field within the intermediate sheath and the voltage drop across the sheath to increase. As a result of this, the plasma rotation velocity and the volume the plasma involved in the rotation increases which causes a conforming increase of the ion current density observed.

The apparatus of the present invention provides higher ion currents at the same applied magnetic field value and a more stable arc discharge at the cathode surface at lower arc currents. By virtue of the double screen electrode, the chances of arc discharge between the cathode and anode resulting in damage to the apparatus are reduced. Furthermore, strategic injection of ionizing and/or reactive gas near the anode working surface and region of high gradient magnetic field formed by the cusp improves ionization efficiency. These and other features and attributes of the invention described more fully below result in coated substrates having superior physical properties. Compared to the prior art cathode arc vapor deposited coatings, the resulting coatings in this invention are much more uniform in terms of thickness, density, hardness, and corrosion potential. Suitable applications of the invention include not only wear resistant and decorative coatings, but also generally thicker coatings, barrier coatings, and corrosion resistant coatings.

BRIEF DESCRIPTION OF THE DRAWINGS

FIG. 2b is an electrical wiring schematic of the connection of arc discharge power supply and the igniter power supply to the deposition apparatus of FIG. 2a.

FIG. 20a is an enlarged sectional view of the current carrying conductor of FIG. 20 including an anode layer.

DESCRIPTION OF THE PREFERRED EMBODIMENTS

Figure 1:
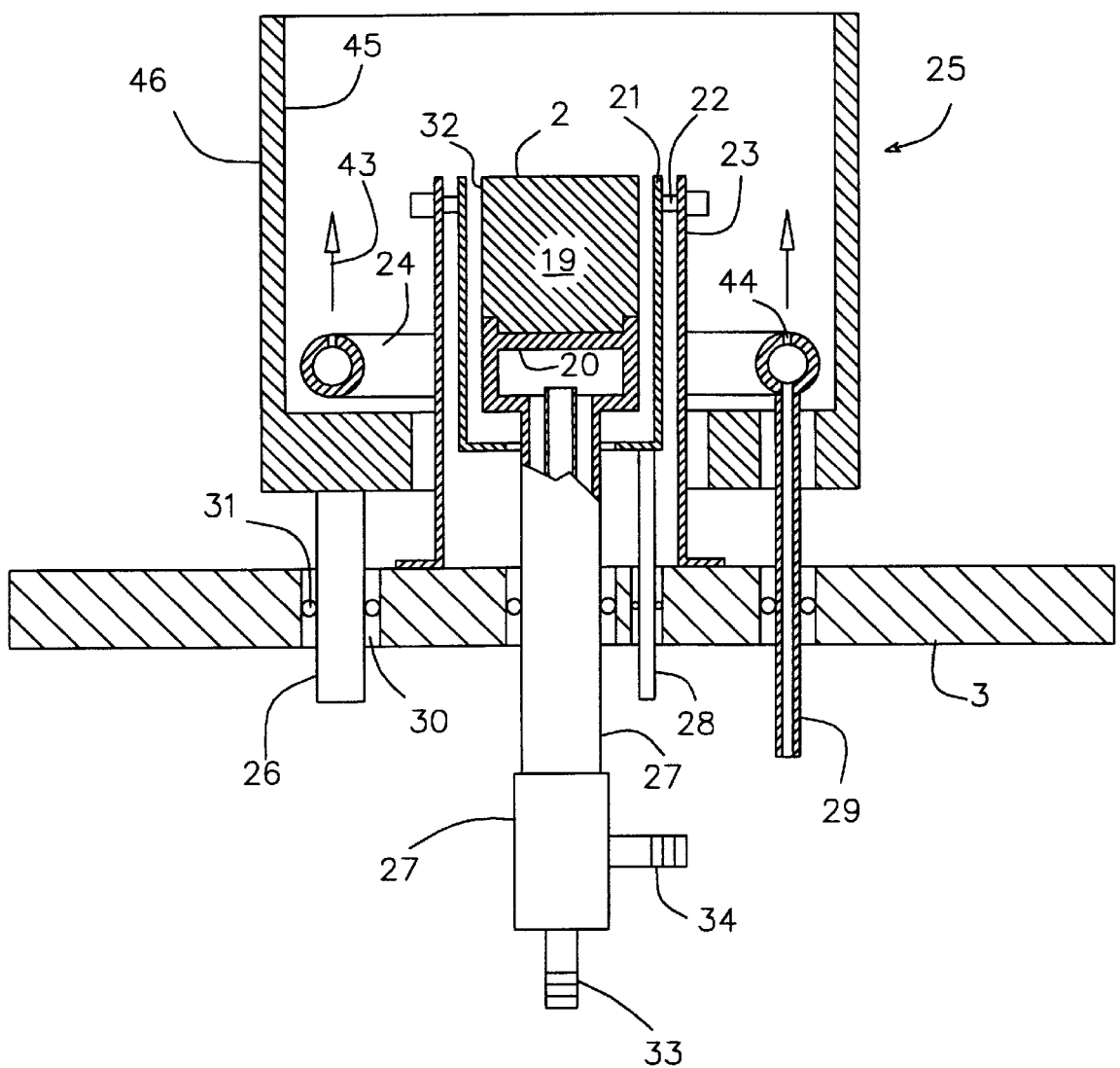
FIG. 1 is a sectional view of the first embodiment of the plasma generator assembly.
Figure 2A:
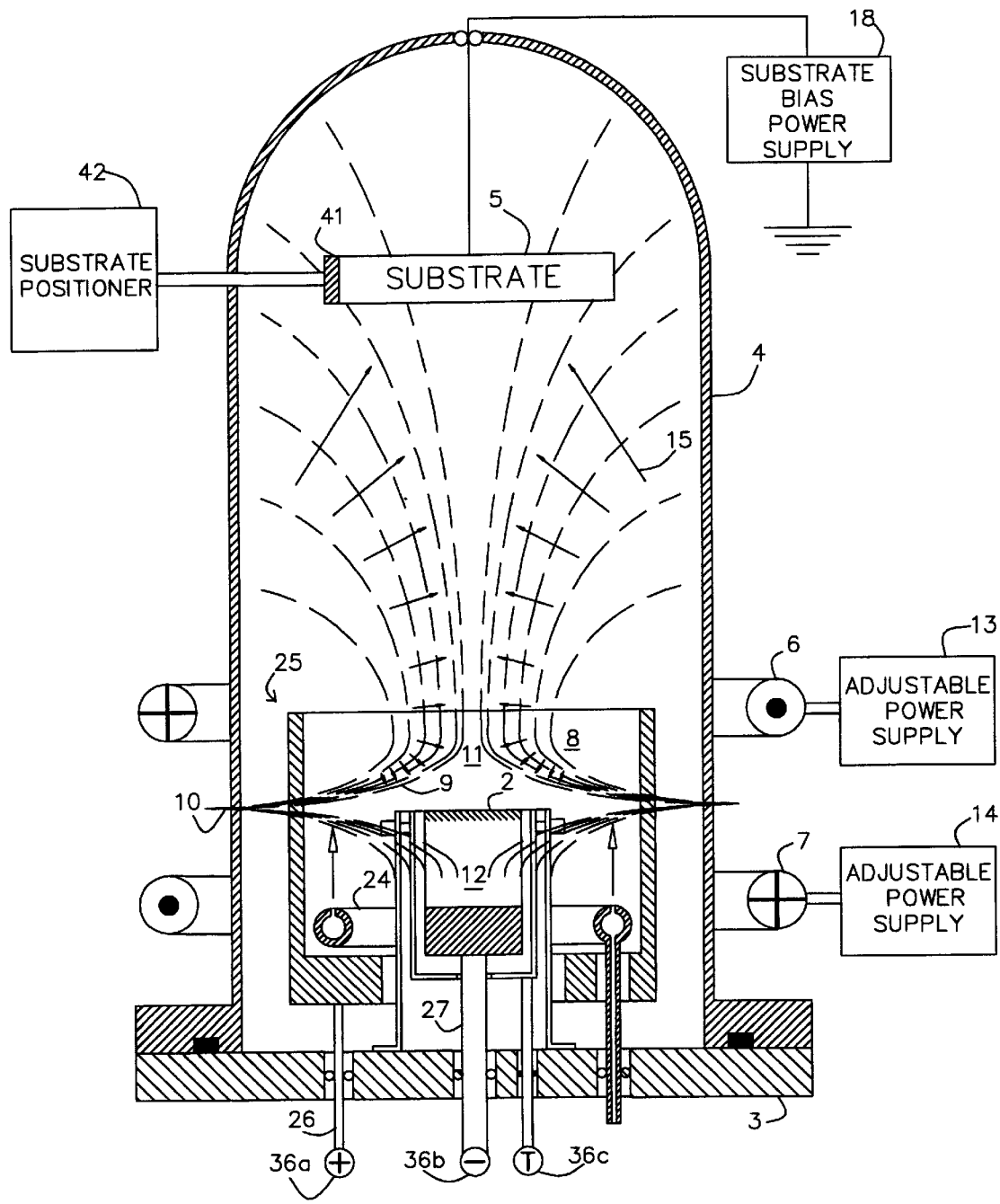
FIG. 2a is schematic cross-sectional view of the first embodiment of the cathode arc vapor deposition apparatus.

In FIG. 1, the plasma generator assembly 1 of the first embodiment of the invention, including cathode working surface 2, is shown mounted on a flange 3. In use, as shown in FIG. 2a, the plasma generator assembly 1 is positioned at one end of a vacuum chamber 4 opposite the substrate 5 that is to be coated with the cathode material. The substrate is supported by substrate support 41. The substrate is positioned by substrate positioner 42. A pair of anti-parallel magnetic field generators, e.g., front coil 6 and rear coil 7, create a characteristic cusp-shaped magnetic field 8 in the vicinity of the cathode working surface 2. The magnetic field 8 defines an electron-trapping cusp bounded by convex magnetic field lines 9 diverging from the radial slot 10 to the cusp front opening 11 and cusp rear opening 12. The electric current flowing through the front coil 6 and rear coil 7 can be independently controlled using magnetic field generator power supplies, e.g., front coil power supply 13 and rear coil power supply 14, respectively. As explained above, interaction between electrons in the chamber and the magnetic field creates an electric field shown by electric field lines 15. The electric field lines 15 do not represent force vectors and are not drawn to scale. The arc discharge power supply 16, igniter power supply 17, and connectors 36a–36c for making electrical connections with the anode, cathode, and trigger, respectively, are shown schematically in FIG. 2b. Substrate bias power supply 18 applies an electrical bias to the substrate 5.

With reference again to FIG. 1, the plasma generator assembly 1 includes a cathode working surface 2 at one end of the cathode 19, a cathode holder 20, an inner screen electrode 21, at least one arc igniter 22, an outer screen electrode 23, a gas distributor 24, and an anode 25. The anode feedthrough 26, cathode cooling water conduit 27, inner screen electrode feedthrough 28, and gas feed tube 29 pass through electrically insulated and vacuum-tight flange openings 30. The skilled artisan will readily appreciate that the insulating vacuum-tight seal 31 depicted in FIG. 1 is a schematic depiction of any suitable insulating vacuum-tight seal arrangement. The various components of the system listed above will now be described in greater detail Cathode The cathode 19 of the first embodiment is a cylinder including a cathode working surface 2 at the butt end of the cathode 19 and a lateral cathode non-working surface 32. A significant amount of heat is generated by the electric arc striking the cathode working surface 2. Accordingly, the cathode 19 is preferably mounted on a water cooled cathode holder 20. The cooling water inlet connection 33 and cooling water outlet connection 34 are situated at one end of a double walled cathode cooling water conduit 27 for feeding and returning cooling water to and from the cathode holder 20. The cooling water conduit 27, made from an electrically conductive material, also serves as the cathode power feedthrough by which the cathode is electrically connected to the negative pole of the arc discharge power supply 16 via connector 36b.

The sacrificial cathode 19 is made of the material to be evaporated and coated onto the substrate. Materials capable of acting as the sacrificial cathode 19 include any material which is electrically conductive at the cathode working temperatures. Preferred materials include aluminum, barium, beryllium, cadmium, carbon, cerium, chromium, cobalt, copper, gold, hafnium, indium, itrium, iridium, iron, lantanum, lead, magnesium, manganese, molybdenum, nickel, niobium, platinum, rhenium, rhodium, scandium, silicon, silver, strontium, tantalum, tin, titanium, tungsten, vanadium, zinc, zirconium, their chemical compositions (including their electroconductive oxides, nitrides, carbides, silicides, and borides), compounds and alloys, including most of the stainless steels, copper-, aluminum- and nickel-based alloys having high corrosion resistance as well as other special properties for different applications. A more preferred cathode material is a 300-series stainless steel, such as 304L, 316, or 316L. The chemical composition of the deposited coating may vary with the selection of the cathode 19 and the processing conditions. A coating comprised of 15–28% chromium, 4–12% nickel and 0.5–2% molybdenum is preferred.

The cathode 19 may be of any shape, such as a cylinder or polyhedron having a non-circular cross-section. The polyhedra have an oval, triangular, rectangular, pentagonal, hexagonal, etc., cross-sectional shape. The cathode may be elongated, e.g., the cathode 519 cylinder of the fifth embodiment of FIG. 27, or it may be flattened as in the case of the slab-shaped polyhedral cathodes 319, 419 of the third and fourth embodiments of FIGS. 18–25. While a flat cathode working surface is preferred for certain geometries, such as the butt-end case of FIG. 1, a cylindrical cathode working surface is preferred for the fifth embodiment of FIGS. 26–29. Even where a flat cathode working surface is preferred, a curved surface, e.g., the lateral cathode working surface 202 of the second embodiment shown in FIGS. 16–17, may also be used.

Electrode Screen

The cathode non-working lateral surface 32 is enclosed by a double-electrode screen consisting of an inner or "igniting" screen electrode 21 and an outer screen electrode 23. The inner and outer screen electrodes are co-axial with one another and positioned so that the inner screen electrode 21 eliminates a direct line of sight between the non-working cathode surfaces, e.g., lateral cathode surface 32, and any point on the outer screen electrode 23. This positioning makes less likely the series of cascading arc discharges between the anode 25 and the cathode 19 that has been a problem in prior art systems.

Figure 2B:
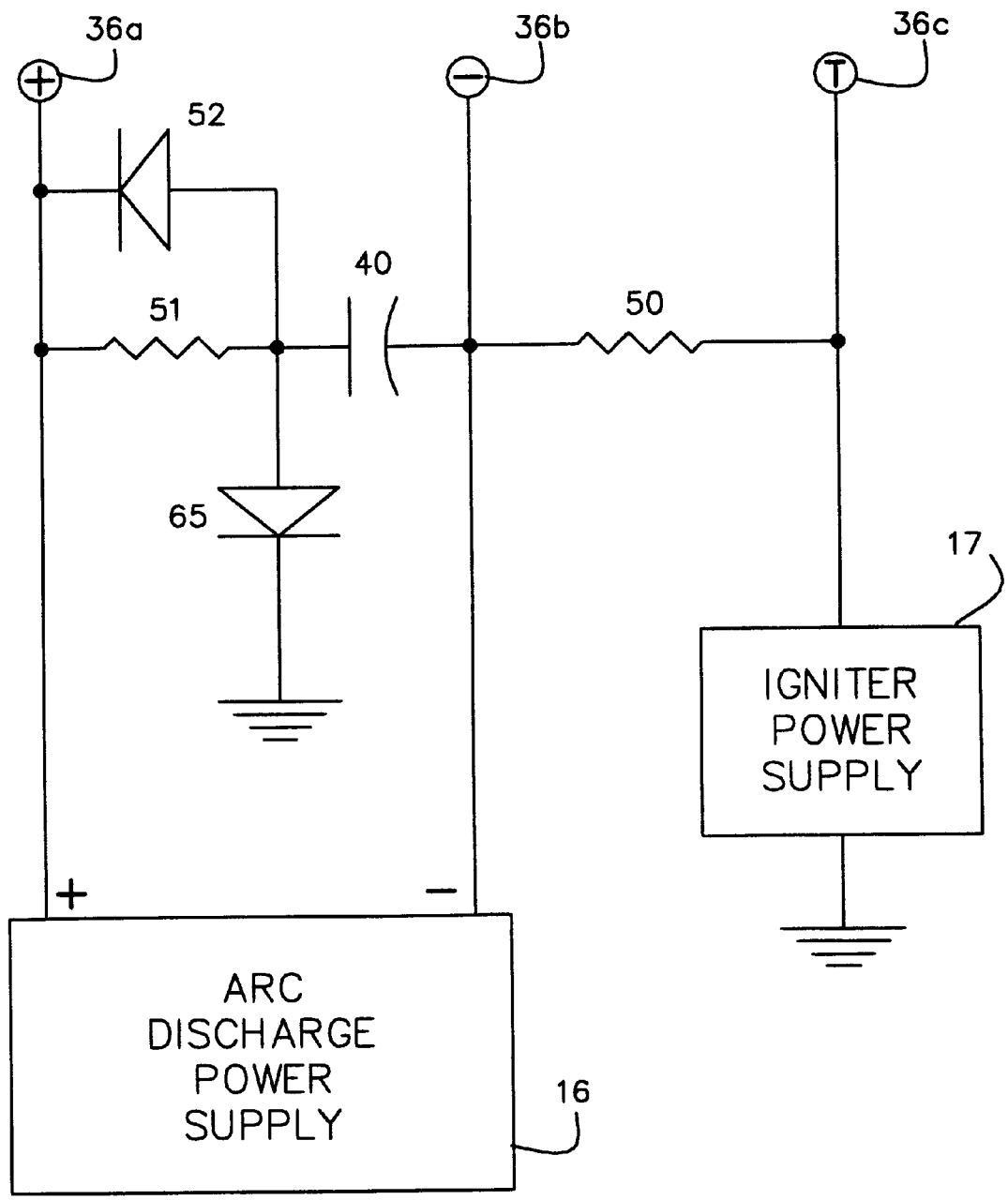

The inner igniting electrode 21 is connected by inner screen electrode feedthrough 28 and cathode connector 36b to the arc ignition power supply 17 and to the arc discharge power supply 16 through condenser 40 (as shown in FIG. 2b). Outer screen electrode is electrically connected to the flange 3. The inner and outer screen electrodes are electrically connected by at least one and preferably several circumferentially disposed arc igniters 22, aka, "triggers." Another purpose of the double screen electrode arrangement is to prevent the cathode spot from moving to the lateral cathode surface 32.

Arc Initiating Trigger Device

The arc discharge is initially ignited by sending a high voltage power pulse to the igniting electrode 21. A spark emanates from the trigger 22 thereby igniting the arc discharge between the anode 25 and cathode working surface 2. The trigger 22 is usually a metallized ceramic rod or tube connected electrically to both the inner igniting and outer screen electrodes 21, 23. The trigger 22 is positioned close enough to the cathode working surface 2 to initiate an arc, but far enough away to prevent excessive coating of the ceramic rod with plasma material. Continuous physical separation of the trigger 22 and cathdode working surface 2 improves reliability of the arc ignition compared to prior art mechanical cathode-contacting trigger mechanisms. The spacing between the cathode working surface 2 and the trigger 22 in the present invention is approximately 5–10 mm. The double screen electrode design and the positioning of the trigger 22 substantially increases the reliability of the apparatus thereby making practical applications possible.

Gas Distributor

Figure 3:
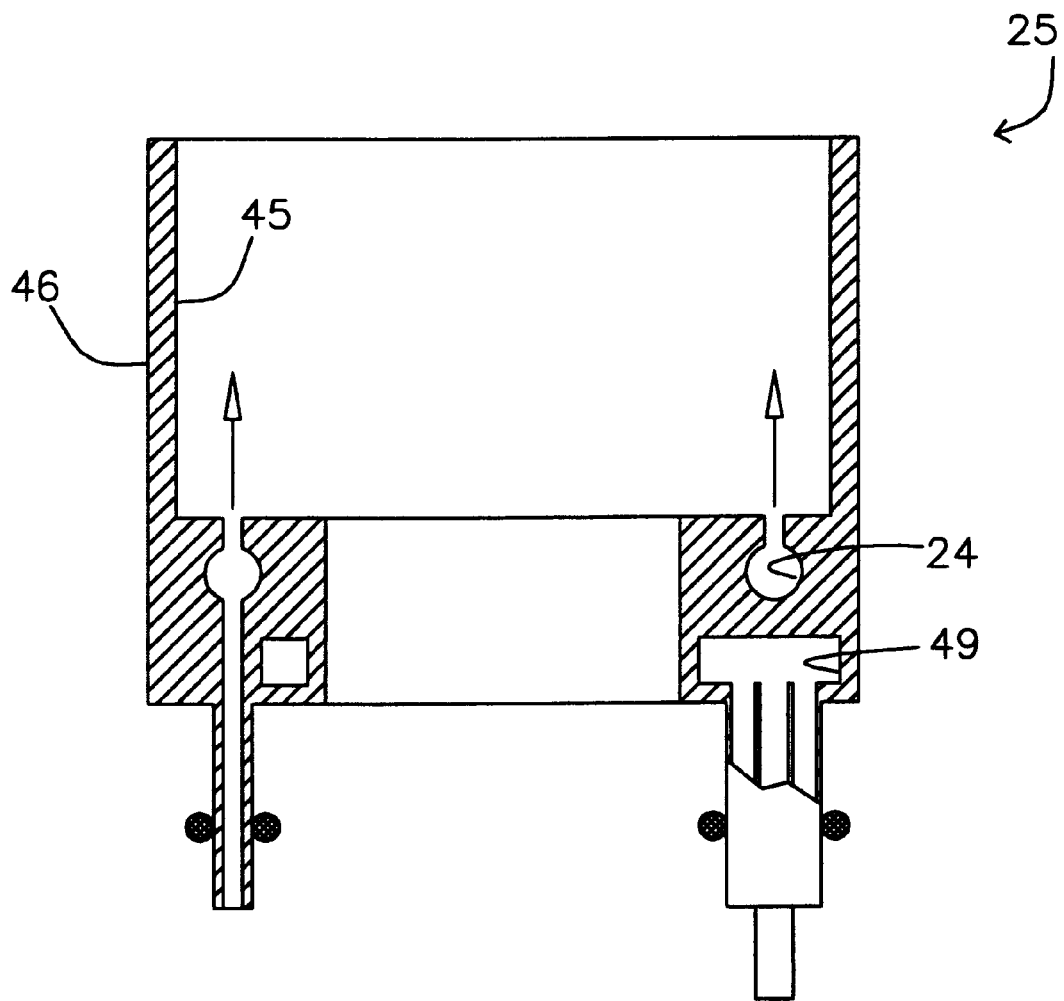
FIG. 3 is a cross-sectional view of an alternative anode design suitable for use in the plasma generator assembly of FIG. 1.

A gas distributor 24 is provided for admitting ionizing or reactive gas 43 into the chamber 4. Gas 43 flows through a gas feed tube 29 extending through the flange 3, into the gas distributor 24, and through narrow gas orifices 44 which jet the gas into the radial slot 10 region of the cusp, as described above. The gas distributor 24 and orifices 44 are placed along the edge of the anode working surface 45. The distributor 24 is positioned symmetrically with respect to the anode central axis. The injection of the ionizing gases 43 into the chamber 4 is done at a point adjacent to the anode working surface 45 where the electrons in the electric field possess maximum amounts of kinetic energy. Such positioning results in higher ionizing efficiency of the high kinetic energy electrons. In FIGS. 1 & 2a, the gas distributor 24 is shown separated from the anode 25. The gas 43 is fed into the vacuum chamber 4 in an area of high magnetic field gradient at high velocity through a plurality of circumferentially arranged gas orifices 44 in the distributor 24. FIG. 3 shows an alternative anode design 47 in which the gas distributor 24 is an integral part of the anode 25 itself. An integral anode cooling water channel 49 is also shown.

The ionizing gas should be selected to either become a part of the composite coating, e.g., TiN, CrN, $TiO_2$, $Cr_2O_3$, TiC, CrC, etc., or function as a "ballast gas." Ballast gas disperses the vaporized cathode material and improves the substrate coating uniformity for some applications, or stabilizes and sustains arc discharge operation at low arc current values. Argon is usually used as the ballast gas, but helium, neon, krypton, air, nitrogen, oxygen, argon, hydrocarbon gases such as methane, ethane, propane, butane, etc., and their mixtures can also be used.

Injecting the working gas near the anode 25 at a location where a significant radial magnetic field exists provides more efficient ionization of the gas atoms and molecules by electrons and allows the user to decrease by about 10 times the working pressure during reactive coating deposition. Reduced working pressure results in better conditions for the plasma flow propagation and also decreases gas consumption.

Anode

The anode working surface 45 encircles the cathode working surface 2. The anode 25 is placed outside, i.e., radially beyond, the outer screen electrode 23. The anode 25 is electrically insulated from the chamber, preferably by physical separation of the anode 25 and chamber 4. Accordingly, grounding of the arc discharge and diminution of the electric field potential is prevented. Such problems have occurred in the prior art systems when the chamber wails are used as the anode 25. Preferably, the anode 25 is also insulated from the other electrodes. The insulated anode design of the present invention results in distinctly higher ion current (See FIG. 15) and higher deposition rates compared to values observed when the anode is grounded, or when the chamber walls act as an anode.

The portion of the vacuum chamber 4 that immediately surrounds the anode 25, 23 aka, "case", is preferably water cooled. The chamber, together with the outer screen electrode, creates a grounded screen around the anode non-working surface 46. The anode 25 is connected to the arc discharge power supply 16 by an anode connector 36a and anode feedthrough 26 passing through flange 3. Suitable electrically insulating and vacuum-tight sealing means 31 are shown schematically. The anode 25 is preferably co-axially aligned with the cathode 19.

The best results can be achieved when an insulated anode 25 is positioned relative to a cathode 19 that is surrounded with a cusp-shaped magnetic field in such a way that the anode 25 and cathode 19 are separated by an intermediate sheath of the cusp-shaped magnetic field 8.

Substrate

The substrate 5 is positioned generally opposite the evaporative or working surface 2 of the cathode 19.

Preferably, it is positioned along a line-of-sight with the cathode working surface 2. The substrate 5 is preferably electrically biased by a substrate bias power supply 18. The substrate 5 is supplied with the negative bias voltage from the substrate bias power supply 18. Conventional substrate positioning mechanisms 42, such as the planetary type rotation device 37 shown in FIG. 17, may be used in this invention.

Virtually any electrically conductive or non-conductive material capable of withstanding the processing conditions within the vacuum chamber may be coated by the process of the cathode arc vapor deposition invention. Such materials include mild steel and its alloys, aluminum and its alloys, cast iron, nickel and its alloy, copper and its alloys, ceramics, glass, and plastics.

The porosity of the substrate influences the quality of the deposited coatings. The smoother the surface roughness of the substrate 5 prior to coating, e.g., as measured by RMS (root mean square), the higher the resulting quality of the coatings. Substrate surfaces should be cleaned prior to coating and be substantially free of silicone-containing compounds.

Vacuum Chamber

A wide variety of vacuum chamber shapes and arrangements are contemplated. While in the preferred embodiment there exists a direct line-of-sight between the substrate and the working cathode surface 2 from which the plasma source material is evaporated, such arrangement is not required. There is no prohibition that prior art macroparticle filtering systems, e.g., the curvilinear magnetic filtering plasma flow channel or blocking shield, cannot nor should not be used in combination with this system. In fact, good results have been obtained using the presently described system in combination with a macroparticle shield similar to one described by Axenov in U.S. Pat. No. 4,452,686, the disclosure of which is hereby incorporated by reference.

The skilled artisan will understand that the chamber is connected to an appropriate vacuum system, e.g., pumping system, and gas feed flow control for controlling the chamber pressure (not shown).

Magnetic Field and Magnetic Field Generators

Figure 24:
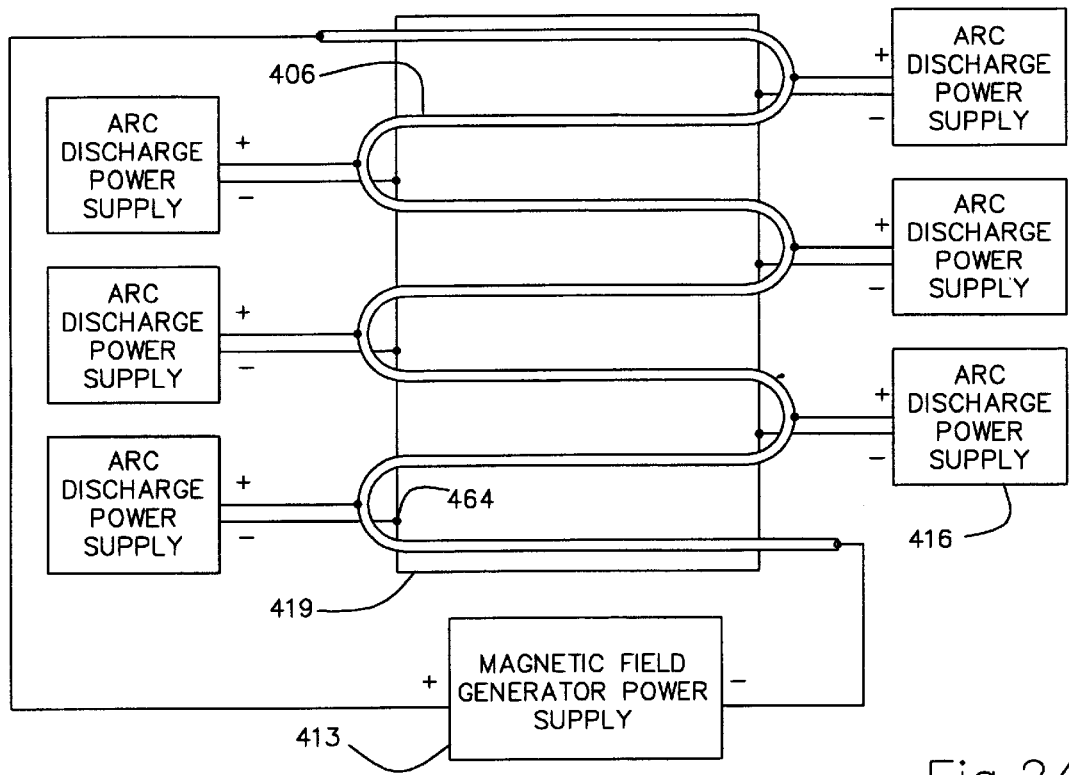
FIG. 24 is a schematic plan view of one possible coil arrangement of the fourth embodiment.
Figure 25:
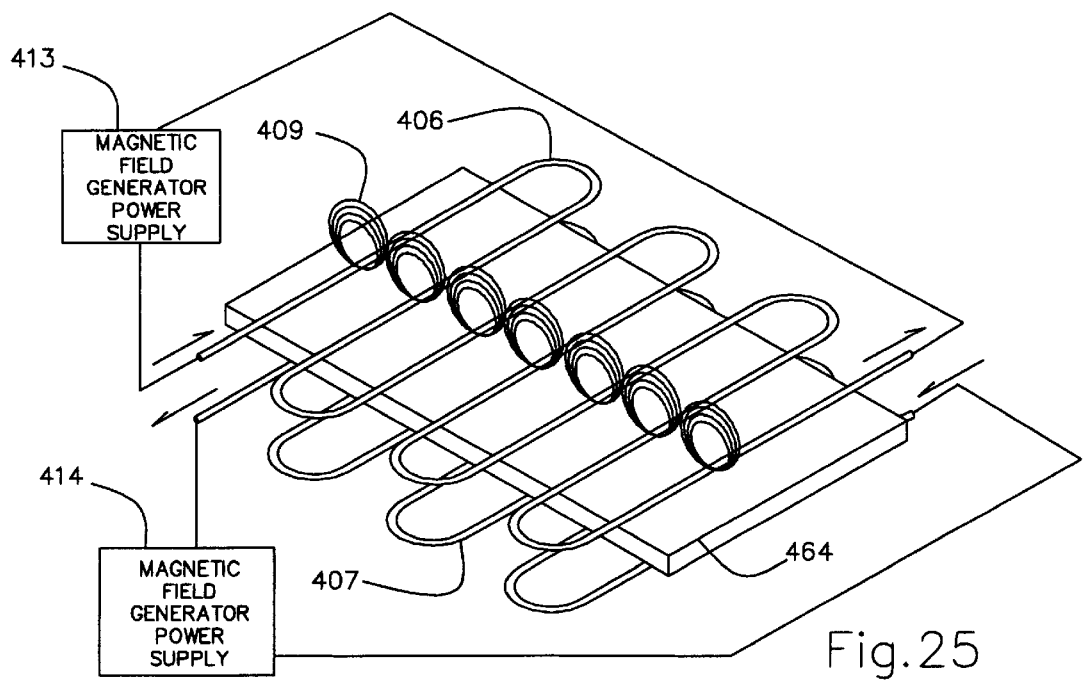
FIG. 25 is a perspective view of the fourth embodiment showing the magnetic lines of force. . The arc discharge power supplies of FIG. 24 are not shown for clarity.
Figure 26:
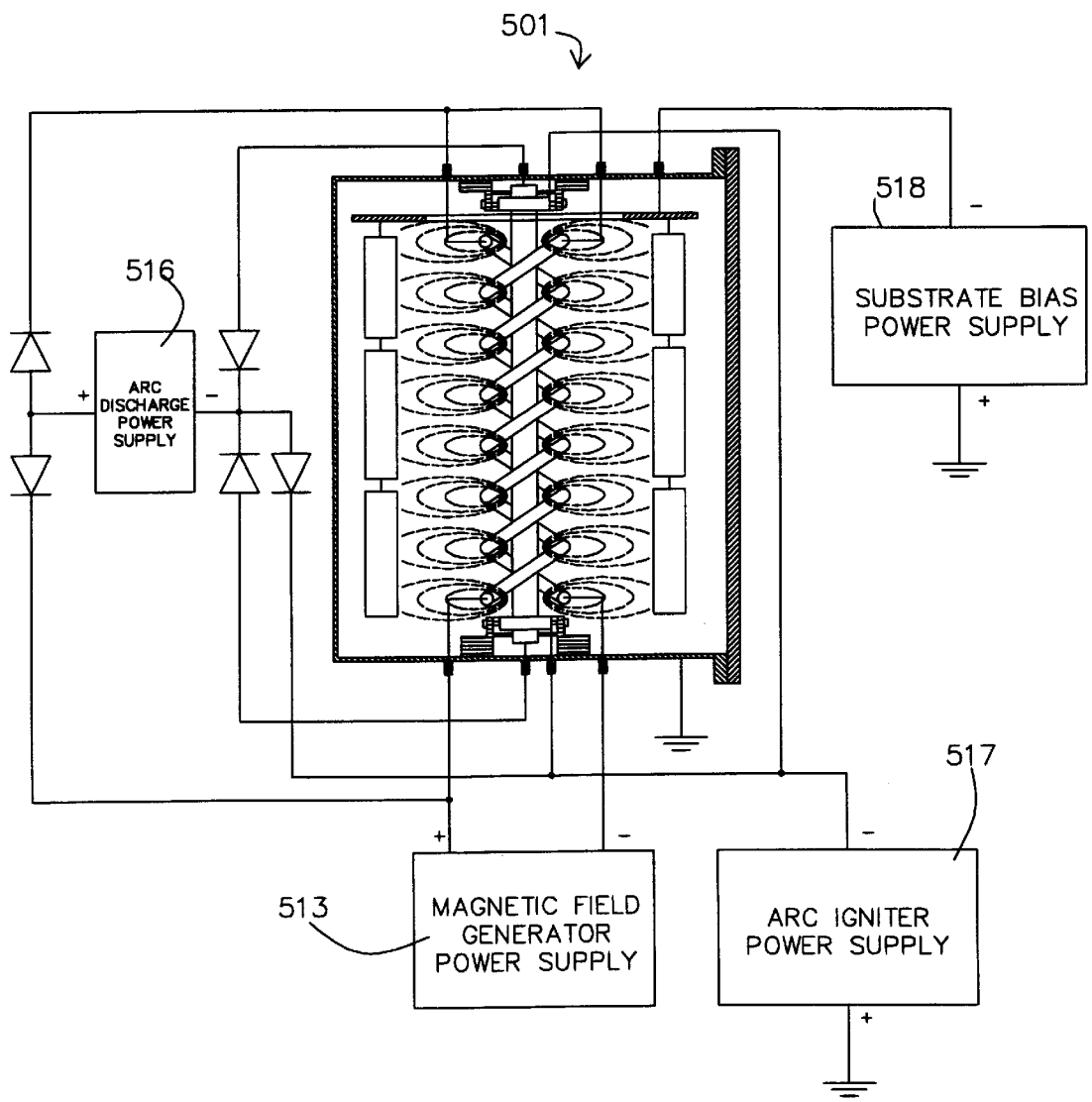
FIG. 26 is a sectional view of the fifth embodiment of the apparatus employing an elongated cathode and a pair of spiral magnetic field generators.
Figure 27:
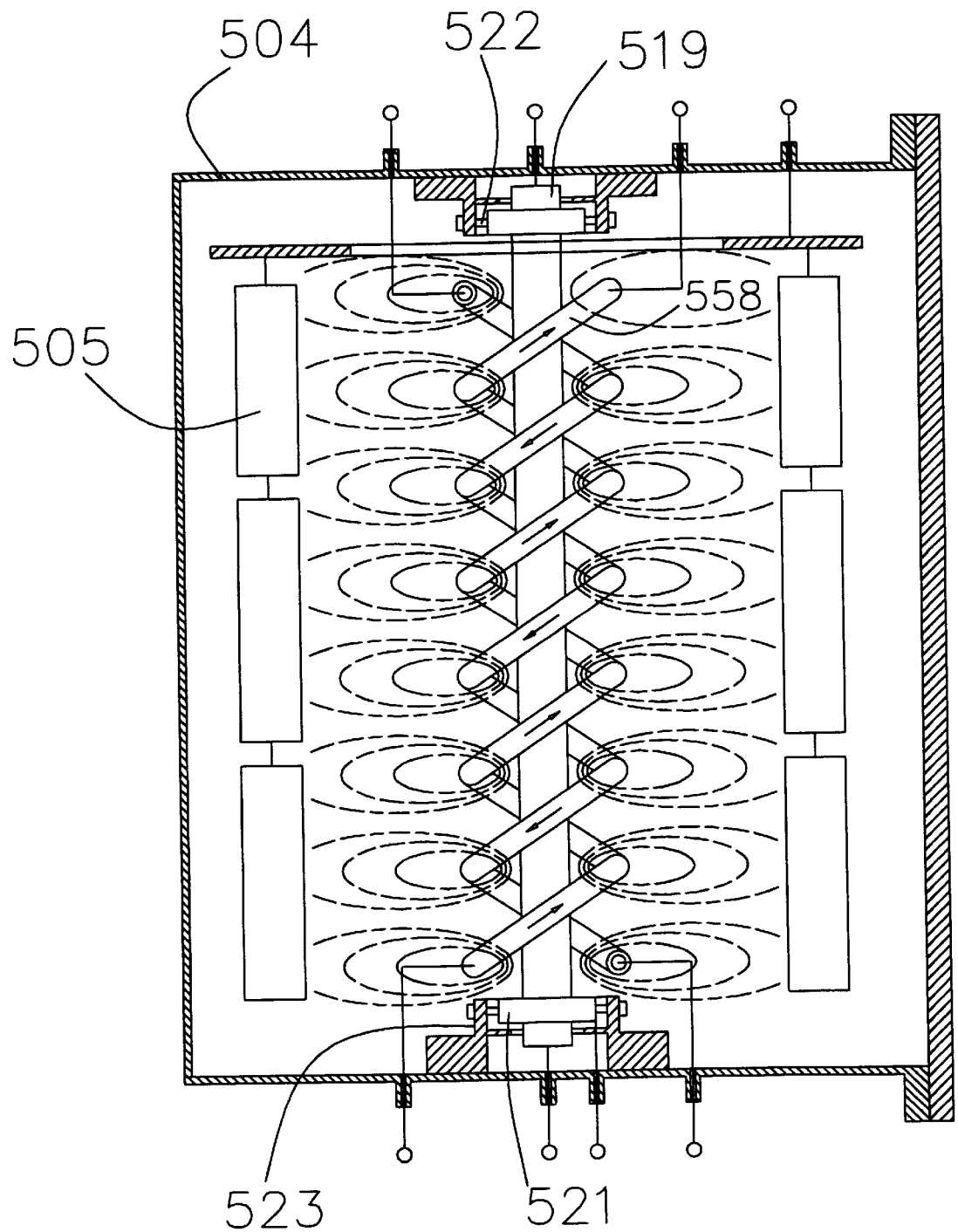
FIG. 27 is an enlarged sectional view of the chamber portion of FIG. 26 showing the opposite current flow path through the coils.

The magnetic field generators establish a magnetic cusp and electron trap in the vicinity of the cathode working surface 2. The magnetic field generator is typically a current carrying conductor. The conductor may be formed into virtually any shape depending on the geometry of the cathode of interest. The conductor shape may be a coil. The conductor may also be straight, curvilinear, serpentine, saw-tooth, spiral etc. in shape. One serpentine shape is indicated in FIGS. 24–25. A bifilar spiral is shown in FIGS. 26–27. Other shapes will be apparent to those skilled in the art in light of this disclosure.

Magnetic field generators may be placed inside or outside the chamber and close enough to one another in such a way that the cathode working surface 2 is located between the geometric centers of each individual magnetic field generator. The field generators mayor may not share a common axis. Coil magnets, for example, positioned as in FIG. 2a, permit the generation of a magnetic field having a shape which interacts with the electric discharge current to form an improved plasma trap. This design advantage combines with the insulated anode 25 to create sharp, powerful electric fields within the plasma.

The magnetic field generators energized using coil power supplies may be adjustable. The objecticve is to produce a magnetic field in which the magnetic induction vectors on one side of the cathode working surface 2 points in the opposite direction as that on the other side. The magnetic field lines are in the shape of a hyperbolic half-cusp positioned in front of and behind the cathode working surface 2.

The magnetic field generators are preferably powered by independently controllable DC power supplies 13,14. The field generators 6,7 are disposed around the cathode working surface 2 (see FIG. 2a). The symbols "⊙" and "⊕" are used to indicate opposite flow direction of the currents passing through the coils and not any particular direction into or out of the plane of the paper. The invention is expected to perform equally well with either current flow arrangement so long as the current flows one way through one coil and in the opposite direction through the other. This relation is what is meant by "anti-parallel" or "reverse polarity" throughout this specification.

The anti-parallel magnetic field generator arrangement sets up the magnetic field lines of force 9 that are characteristic of a magnetic cusp 8. These characteristics include a radial slot 10 having a steep gradient in the radial component of the magnetic field. The radial slot 10 is located at larger values of the radius, r, along the separatrix plane separating the two magnetic half-cusps. As noted above, ionizing or reactive gas is specifically admitted into the chamber near this region of steep gradient in the magnetic field radial component in order to increase ionization efficiency. The skilled artisan will realize that r=0 along the central axis of a coil In FIG. 2a, the central axis of the front coil 6 coincides with the central line-of-sight axis of the apparatus, but such need not always be the case.

The electric field resulting from the Larmor movement of electrons in the plasma around the magnetic field lines is shown by the electric field lines 15. The electric fields create a narrow passage 11 through which the plasma ions must escape in order to reach the substrate. This "ion isthmus" tends to "bottle up" or hold back electrons in the central portion of the cusp thereby increasing the ionization efficiency of the plasma by increasing the likelihood that electrons will collide with neutral atoms. Hence, the cusp 8 is also known as an electron trap.

The magnetic field generators are shown outside the vacuum chamber, but alternatively one or both could be placed inside the chamber. Appropriate insulating and vacuum-tight power supply and cooling water feedthroughs would be provided.

Power Supplies and Electrical Connections

With reference to FIG. 2a and FIG. 2b, the cathode feedthrough 27 is connected to the negative pole of the arc discharge power supply 16 via connector 36b. The anode feedthrough 26 is connected to the positive pole of the main arc power supply 16 via connector 36a. The igniting electrode feedthrough 28 is connected to an igniter power power supply 17 controlled by a pulse signal from the arc discharge power supply. The igniting electrode circuit is connected to the cathode circuit through a resistor 50 that connects the cathode 19 and the arc igniter 22 only during the high voltage pulse applied to the igniter to initiate the arc discharge between the cathode 19 and the anode 25. To make arc initiation easier, the arc discharge circuit is provided with a condenser 40 connected in series with a charge resistor 51 and a discharge diode 52 connected in parallel. Diode 65 discharges a portion of the condenser 40 between the cathode 19 and the chamber (ground).

The arc discharge power supply voltage preferably exceeds 100 V. A module of a tangent slope of the volt-ampere characteristics of this power supply exceeds 1.0 in the working response region. Such a slope of the power supply output characteristics provides greater stability of the arc discharge due to a much larger response of the power supply to arc current variations. Apparatuses known in the prior art use lower voltages (60–100 volts, typically), are common types of arc welding power supplies, and have a lower value of the tangent slope.

The substrate 5 is supplied with the negative bias voltage from the substrate bias power supply 18.

Auxiliary Systems

Figure 17:
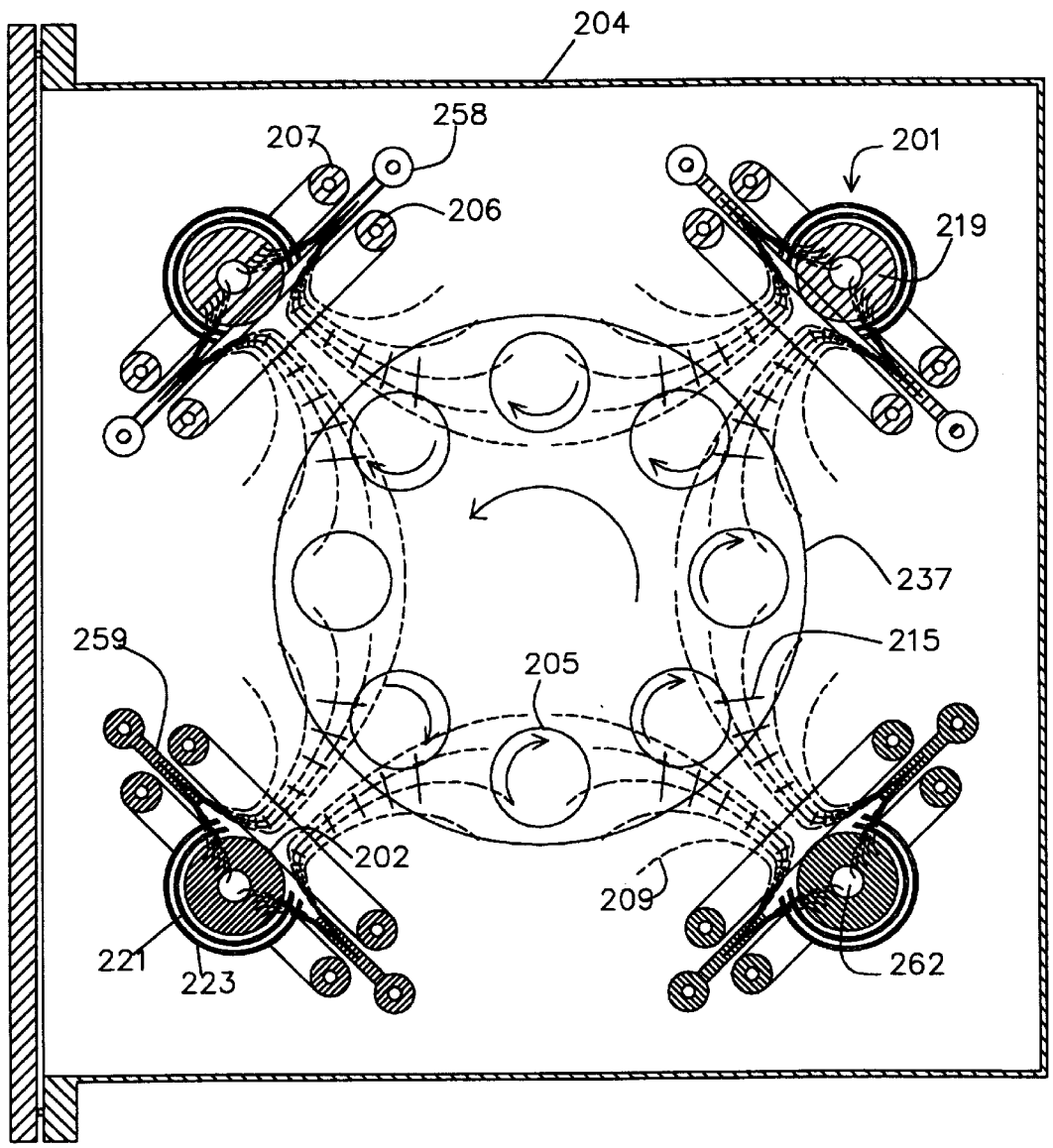
FIG. 17 is a sectional view of four plasma generator assemblies of the second embodiment disposed in the four corners of a deposition chamber around a plurality of substrates.

The skilled artisan will readily appreciate that suitable substrate suppport means 41, positioning means 42, anode cooling means (not shown), and/or magnetic coil cooling means (not shown) may be provided. These and other well-known conventional auxiliary system have been omitted from all or some of the drawings for the sake of clarity. The skilled artisan is sufficiently knowledgeable of such and other auxiliary systems that further description of them here is not necessary to enable the best mode contemplated by the inventor. For example, FIG. 17 shows a rotating substrate support 37 for planetary rotation of individual substrates 5.

Magnetic Field Ratio, $R_B$

Having described the major structural components of the present vapor deposition apparatus, the advantages and results achieved by varying and optimizing the ratio of the strength of the front magnetic field to that of the rear magnetic field will now be described with reference to FIGS. 4–6. "Front" refers to between the cathode working surface and the substrate. "Between" in this context means generally along or adjacent to the flow path of plasma particles from the cathode to the substrate whether that path be linear, curvilinear, or otherwise. "Rear" means on the side of the cathode work surface rest from the substrate. The aforementioned ratio will be referred to as the "magnetic field ratio," "field ratio," "ratio," or simply "$R_B$." As those of ordinary skill will readily appreciate, the ratio in the case of identical coils will be simply the ratio of their respective coil currents. In other cases, the ratio will be the ratio of the axial components of the magnetic fields taken at the coil axes, i.e., at r=0.

Figure 4:
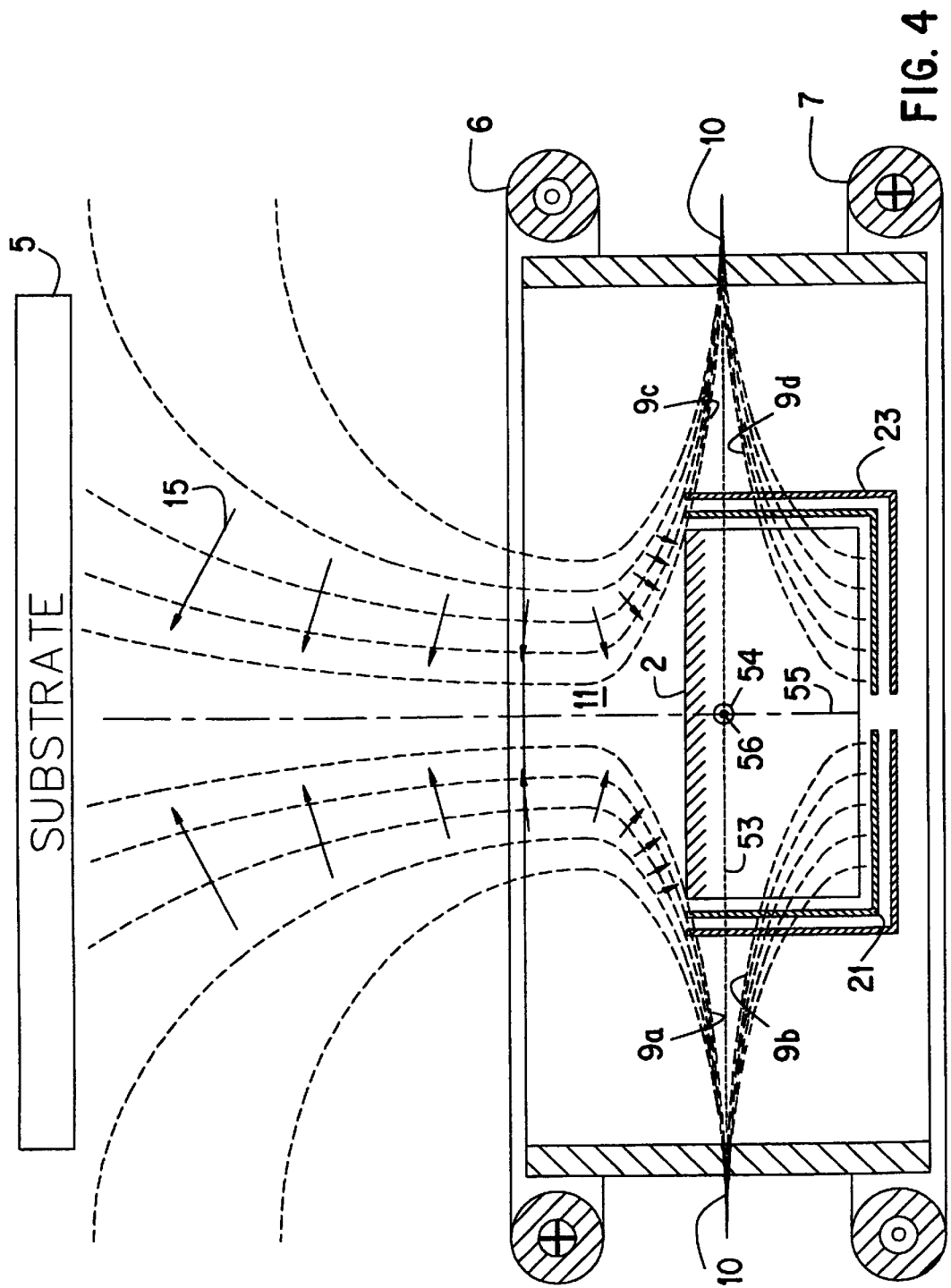
FIG. 4 is a sectional view of the cusp region of the plasma generator assembly and the field configuration when the magnetic field ratio is unity.
Figure 5:
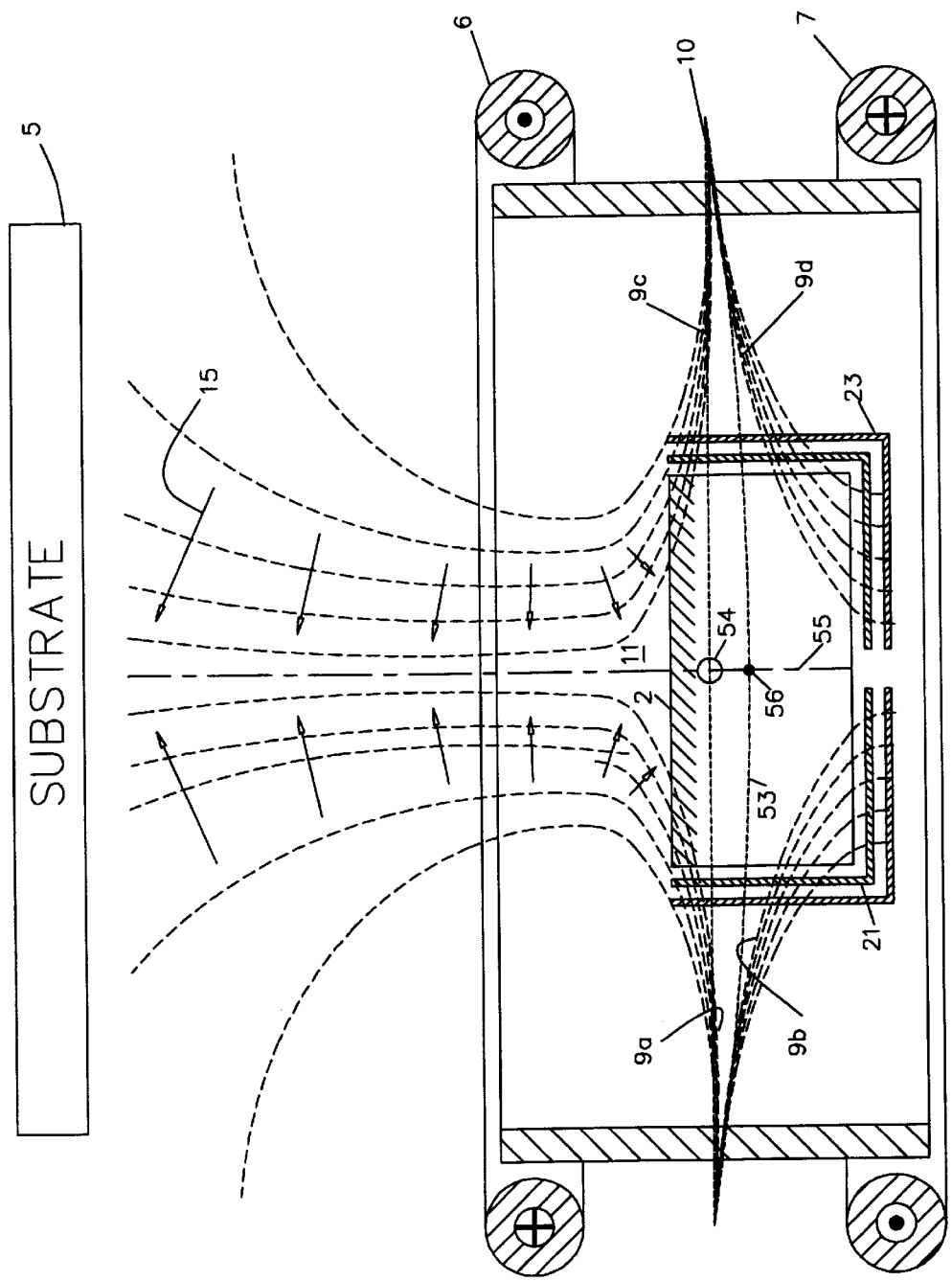
FIG. 5 is a sectional view of the cusp region of the plasma generator assembly when the magnetic field ratio is greater than unity.
Figure 6:
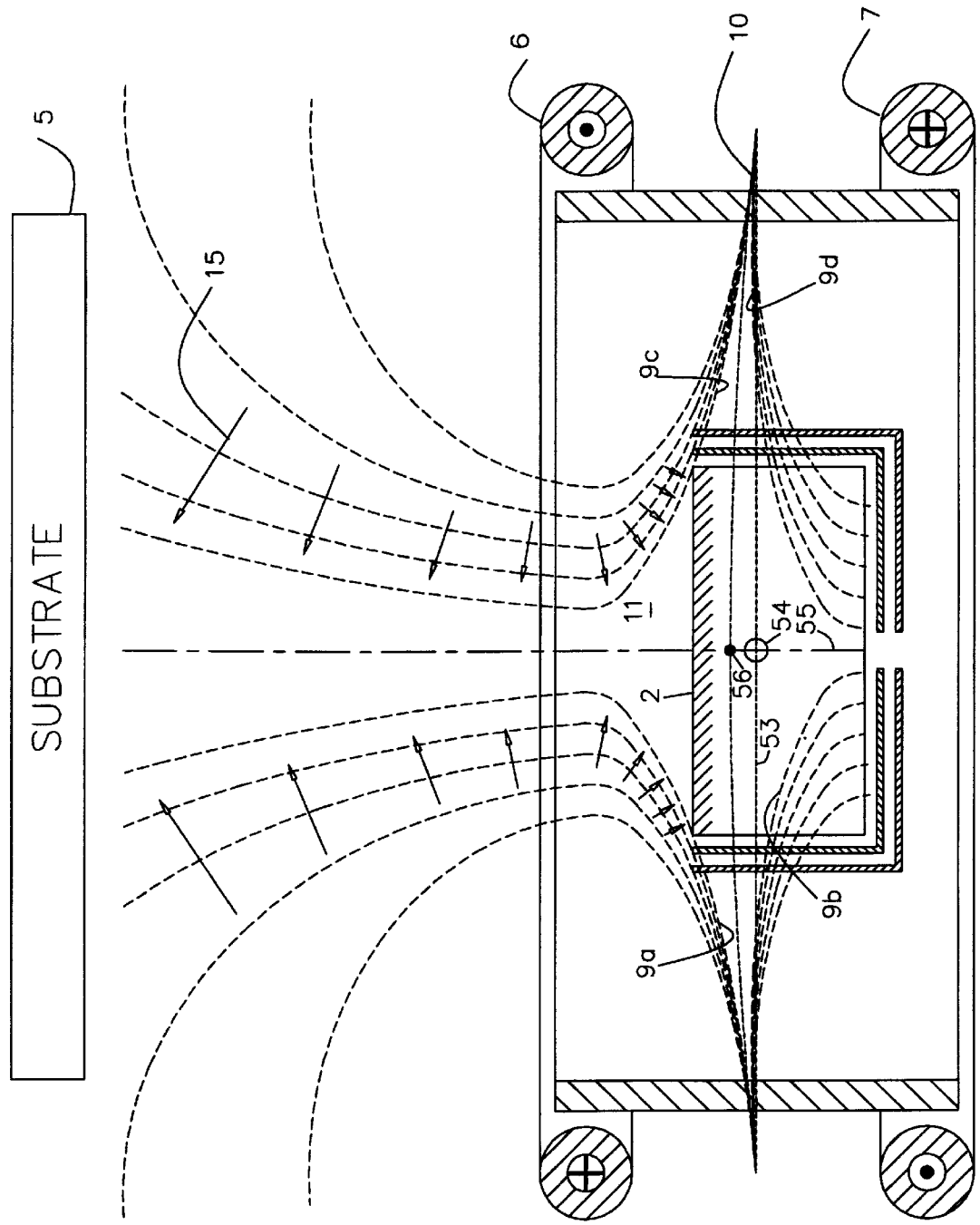
FIG. 6 is a sectional view of the cusp region of the plasma generator assembly when the magnetic field ratio is less than unity.

FIGS. 4–6 are schematic views depicting the effects of varying the ratio on the cusp configuration. As in the other drawings, no structure is intended to be drawn to scale. For example, in FIG. 4, the substrate is shown simply to orient the viewer to the front and rear sides of the cathode working surface 2. The coils are also idealized to single conductor coils whereas in reality each is preferably a multi-turn coil to produce the desired field strengths. A portion of the anode 25 is shown. The inner and outer screen electrodes, but not the triggers, are also shown. FIG. 4 depicts the shape of the magnetic cusp when the magnetic field ratio $R_B$ is unity. The electron trap and magnetic cusp contains at least a portion of the cathode working surface 2 defined by the magnetic field lines of force 9a, 9b, 9c, and 9d. The electric field lines that exists due to the magnetization of the plasma electrons, as described above, are also shown. Electrons are trapped by the cusp in the vicinity of the cathode working surface 2 thereby increasing the chances of desired electron/neutral particle interactions. In this manner, the ionization efficiency of the cusp region is increased. Plasma particles "escape" from the cusp front through the cusp opening 11 towards the substrate and are then deposited on the substrate.

The portions of the radial slot 10 crossing the anode 25 are characterized by a high magnetic field radial component gradient. In this region, ionization is expected to be very efficient. Hence, this region is the preferred location for introducing ionizing gas into the vacuum chamber, as shown in FIG. 2a.

The imaginary plane passing though the radial slots and bisecting the cusp into a front half-cusp and a rear half-cusp is referred to as the separatrix 53. For anti-parallel magnetic fields of equal strength, such as identical coils carrying equal but opposite flowing current, the separatrix 53 also passes through the geometric center 54 of the coils. For such fields, the "geometric center of the coils" is the mid-point of the segment connecting the geometric center of each individual coil. The point at which the separatrix 53 intersects the common axis 55 of co-axially disposed coils is the magnetic center 56 of the coils. As shown in FIG. 4, the magnetic center 56 coincides with the geometric center when the magnetic field ratio $R_B$ is unity. The magnetic field value is zero. The field strength increases in all directions from this point with a high gradient of about 20–60 Gauss per centimeter.

In light of the present disclosure, the skilled artisan will appreciate that the magnetic center 56 of the magnetic field generator, e.g., the pair of anti-parallel coils, may be moved to the front or rear of the generator's geometric center 54 along the coils' central axis by decreasing or increasing the magnetic field ratio, respectively. Increasing the magnetic field ratio tends to "push" the separatrix 53 and magnetic enter 56 to the rear (away from the substrate) along the central axis 55, as shown in FIG. 5. Increasing the field ratio transforms the separatrix 53 into a concave surface from the point of view of the substrate 5. As shown in FIG. 5, the separatrix bows to the rear, i.e., away from the substrate. Similarly, the separatrix may be "pushed" closer to the substrate by decreasing the magnetic field strength ratio, as shown in FIG. 6.

One important advantage of the instant invention over the prior art is more uniform consumption of the cathode. FIGS. 7a–7d show the general nature of the observed movement of the cathode spot 57 across the cathode working surface 2 as viewed from the substrate at increasing values of the magnetic field ratio. FIGS. 8a–8d are cross-sectional views of the cathode 19 taken along lines 8a–8d of FIGS. 7a–7d showing the cathode consumption pattern at increasing values of the magnetic field ratio.

Figures 7A, 7B, 7C, 7D:
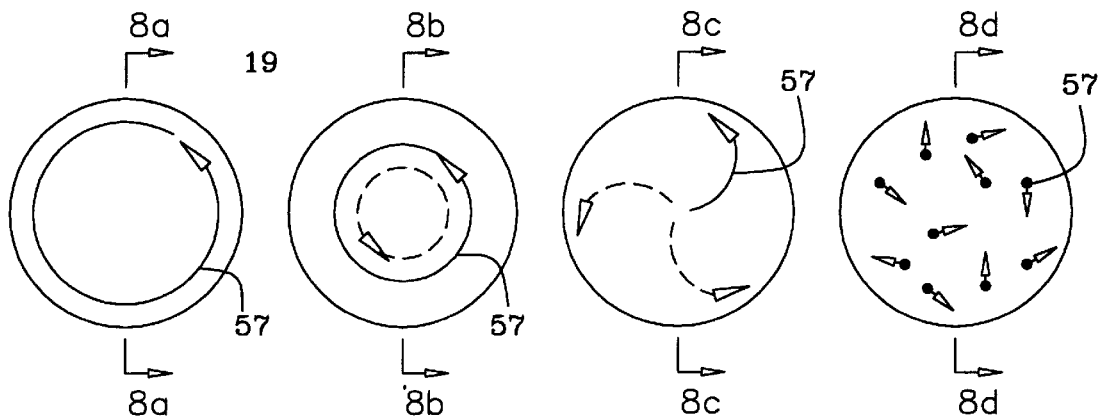
FIGS. 7a–7d are views of the cathode working surface showing the cathode spot trace pattern for increasing values of the magnetic field ratio, $R_B$.
Figures 8A, 8B, 8C, 8D:
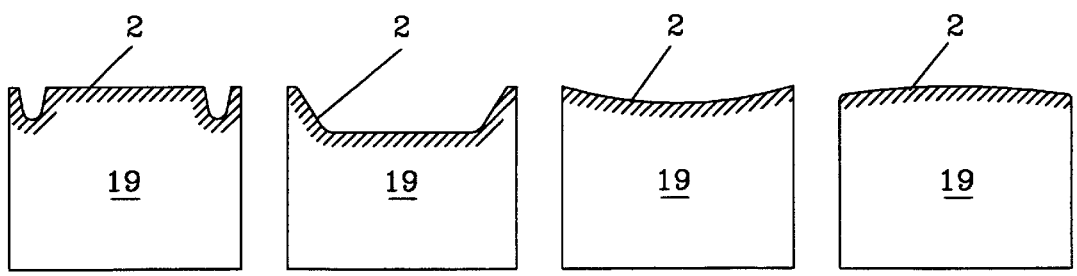
FIGS. 8a–8d are sectional views of the cathodes taken through lines 8a—8a, 8b—8b, 8c—8c, and 8d—8d, respectively, as indicated in FIGS. 7a–7d.

In FIG. 7a and 8a, the effects of a magnetic field ratio of less than unity can be seen. The cathode spot 57 precesses in a characteristic racetrack configuration at a fixed radius (FIG. 7a) causing substantial non-uniform "grooved" consumption of the cathode material (FIG. 8a). As the magnetic field ratio increases, the motion track of the cathode spot continues to be generally circular (FIG. 7b), but at variable radial distances thereby producing the consumption profile depicted in FIG. 8b. For magnetic field ratios above unity, the cathode spot track is either similar in shape to an Archimedean spiral across substantially the entire radius of the cathode 19 (FIG. 7c) or is essentially random (FIG. 7d). These cathode spot patterns produce a surprisingly uniform radial consumption profile, as shown in FIGS. 8c–8d.

Test Results

A series of experiments was performed to study the dependence of the substrate current density on both the magnetic field ratio and pressure. The coils were of identical size, shape, and coil turns. The coil current in the front coil 6 was held constant as the current of the rear coil 7 was varied The substrate current density, an indicator of the plasma flow rate and deposition coating rate, was measured as the magnetic field ratio was varied at each pressure of interest.

Figure 9:
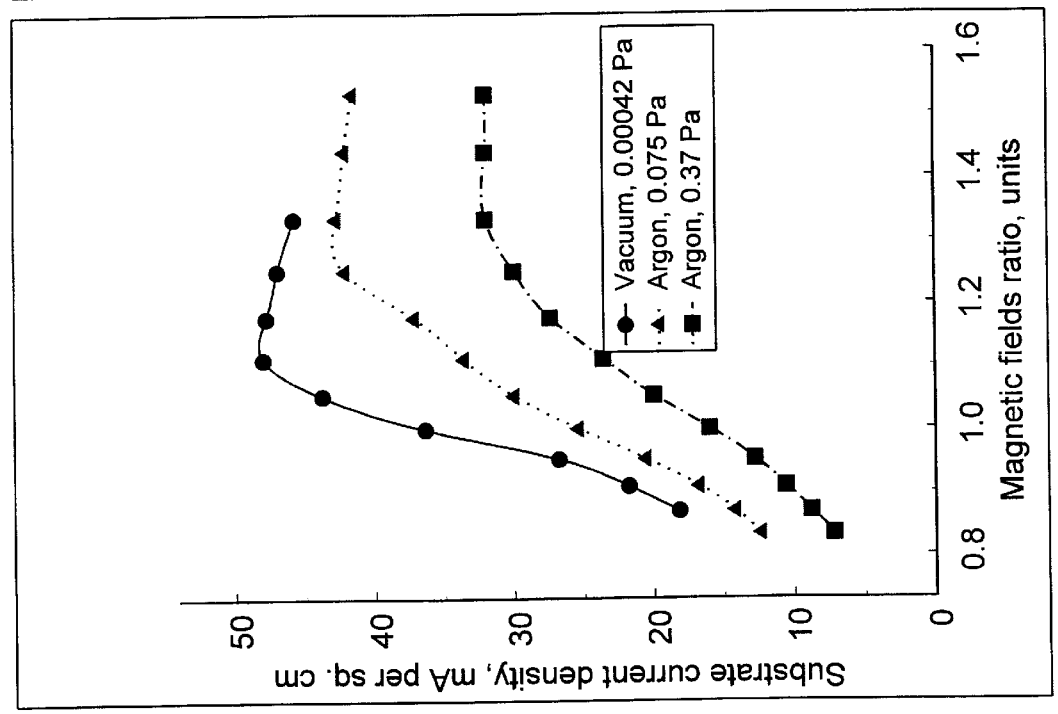
FIG. 9 is a graph of substrate current density against magnetic field ratio at three pressures.

The coating deposition rate for the coating process runs of FIG. 9. was not measured directly. Instead, the minimum estimated coating deposition rate was calculated to be about 34–40 $\mu$m/hr by adjusting the 30–35 $\mu$m/hr deposition rate of Examples 1–4 downwardly by a factor of 0.83 to account for a lower arc current (100 Amps/120 Amps) and upwardly by a factor of 1.37 ((410 mm/350 mm)$^2$) to account for a closer substrate-cathode spacing. Insofar as the substrate current density increased by a factor of 1.6, it is possible that the observed coating deposition rate would have been even higher, i.e., 54–64 μm/hr, had the samples been located 350 mm from the cathode 19 using a 100 Amp arc current. The experimental runs were performed at three different operating pressures, namely 0.00042 Pa, 0.075 Pa, and 0.37 Pa. The ionizing gas was argon.

The substrate current density results are graphed in FIG. 9. The substrate current density increases with decreasing operating pressures. Surprisingly, the substrate current density also varies significantly as the magnetic field strength ratio is varied. This discovery is significant It is believed that a significant degree of coating property non-uniformity, e.g., non-uniform coating thickness, adhesion, composition, etc., is caused by variations in the plasma flow. While other mechanisms exist for varying the coating deposition rate, such as arc discharge power, this invention is believed to be the first instance of controlling plasma coating deposition rate by varying the magnetic field ratio, and in particular, by varying the strength of a magnetic field located behind the cathode working surface 2 while holding constant the field strength of a magnetic field positioned between the cathode evaporative surface and the substrate. Accordingly, one benefit of this discovery concerns improved process control. As other system variables change causing the substrate coating rate to rise or fall throughout a coating run, the magnetic field ratio can now be adjusted accordingly to maintain a constant coating deposition rate. Improved control of the plasma deposition rate results in higher quality coatings.

Another surprising result shown in FIG. 9 is the substrate current density passing through a maximum value. Hence, an optimal magnetic field ratio exists. The importance of this discovery of an optimal magnetic field ratio cannot be overemphasized. Not only has a new, previously unreported relation between the plasma coating rate and a new process parameter, i.e., the magnetic field ratio, been discovered, but that coating rates can be maximized by varying the magnetic field ratio to optimize any cathode arc system.

Specifically, for the physical system and geometry used in the experiments reported in Table 1 and shown in FIG. 9, the maximum substrate ion current density at low pressure was 48 mA/cm$^2$. As reported above, the corresponding deposition coating rate was 34–40 μm/hr (0.57–0.66 μm/min). By comparison, FIG. 10 of U.S. Pat No. 5,126,030 to Tamagaki reports a plasma deposition coating rate of about 0.25 μm/min. This over 200% improvement in deposition coating rate over the prior art is especially surprising because Tamagaki achieved a poorer result using a magnetic field having a stronger axial component (200 Gs) than the axial component of the front magnetic field (170 Gs) used to achieve the better result reported here.

By employing a pair of anti-parallel magnetic coils (one to each to side of the cathode evaporative working surface) and optimizing the magnetic field ratio, the present invention has demonstrated a better than two-fold increase in the plasma coating deposition rate compared to the prior art use of a single magnet coil placed between the cathode and substrate.

Additional experiments were performed to evaluate what effect, if any, the relative axial positioning of the cathode working surface 2 and the separatrix had on the substrate current density. As noted above, the geometric center 54 of the coils is the midpoint of the geometric

TABLE 1

Dependence of Substrate Current Density on Magnetic Field Ratio $R_B$ and Pressure

| Magnetic Field Ratio | Substrate Current (mA/cm$^2$) @ P = 4.2 × 10$^{-4}$ Pa | Substrate Current (mA/cm$^2$) @ P = 7.5 × 10$^{-2}$ Pa | Substrate Current (mA/cm$^2$) @ P = 3.7 × 10$^{-1}$ Pa |
|---|---|---|---|
| 0.83 | — | 12.4 | 7.2 |
| 0.87 | 18.2 | 14.2 | 8.8 |
| 0.91 | 21.8 | 16.8 | 10.6 |
| 0.95 | 26.8 | 20.6 | 12.8 |
| 1.00 | 36.4 | 25.4 | 16.0 |
| 1.05 | 43.8 | 30.0 | 20.0 |
| 1.11 | 48.0 | 33.6 | 23.6 |
| 1.18 | 47.8 | 37.2 | 27.4 |
| 1.25 | 47.0 | 42.2 | 30.0 |
| 1.33 | 45.8 | 42.8 | 32.0 |
| 1.44 | — | 42.2 | 32.0 |
| 1.53 | — | 41.6 | 32.0 |

Notes to Table 1: The arc current was 100 A. The cathode was 316SS. The distance from the cathode working surface to the substrate, L, was 350 mm. The substrate size was 50 × 50 mm. The ionizing gas was argon. Substrate bias was set at 100 V.

center of each individual coil. As explained above, the separatrix 53 is an imaginary surface that separates the front half-cusp and the rear half-cusp of the magnetic field created by the anti-parallel magnets. By varying the magnetic field ratio, the separatrix can be moved relative to the geometric center of the coils. Of course, the geometric center of the coils does not vary with changing magnetic field ratio.

Figure 10:
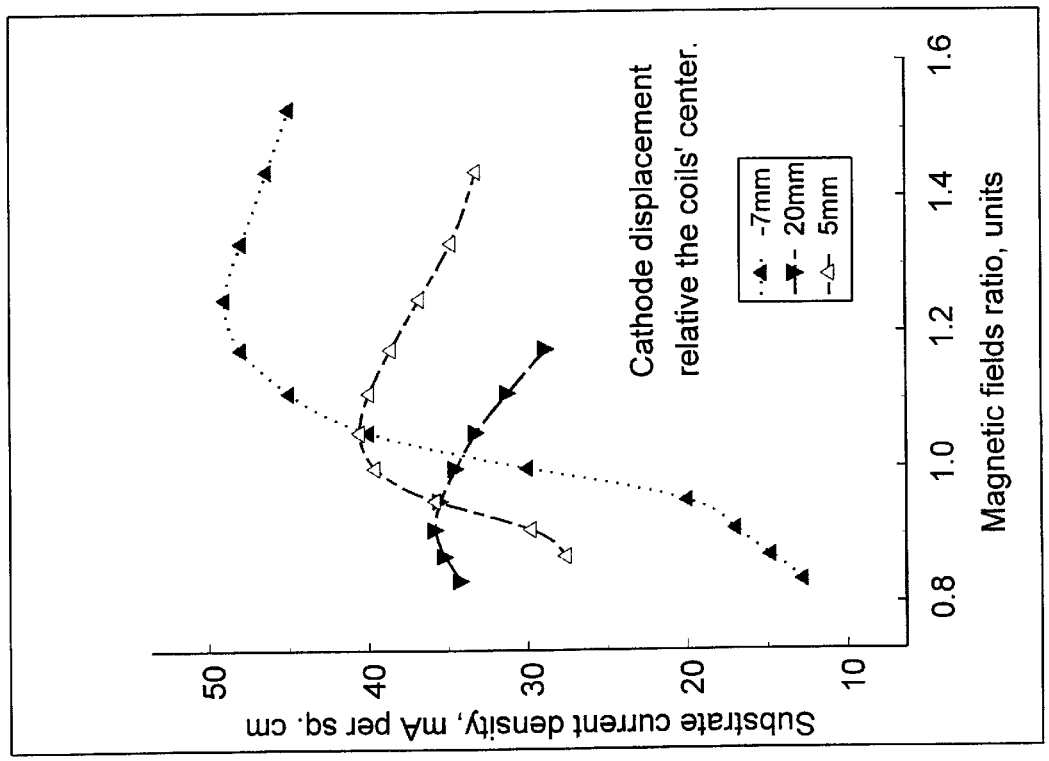
FIG. 10 is a graph of substrate current density against magnetic field ratio for three different displacements of the cathode working surface relative to the coils' geometric center.
Figures 11, 12:
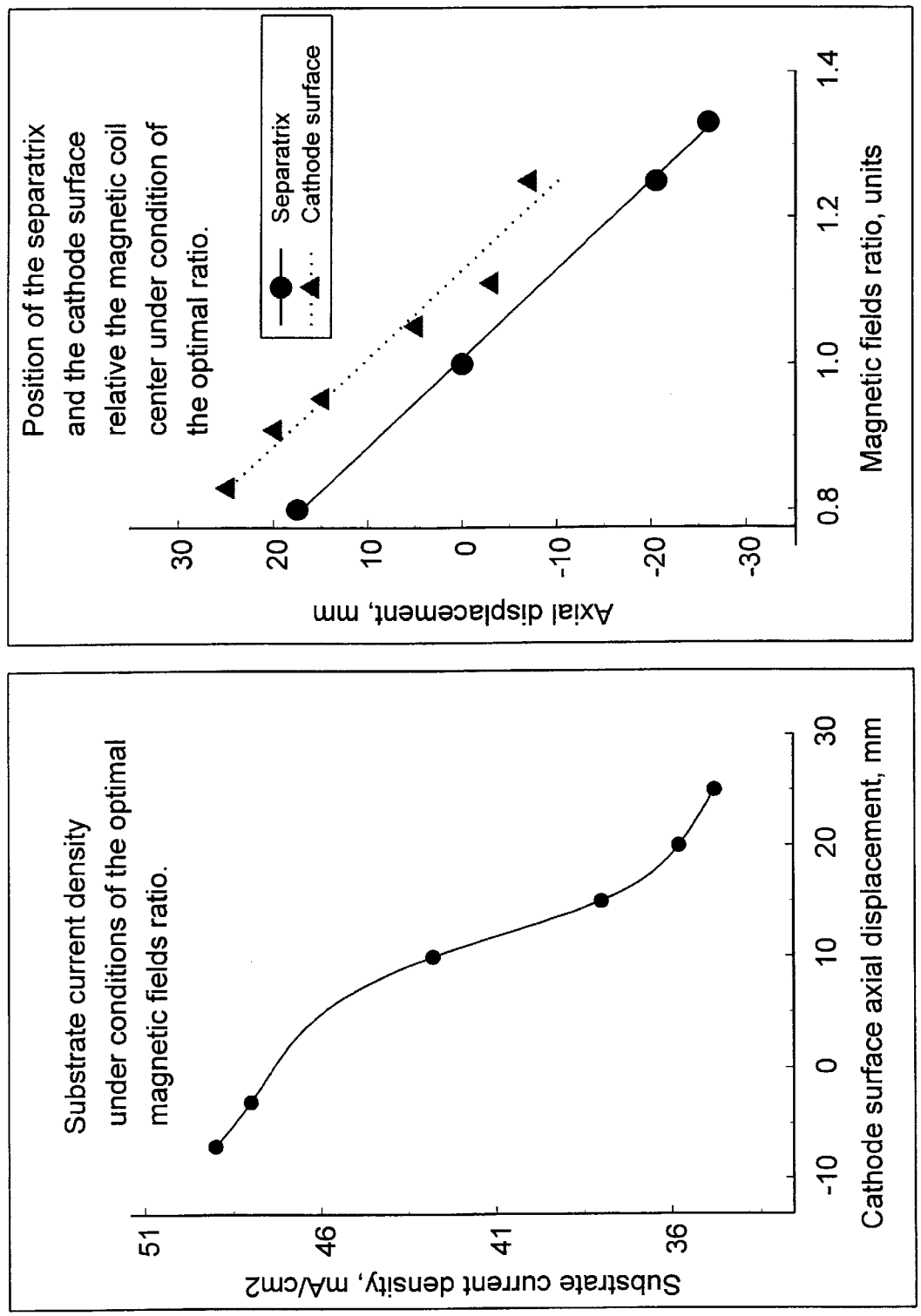
FIG. 11 is a graph of substrate current density against optimal cathode working surface axial displacement from the coils' geometric center.
FIG. 12 is a graph of the relative axial displacement of the separatrix and cathode working surface at different optimal magnetic field ratios.

FIG. 10 shows the dependence of substrate current density on the magnetic field ratio for various displacements of the cathode working surface relative to the geometric center of the coils. As shown in FIG. 11, the maximum substrate current density increases as the cathode working surface is moved away from the substrate from an initial position in front to a final position behind the coils' geometric center. As shown in FIG. 12, the optimum substrate current density is found when the cathode working surface is displaced a relatively fixed distance in front of the separatrix That is, the optimum plasma coating rate is obtained when the cathode working surface is displaced an optimal distance in front of the magnetic field center. The axial displacement may be half the distance between the first and second field generators. In the experimental operating system in which the importance of this axial displacement of the cathode working surface was discovered, the optimal cathode working surface/magnetic field center axial displacement falls in the range of about 5–20 mm, typically about 10 mm. However, this value is expected to vary with coil geometry and other apparatus parameters. In light of this disclosure, however, it is believed that the skilled artisan without more than routine experimentation will be able to determine the optimal cathode working surface/magnetic field center axial displacement for any given cathode arc vapor deposition system.

In light of these discoveries, a previously unrecognized limitation on both the plasma deposition rate and the ability to control it at a relatively constant rate throughout the deposition run is now apparent. It is now clear that prior art systems in which the cathode working surface was placed at the geometric center of the coils at the beginning of the deposition run were not operated at the optimum.

Several important practical applications of the discoveries reported above are now contemplated. It is now possible to position the cathode working surface at a predetermined optimal axial distance in front of the anti-parallel magnetic field center at the start of the plasma deposition run. The skilled artisan will recognize that the distance may be determined for a given physical system by a series of tests measuring the substrate current density as a function of axial displacement of the cathode working surface relative to the coils' geometric center. Throughout the coating deposition processing run, as the cathode material is consumed and the cathode working surface advances to the rear of the apparatus, the magnetic field ratio may advantageously be gradually increased to maintain the optimal cathode working surface/magnetic field center spacing. In this way, plasma deposition rates can not only be maximized, but perhaps equally importantly, they may be controlled at a relatively constant rate. As discussed above, it is believed that non-uniform properties in the coatings made by prior art machines and methods are due primarily to variations in the plasma flow rate throughout the coating run. Such non-uniform plasma flow is usually the result of a multi-component plasma composition. Non-uniform plasma flow is also the result of action of an external magnetic field applied to control the motion of plasma ions and electrons which causes a strong focusing effect on these plasma components flow while the neutral atom components of the plasma flow follow the "cosine law." As a result, a degree of the plasma flow ionization and plasma density varies with the variation of the radial distance from the plasma flow axis. Such variation, which determines energy-related characteristics of the plasma flow, causes the correspondent variation of the coating properties on the substrate.

The ability in the present invention to control plasma deposition rate at a relatively constant rate at levels higher than previously achieved in prior art systems produces coatings with significantly more uniform physical properties than made previously by prior art methods. Such physical properties include, but are not limited to, coating thickness, corrosion potential, hardness, and surface roughness.

Process Operation

The preferred manner of coating substrates according to this invention will now be described. Substrate parts to be coated with, say, a stainless steel coating are first mechanically and chemically pre-cleaned according to prior art techniques. The pre-cleaned substrate parts are placed in the chamber which is then evacuated to about 0.01 milliTorr or less. The substrates are then cleaned by glow discharge in argon at 0.1–10 milliTorr, for example. Preferably, the substrate is rotated during cleaning. The magnetic field generators of the evaporator should be energized to produce a magnetic field around the parts inside the chamber for better glow discharge operation there. The value of the magnetic field measured inside the evaporator should be about 5–50 milliTesla.

The ratio of the magnetic fields should be sustained between 0.5–2.0 for the stable arc discharge operation during the ion cleaning and may be adjusted for an optimal ion current value. As a result, the magnetic field inside the chamber is strong enough to assist in an effective ionization of the argon used for the ion cleaning. A high negative bias voltage of about 800–2,500 volts DC should be applied to the parts to create a glow discharge inside the chamber followed by ion bombardment of the surface of the parts. Such ion bombardment not only stimulates evaporation of the atoms and/or molecules of contaminants such as water and grease, but also causes a sputtering of the surface atoms. Oxide films or grease contamination form a non-conductive film on the surface of parts. The presence of these oxide films or grease contamination causes charging of the surface film followed by random electrical breakdowns of the film. Such breakdown phenomena can be observed during the glow discharge operation as a sparking on the surface of the parts contaminated with a grease or oxide film, for example. This sparking can easily initiate a cathode spot development on the surface of the parts that may cause damage of the parts. For this reason, the ion current flowing through the fixture holding parts should be limited (or interrupted momentarily) at a level of about 10–20 Amperes to avoid the arc spots' development. The glow discharge cleaning should be executed until the sparking on the part's surface is gone. For best results, the bias voltage should slowly or in several steps be increased during the glow discharge operation to eliminate the sparking on the parts without damaging them by the arcing. Depending on the contamination level, it usually takes about 5–30 minutes to prepare the parts in this way.

The arc discharge power supply should be energized to apply the voltage to the evaporator. The arc between the cathode and anode is initiated through the trigger block which operates together with the arc discharge power supply. The trigger block automatically monitors the presence of the arc current and restores it if the arc discharge is extinguished for some reason.

The temperature of the parts should be monitored during the ion cleaning step because heavy metal ions of the cathode material bombarding the surface can cause a substantial temperature increase compared to the glow discharge cleaning step. The parts should not be exposed to temperatures capable of damaging the parts. When the temperature of the parts has reached the desired working temperature level, e.g., 20–300° C., the high voltage bias applied to the parts should be replaced with a low voltage negative bias of a value which preferably exceeds the arc discharge voltage value. This value can be in the range of 30–300 volts DC depending on the application. The bias voltage attracts the ions from the plasma flow and provides them with additional energy which facilitates formation of a higher quality coating. When the temperature of the parts has reached the working temperature, the flow of working gas, e.g., argon, filling the chamber can be stopped and the working vacuum reduced to a pressure of 0.01 milliTorr or less. The duration of the coating deposition stage depends on the desired coating thickness and the arc discharge current. The coating deposition rate is proportional to the arc current but practically is limited by the cathode material thermal properties and its cooling conditions. Accordingly, the arc discharge current value is sustained at a current density level that does not exceed 6–8 Amperes per square centimeter. For example, the arc discharge current is about 120–160 Amperes for a cathode made of 316 type of stainless steel having a diameter of 50 mm. The need for arc stability establishes a practical limit that the arc current not fall below 25–30 Amperes. Hence, the practical range of the arc current for a 50 mm diameter and 30 mm thick stainless steel cathode 19 is about 25–160 Amperes. For a vacuum arc current of about 120 Amperes, the coating deposition rate of stainless steel is about 30–35 $\mu$m/hr. These are the deposition rates observed for Examples 1–4, below. The deposition rate for parts undergoing planetary rotation on a substrate positioning device (not shown) is about 10–15 $\mu$m/hr. The magnetic field ratio should be sustained between 0.5–2.0, more preferably 0.8–1.5, most preferably 1.1–1.3, to provide the highest coating deposition rate, the best coating quality, and the most stable arc discharge.

COMPARATIVE EXAMPLES

The instant invention achieves higher coating rates than prior art processes. FIG. 10 of the Tamagaki patent shows a maximum coating deposition rate of about 0.25 $\mu$m/min, or about 15 μm/hr at a substrate/cathode distance of 350 mm and an arc current of 100 A. As noted above, had the Examples 1–4 samples been coated using the 100 A arc current and 350 mm cathode-substrate spacing conditions of Tamagaki, the observed coating deposition rate for this invention would have been at least an estimated 34–40 μm/hr and perhaps as much as 54–64 μm/hr. These estimated coating rates for the present invention are at least about 225% and perhaps as much as 425% higher than the Tamagaki coating deposition rate.

As described above, the instant invention involves a cusp-shaped magnetic field to enhance the plasma stream. The following examples illustrate the manner in which the apparatus may be operated in order to obtain the benefits of the instant invention. Critical to the optimal operation of the process is the proper ratio of the strength of the front half of the field to that of the rear half. In the case where coil magnets are used to generate the magnetic field strength, as in the examples which follow, the magnetic field strength is most easily established by adjusting the magnetic coil current, e.g., by adjustable power supplier 13, 14.

As noted above, the magnetic field ratio is the ratio of the magnetic field strength generated by the magnetic field generator closest to the substrate, i.e., the "front" generator, to the field strength generated by the generator furthest from the substrate, i.e., the "rear" generator. The following examples all assume axial alignment of the cathode working surface at the geometric center of the coils, as defined above. Such positioning of the cathode working surface is suggested for clarity and simplicity, but in practice is not necessary. It should be understood that deviation of the axial position of the cathode working surface from this alignment with the generators' geometric center will result in differences between the observed optimal ratio and the values reported here, as the discussion of FIGS. 4–6 above explains. With the cathode working surface positioned in this manner, the preferred range of the magnetic field ratio throughout the processing run is 0.5–2.0. The more preferred range is 0.8–1.5. The most preferred range is 1.1–1.3.

At a certain value of the magnetic fields ratio, i.e., at a certain position of the separatrix relative to the cathode working surface, the influence of the magnetic field on the arc discharge plasma is at an optimum. The reason for the optimality probably is the concurrent action of at least two factors. The first factor is the volume of the electromagnetic trap where the plasma is being treated. The bigger the volume of the cusp-shaped space in front of the cathode working surface, the more plasma particles can be trapped there. The volume of the trap increases when the magnetic field ratio decreases, i.e., when the separatrix of the cusp moves towards the substrate relative to the cathode working surface.

The second factor is the "transparency" of the cusp opening 11 for the plasma escaping from the trap towards the substrate. The transparency increases when the magnetic field ratio increases because the magnetic field lines of the cusp in front of the cathode working surface become more parallel relative to the direction of the plasma escape route.

The observed substrate current is due to an escape of the plasma from the trap through the cusp opening. Because the substrate bias voltage, arc current, and gas pressure were held constant in these experiments, the value of the substrate current variations was due only to variations of the plasma flow escaping from the trap. The observed maximum in FIG. 9 can be explained as the dominant action of the dramatic decreasing transparency of the cusp-shaped magnetic field configuration at ratio values below the optimum and by the dominant action of the decreasing volume of the trap at ratio values greater than the optimal ratio.

When the ratio decreases from large values to the optimal ratio value, the plasma density inside the trap increases due to the trapping of plasma particles. When the ratio decreases to less than the optimal ratio, the transparency of the trap slot decreases thereby causing a decreased plasma flow.

The situation is not symmetrical about the optimal ratio point because of the action of a third factor. The absolute value of the magnetic field in front of the cathode increases as the ratio increases. It causes the plasma flow density about the axis to increase due to focusing action of the magnetic field on the plasma flow. The action of the first two factors creates the maximum on the substrate current—ratio characteristic and the third factor makes the characteristic not symmetrical about the maximum.

The explanation described above applies for any position of the cathode working surface between the magnetic field generators. It is noteworthy, however, that the optimal ratio and substrate current values vary when the cathode position is changing, i.e., when the cathode is being consumed so that the cathode working surface is moving from some initial position closer to the substrate toward another position further from the substrate. To provide the best results according to the present invention, the ratio should be kept at the optimal value at all times. The separatrix should preferably intersect the cathode axis at a point about 5–20 mm behind the cathode working surface. The substrate current is at a maximum value in that case. Fortunately, the substrate current increases during cathode consumption if the optimum ratio is maintained.

EXAMPLE 1

Figure 13A:
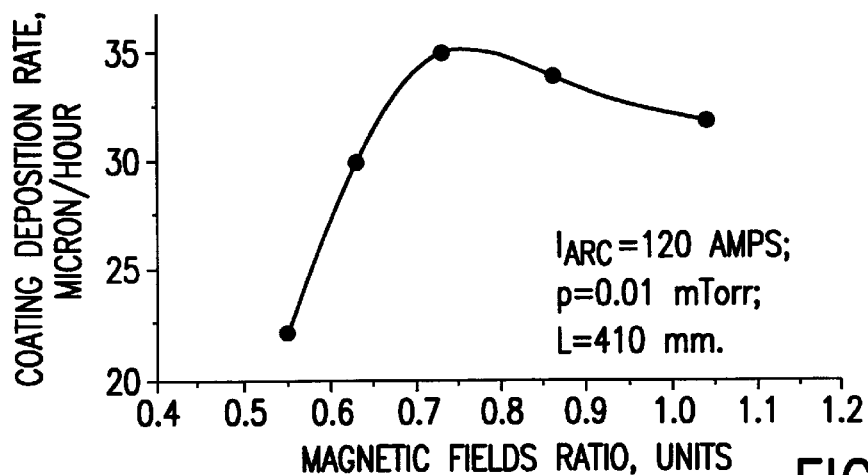
FIGS. 13a–13c are graphs of the process coating deposition rate, ion current density, and anode potential versus magnetic field ratio.
Figure 13B:
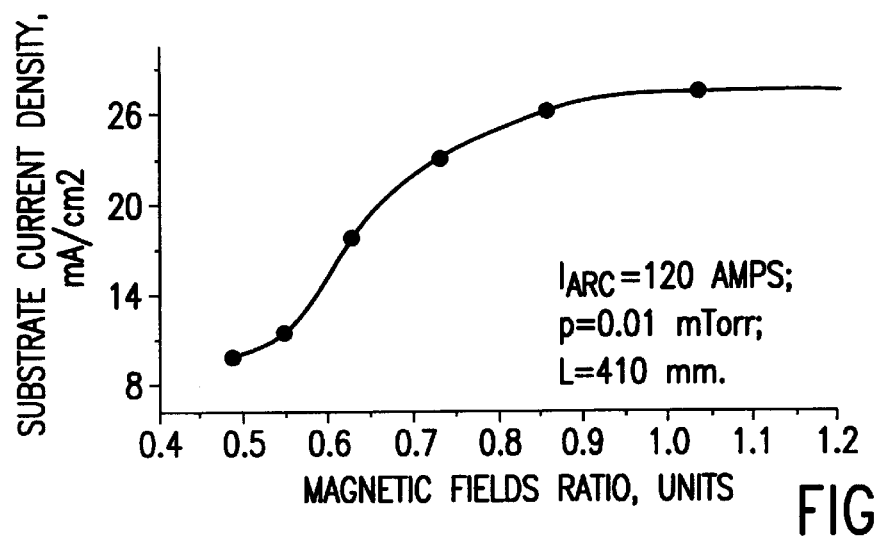

The ion current density measures the current caused by plasma ions flowing towards the substrate being coated. It is a simple, indirect measure of the plasma particle flow that determines the coating deposition rate because the plasma particles are carrying the current between the cathode 19 and the substrate. To generate the following measurements, the substrate was placed 410 millimeters from the cathode, the pressure in the chamber was maintained at 0.01 milliTorr, the arc current was maintained at 120 amperes, and the substrate biased with −80 VDC so that the measured current was not dependent on the conditions near the substrate. The ion current density at different values of the magnetic field ratio are tabulated in Table 2 and shown in FIG. 13b.

The improved ion current density can be explained by measuring changes in the electric potential of the anode. The electric potential difference between the anode and the cathode is roughly

TABLE 2

| Magnetic Field Ratio | Ion Current Density (mA/cm$^2$) |
| --- | --- |
| 0.49 | 9.6 |
| 0.55 | 11.2 |
| 0.63 | 17.6 |
| 0.73 | 22.7 |
| 0.86 | 26.0 |
| 1.04 | 27.2 |
| 1.23 | 27.3 |

TABLE 3

| Magnetic Field Ratio | Anode Potential (VDC) | Cathode Potential (VDC) |
|---|---|---|
| 0.55 | 10.0 | −17.5 |
| 0.63 | 11.5 | −16.0 |
| 0.73 | 18.5 | −14.0 |
| 0.86 | 23.0 | −10.5 |
| 1.04 | 23.0 | −11.0 |

TABLE 4

| Magnetic Field Strength | Coating Deposition Rate (μm/hr) |
|---|---|
| 0.55 | 22 |
| 0.63 | 30 |
| 0.73 | 35 |
| 0.86 | 34 |
| 1.04 | 32 |

TABLE 5

Figure 13C:
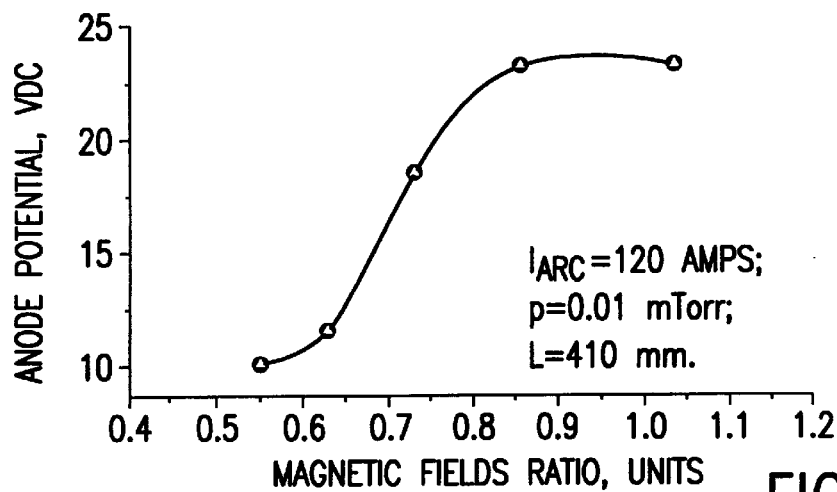

| Magnetic Field Ratio | Knoop Hardness Number |
|---|---|
| 0.63 | 396 |
| 0.73 | 627 |
| 0.86 | 859 |
| 1.04 | 898 | constant or it increases only slightly as the anode potential increases, and at the same time the substrate to be coated is at negative potential with respect to both the anode and the cathode. Therefore, an observed increase in anode potential means the difference in potential between the cathode the substrate will increase, and this increase in potential difference will increase the accelerating electric field existing within this highly conductive, quasi-neutral arc plasma and increase the plasma flow towards the substrate. Anode potential values for magnetic field ratios in the range of approximately 0.5–1.1 are tabulated in Table 3 and shown in FIG. 13c.

EXAMPLE 2

Another measure of the plasma flow is the coating deposition rate. The coating deposition rate of 316 stainless steel from a cathode onto a soft carbon steel substrate plate under the operating conditions of Example 1 was calculated by measuring the substrate mass over time and taking into account the density of the 316 stainless steel. The deposition rates are tabulated in Table 4 and shown in FIG. 13a.

The industrial advantages of the instant invention are not limited to current and deposition rates. The quality of the coatings produced using the instant invention is improved as well. For example, a critical property of the stainless steel coatings used in the above examples is "hardness." Hardness is generally defined as the resistance to deformation when the surface is subjected to a load of some fixed hardness. Metal coating hardness is often measured using the "Knoop test," and referenced using the "Knoop Number" that is the result of the Knoop test. The Knoop test uses a specific deformation geometry and a deforming probe made of industrial grade diamond. The higher the Knoop Number, the harder the material, or coating, in question.

Figure 14A:
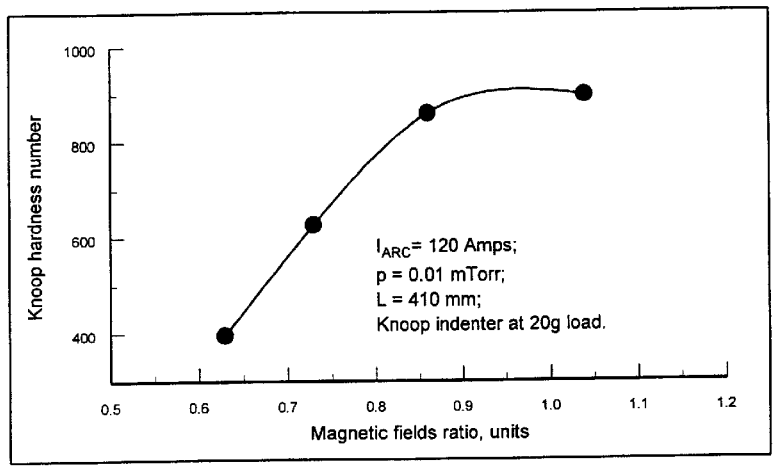
FIGS. 14a–14c are graphs of the physical properties Knoop hardness number, electrochemical potential, and surface roughness of the coated products versus magnetic field ratios.
Figure 14B:
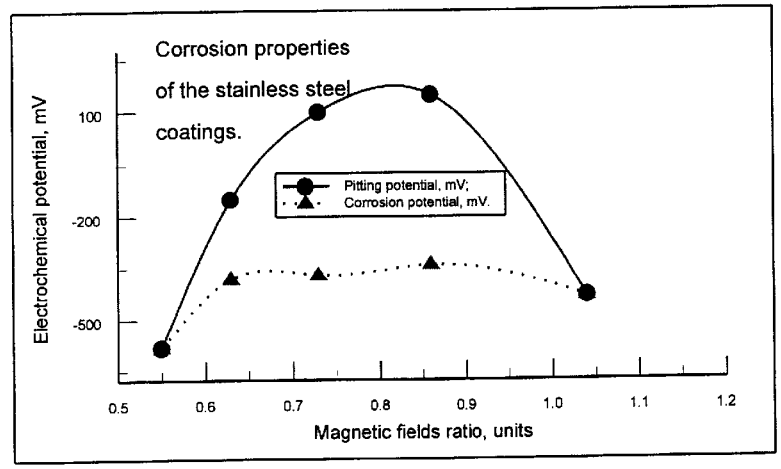

The Knoop hardness test was performed on the stainless steel coatings using the polished metallographic cross-section of the samples to eliminate the influence of the coating thickness and substrate hardness. The Knoop test was performed on coatings produced using the instant invention over this same general range of magnetic field strengths. Again, the conditions in the apparatus were kept constant as the magnetic field strength ratio was changed. A 20 gram load was used. The Knoop hardness results are tabulated in Table 5 and shown in FIG. 14a.

Of interest is the Knoop measurement of the bulk 316 stainless steel cathode material and the hardness of the soft carbon steel substrate before the stainless steel coatings were applied. The same 20 gram load was used, and the results are tabulated in Table 6.

TABLE 6

| Substrate | Knoop Hardness No. |
|---|---|
| Carbon Steel Substrate | 225 |
| 316SS Cathode | 425 |
| Bulk Pure Chromium | 495 |

TABLE 7

| Magnetic Field Ratio | Corrosion Potential (mV) |
|---|---|
| 0.55 | −550 |
| 0.63 | −380 |
| 0.73 | −370 |
| 0.86 | −340 |
| 1.04 | −430 |

The Knoop hardness measured for the stainless steel coatings is higher than for the sacrificial cathode material itself. This is believed to be due to the higher chromium content of the plasma stream and different crystalline structure of coatings when compared to the bulk. Furthermore, these stainless steel coatings are also harder than a grade of chromium that is used as a hard coating for many industrial applications to resist abrasive wear and corrosion.

EXAMPLE 3

The important commercial implication of the Knoop hardness results for the stainless steel coatings produced by the instant invention is the scratch- and corrosion-resistance of these coatings. The improved hardness measurements obtained by arc coating of 316-stainless steel as in the instant invention do not, by themselves, establish that the resulting coatings will exhibit the corrosion resistance critical to the industrial utility of stainless steel.

Figure 14C:
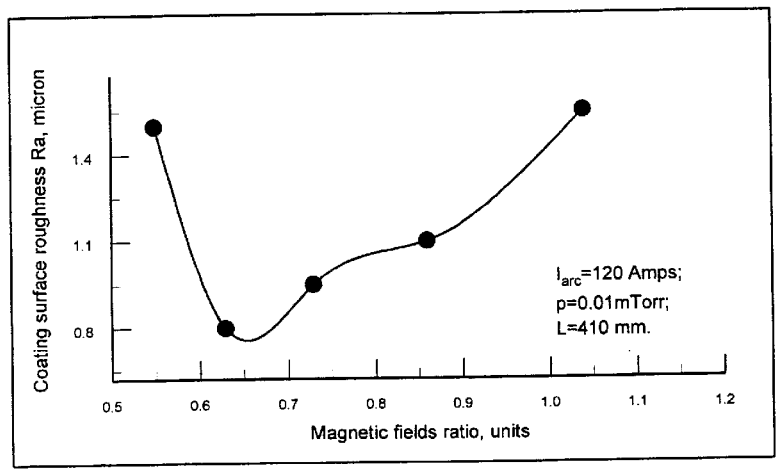

Electrochemical corrosion tests were performed to demonstrate the improved corrosion resistance and reduced susceptibility to pitting of the resulting coatings. The electrochemical tests involved measuring the corrosion potential of electrochemical cells in which the coatings were placed. The measured corrosion potentials of samples made using the instant invention are tabulated in Table 7 and shown in FIG. 14c.

Salt fog testing was performed. Mild steel substrate coupons (2"×2") were coated with stainless steel according to the present invention and exposed to a 5% sodium chloride salt fog environment at room temperature for 500 hours. Good corrosion protection was observed.

In another test, aluminum substrate coupons (2"×2") were coated with stainless steel according to the present invention and immersed in 0.7% sodium hydroxide solution. The control was a sample of conventionally treated anodized coated aluminum. The test continued until the anodized coating was destroyed. Good corrosion protection was observed on the test sample.

The coatings made by the present method and apparatus are very thick and uniformly thick. Preferably, the coating thickness is up to 20 μm or more. Depending on the severity of the corrosive environment of the end-use application, the coating thickness can be less than 10 μm, 10–15 μm, or 15–20 μm. The adhesion of the coatings to the substrate is very good without the need for an intermediate layer. For example, the coating can be easily polished mechanically without delamination of the coating from the substrate.

The property test results for the coated substrates reported here demonstrate that high quality and effective corrosion resistant and barrier coatings can be made by the presently described method and apparatus.

Comparison of Anode Designs

Figure 15:
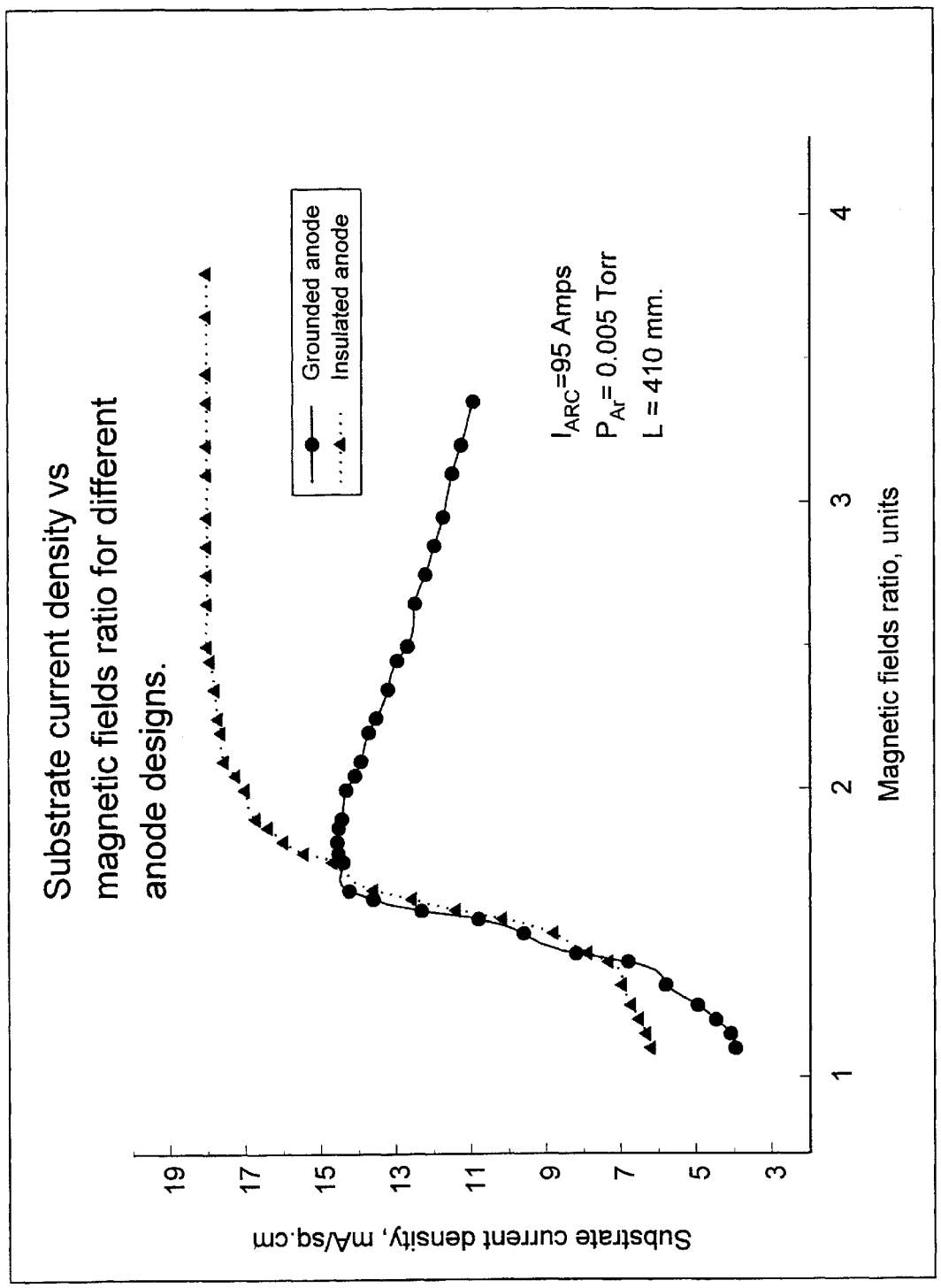
FIG. 15 is a comparison of the dependence of substrate current density on magnetic field ratio using an insulated and grounded anode.

FIG. 15 graphically depicts the dependence of the substrate current density on the magnetic field ratio for both a grounded anode and an insulated anode for an arc current of 95 amps, argon pressure of 0.005 Torr, and a substrate spaced 410 mm from the cathode. With respect to substrate current density, the results show that the insulated anode performs at least as well if not better than the grounded anode over the range of ratio values tested. In the region of tested magnetic field ratios of greatest interest, i.e., $R_B<1.5$, the substrate current density of the insulated anode is up to about 50% higher than the value observed using the grounded anode.

Second Embodiment

Figure 16:
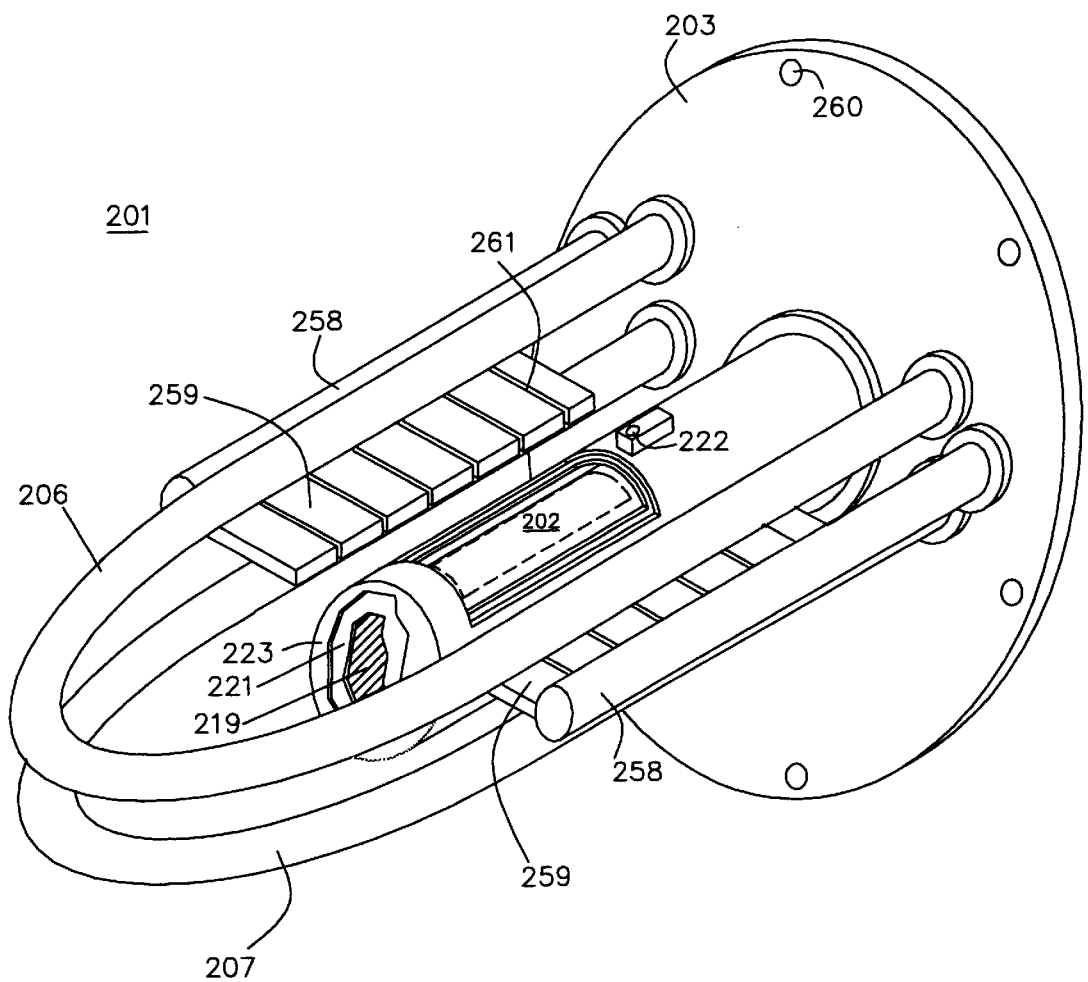
FIG. 16 is a perspective view of the plasma generator assembly of the second embodiment of the invention.

FIG. 16 shows a plasma generator assembly 201 of the second embodiment. The flange 203 supports the cathode 219 including the cathode working surface 202, an inner igniting screen electrode 221, an outer screen electrode 223, an arc igniter 222, the front magnetic field generator 206, the rear magnetic field generator 207, and a pair of anode conduits 258 feeding power to the anode electrodes 259. As in the first embodiment, the flange is secured to a vacuum chamber by suitable attachment means, such as bolts (not shown) through flange mounting holes 260.

By virtue of the position of the openings in the inner and outer screen electrodes, the cathode working surface 202 in this embodiment is found on the lateral side of the cylindrical cathode 219. About three-quarters of the lateral surface of the cathode is non-working due to the coverage by the screen electrodes. An appropriate cathode rotating mechanism (not shown) may be provided to turn the cathode periodically around the axis for more even consumption of the cathode material. The screen electrodes are disposed co-axial relative to the cathode. The electrodes are provided with at least one arc trigger device 222. Preferably, the trigger device takes the form of metallized ceramic rods or tubes disposed on both ends of the elongated cathode between the screen electrodes. Only one trigger 222 is shown in FIG. 16 for clarity. The trigger devices are preferably close enough to the open working surface of the cathode to initiate the arc discharge easily.

In use, the substrate would be exposed to the cathode working surface 202, preferably along an unobstructed line-of-sight. A partial sectional view of the butt end of the outer screen electrode reveals the butt end of the inner screen electrode 221. Beyond it lies the butt end of the cathode 219. Although not shown, the cathode may be hollow to allow cooling water to cool the cathode along substantially its entire length. Appropriate connections would be made through the flange.

Rather than a multi-turn coil magnet, the magnetic field generators may be single pass conductors, as shown in FIG. 16, having two straight sections and one bend so as to resemble the letter "U". According to the invention, the current flowing through the front magnetic field generator must flow in the opposite direction as the current flowing in the rear magnetic field generator. Hence, the magnetic field generators of the second embodiment are anti-parallel. The front magnetic field generator is positioned slightly to the substrate side of the cathode working surface. The rear magnetic field generator is positioned slightly to the rear of the magnetic field generator. Accordingly, the magnetic field generator of the second embodiment forms a magnetic cusp and electron trap similar to the cusp formed in the first embodiment apparatus.

The anode electrodes 259 lie between the magnetic field generator conductors along each lateral side of the cathode working surface. Anode conduits 258 feed electrical power to the anode electrodes and are positioned radially outside of the magnetic field generator conductors to decrease any influence of the anode currents on the arc discharge symmetry. The anode conduits may also be provided with magnetic cores 362 (FIG. 18) to decrease significantly the anode current influence. The side-by-side anode electrodes are spaced apart a small distance 261. The appropriate electrical connections for the anode electrodes, cathode, trigger, and screen electrodes are fed through the flange 203.

FIG. 17 shows four of the plasma generator assemblies of FIG. 16 placed in the corners of a vacuum chamber 204 for coating substrates 205 mounted on a circular, preferably rotating, substrate support 237. The plasma generator flange shown in Fie. 16 is not shown for clarity. It will be understood from FIG. 17, however, that the current-carrying conductors 206, 207, anode conduits 258, cathode 219, and electrode screens 221, 223 extend into the plane of the figure to position the cathode working surface generally opposite the substrates 205 preferably without obstruction.

Several structural features will be identified in FIG. 17. The bore 262 through the hollow cathode to admit cooling water can now be seen. The relative positioning of the front magnetic field generator 206 and the rear magnetic field generator 207 to either side of the cathode working surface is apparent in this view. The anode electrodes 259 are generally aligned or even with the cathode working surface 202, but variations are possible. Preferably, the substrate support is a planetary rotational system 237 so that substrates can be coated evenly.

FIG. 17 depicts the characteristic magnetic cusp and electron trap indicated by magnetic field lines 209 and electric field lines 215 produced by using pairs of anti-parallel conductors 206, 207 to either sides of the cathode working surface.

The magnetic fields produced by the front current carrying conductors 206 of the magnetic field generators are directed so that the cusp configuration extends around at least the surface of the substrate being coated as well. Such arrangement contains the plasma around the substrate thereby helping to maintain the plasma's beneficial influence on coating density, corrosion properties, chemical composition, hardness, coating thickness uniformity, etc., even as the natural loss of energetic plasma particles is taking place.

Third Embodiment

Figure 18:
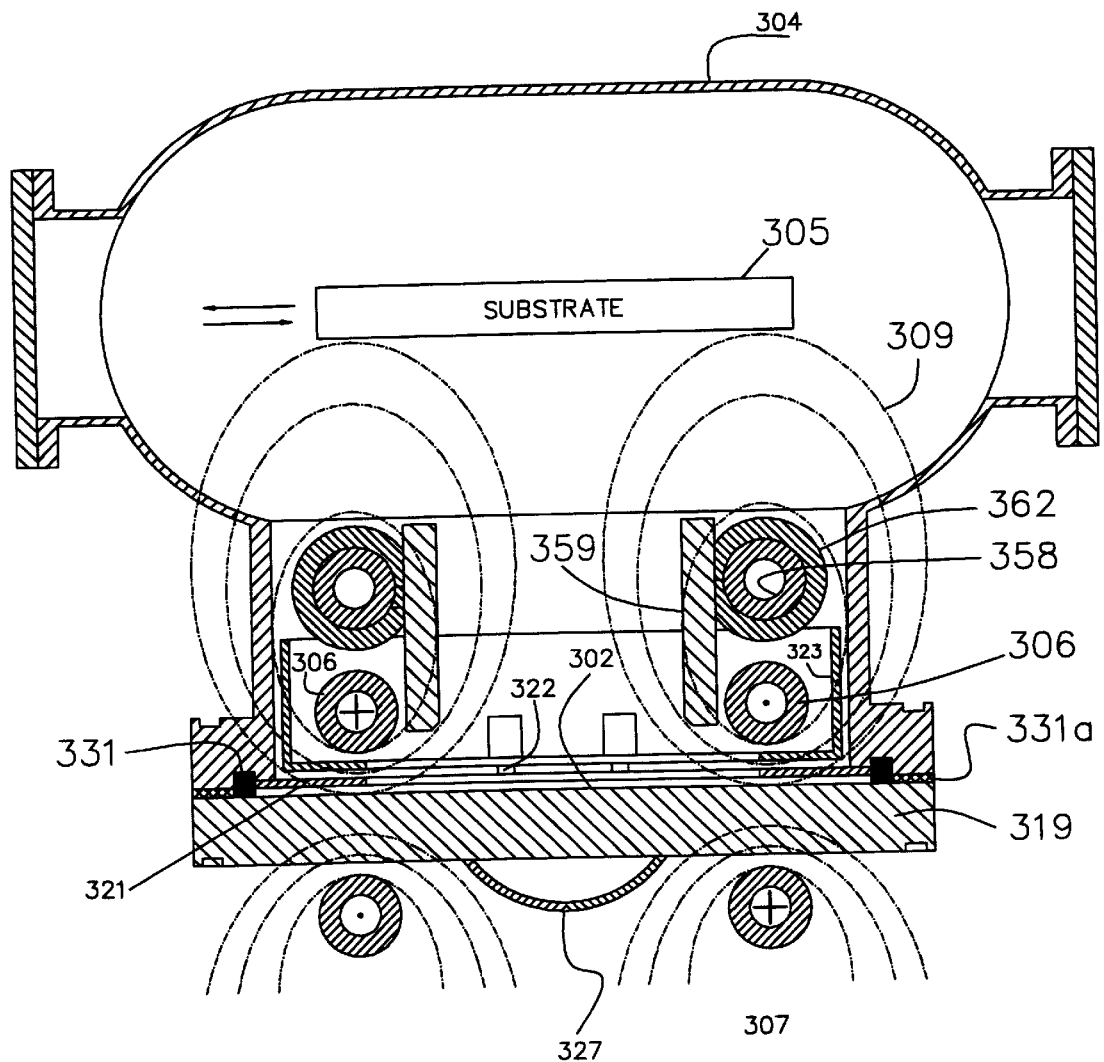
FIG. 18 is a sectional view of the apparatus of the third embodiment coating one side of a flat substrate.
Figure 19:
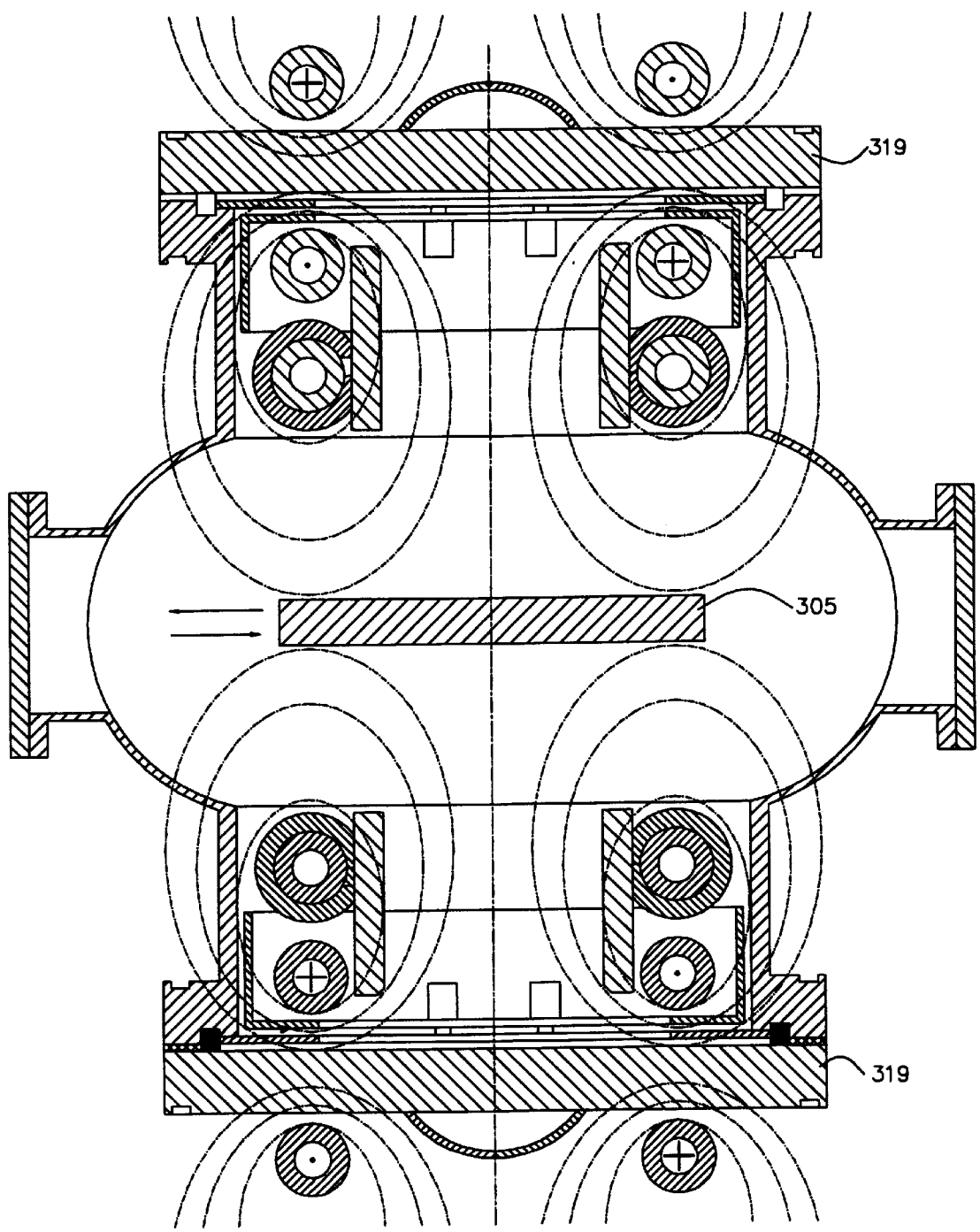
FIG. 19 is a sectional view of the apparatus of the third embodiment, coating both sides of a flat substrate, disposed on opposite sides of the vacuum chamber in order to simultaneously coat both sides of a flat substrate.

FIGS. 18–19 show the third embodiment of the invention. The third embodiment apparatus is especially well suited for flat elongated substrates. The substrate 305 may be passed through the vacuum chamber 304.

FIG. 18 shows a flat sacrificial cathode 319 which itself is a flange attached to the vacuum chamber 304. The cathode flange 319 is electrically insulated from the rest of the chamber via vacuum seal 331 and insulating spacer 331a. Attached to the exterior surface of the cathode is cooling water conduit 327.

Inside the chamber are inner igniting screen electrode 321 and outer screen electrode 323 adjacent to which are arc igniting trigger devices 322 which can be made of metallized ceramic rods or tubes. An anode conduit 358 and anode electrode 359 structure similar to that described with reference to the second embodiment are also shown. Anode conduit is provided with optional magnetic core 362 to decrease significantly the anode current influence on the magnetic cusp configuration indicated by magnetic lines of force 309. Anode electrodes 359 similar to those described above with respect to the second embodiment are also shown. As in the second embodiment, the anode electrodes are electrically connected to the anode electric conduit 358. In contrast to the general alignment between the anode electrodes and the radial slot opening of the magnetic cusp in the second embodiment, the anode electrodes in the third embodiment are generally perpendicular and adjacent to the flat cathode working surface 302.

Front magnetic field generator 306, which may be a single pass conductor or a multi-turn coil, is shown on the substrate side of the flat cathode working surface 302. The rear magnetic field generator 307, which also may be a single pass conductor or a multi-turn coil, is shown on the exterior or rear side of the flat cathode working surface. The front magnetic field generator has current flowing in one direction while the rear magnetic field generator has an independently controllable current flowing in the opposite direction. Magnetic field generator power supply means for these generators are not shown for clarity. Accordingly, the front and rear magnetic field generators 306, 307 are anti-parallel and establish the characteristic magnetic cusp configuration and electron trap discussed above. As noted above, the symbols "+" and "●" are not intended to specify a particular current flow direction, but rather they are used simply to show that current in the front magnetic field generator 306 flows in the opposite direction to that of the rear generator 307. The apparatus shown in FIG. 19 is similar to that shown in FIG. 18, but a second plasma generator is situated on the opposite side of the substrate to enable coating both sides of the flat substrate simultaneously.

Fourth Embodiment

FIGS. 20, 20a, and 21–25 show the fourth embodiment of the invention. The fourth embodiment is similar to the third embodiment in many respects, but the fourth embodiment uses an anode which is in direct physical though electrically insulated contact with the current carrying conductor of the magnetic field generator. That is, the anode electrode and front magnetic field conductor are located in very close proximity to one another rather than separated from each other by a reduced pressure space as in the first, second, and third embodiments.

Specifically, the positive pole of the arc power supply (not shown) is electrically connected to the anode electrode layer 459 of the front magnetic field generator conductor 406. The magnetic field generator conductor 406 carries a single, thick conductor (not shown), or, alternatively, a bundle of magnetic field generator conductors wires 406a carrying the magnetic field generator current from the magnetic field generator power supply (not shown). The thick conductor can be just a copper tube with cooling water flowing inside. The tube itself can be the anode electrode layer 459. An insulating material 463 electrically insulates the magnetic field generator current from the anode electrode layer 459.

The magnetic field generator current flowing in the front generator 406 flows in the opposite direction as that of the other generator 407 on the opposite side of the cathode 419. Independent control of the current flowing through the front magnetic field generator, the rear magnetic field generator, and the anode electrode voltage is maintained by power supply means (not shown).

Figure 20:
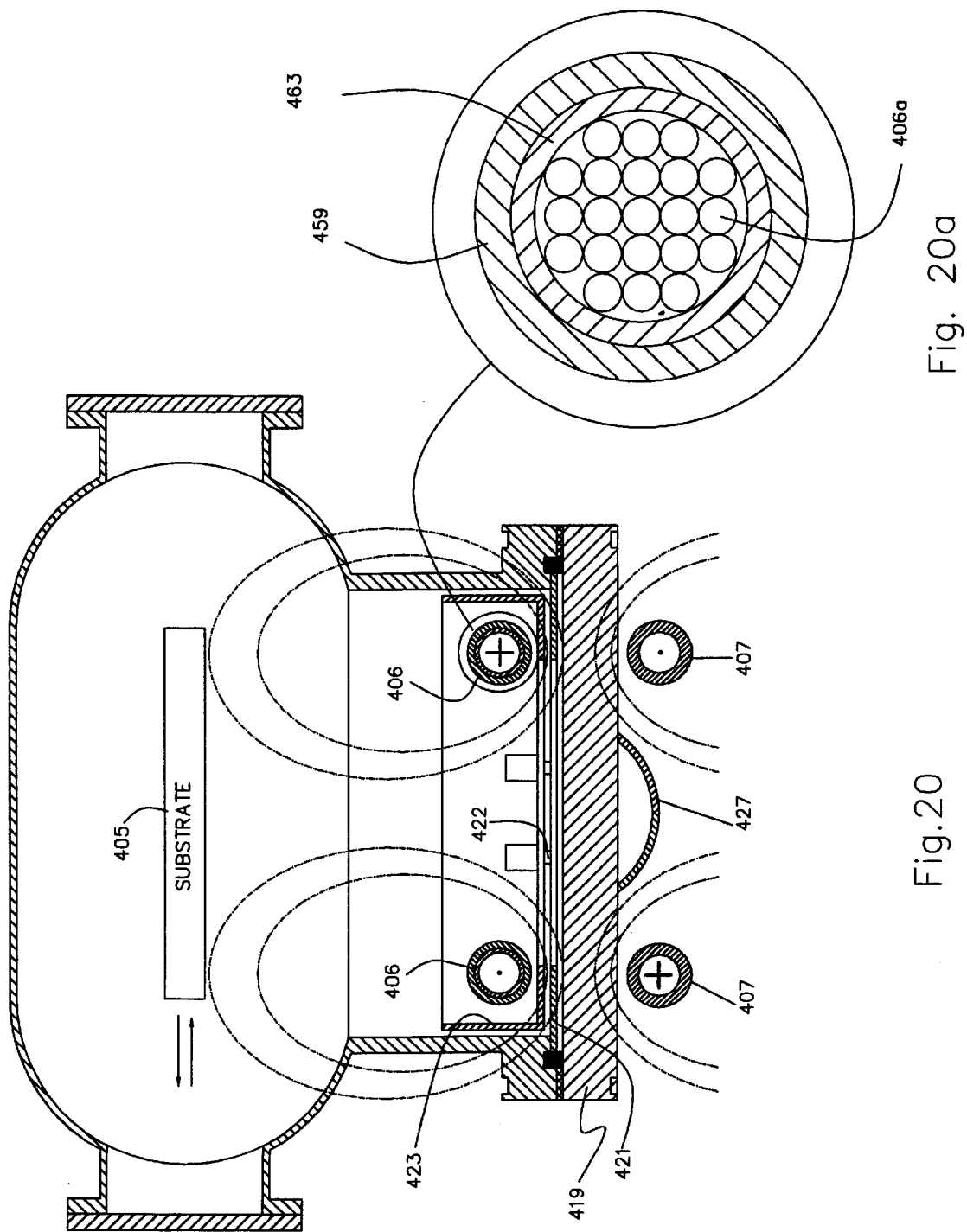
FIG. 20 is a sectional view of the apparatus of the fourth embodiment coating one side of a flat substrate a flat substrate.

FIG. 20 shows elongated flat substrate 405, igniter 422, cathode cooling conduit 427, inner screen electrode 421, and outer screen electrode 423. While FIG. 20a is a detail view of the structure of the combined current carrying magnetic field generator and anode, the notation "+" and "●" in FIGS. 20, 21–25 is a schematic representation of either a single solid conductor or the wire bundle detailed in FIG. 20a.

The front and rear magnetic field generating currents preferably flow through serpentine conduits 406, 407 aligned one above the other on each side of the flat cathode 419, as best shown in FIGS. 24 and 25. In order to establish the characteristic magnetic cusp configuration, the skilled artisan by now will immediately understand that the currents in the front and rear magnetic field generators 406, 407 flow in opposite directions, as shown by arrows in FIG. 25. As in the other embodiments, these currents are independently adjustable so that the magnetic field ratio can be controlled as desired.

Figure 21:
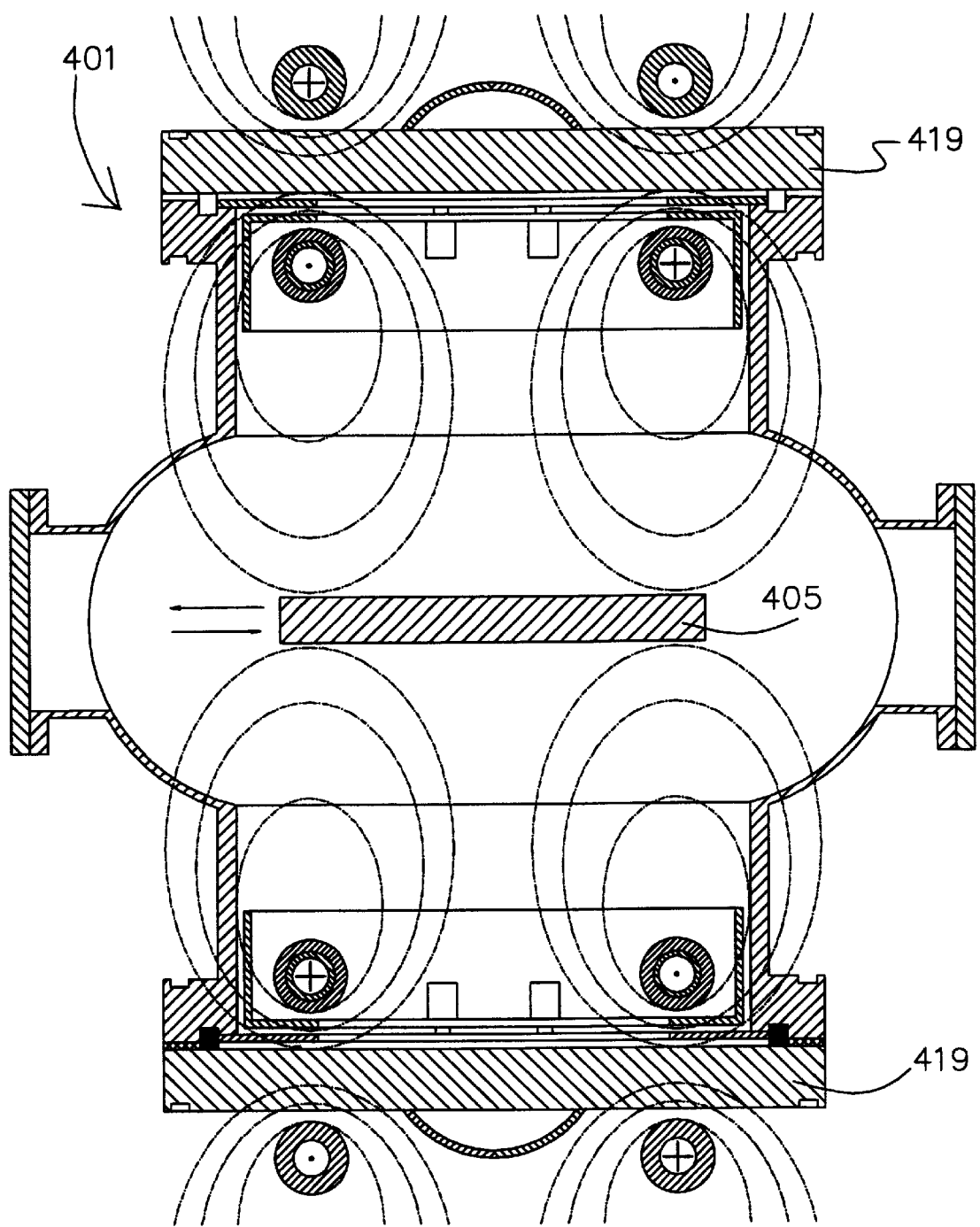
FIG. 21 is a sectional view of the apparatus of the fourth embodiment coating both sides of a flat substrate.

The FIG. 21 shows an apparatus similar to the one shown in FIG. 20, but a second plasma generator assembly 401 is situated on the opposite side of the substrate 405 to enable coating both sides of the flat substrate simultaneously. By operating these two plasma generator assemblies at different processing conditions, such as different magnetic field strength ratios, anode potentials, or different composition flat cathodes 419, for example, coatings having different composition or physical properties may be simultaneously coated onto opposite sides of a substrate. Very interesting combinations of coatings or coating layer properties may be obtained by turning over the substrate during such a processing run. Stratified or anisotropic coatings may be produced in this manner. The skilled artisan will recognize that these capabilities apply to be both the third and fourth embodiments of the invention shown in FIG. 19 and FIG. 20, respectively.

Figure 22:
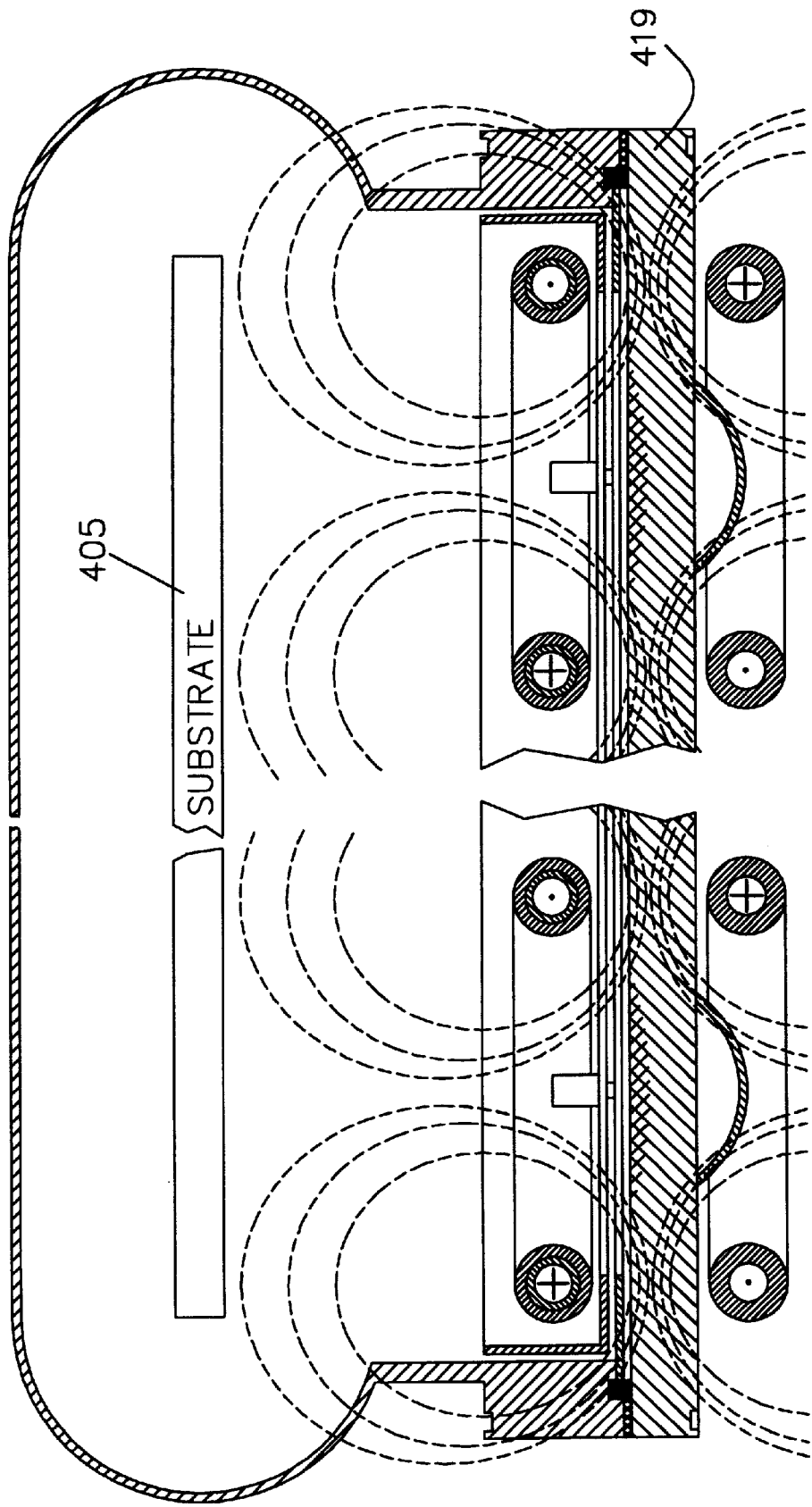
FIG. 22 is a sectional view of the apparatus of the fourth embodiment having a plurality of magnetic field sections arranged side by side.
Figure 23:
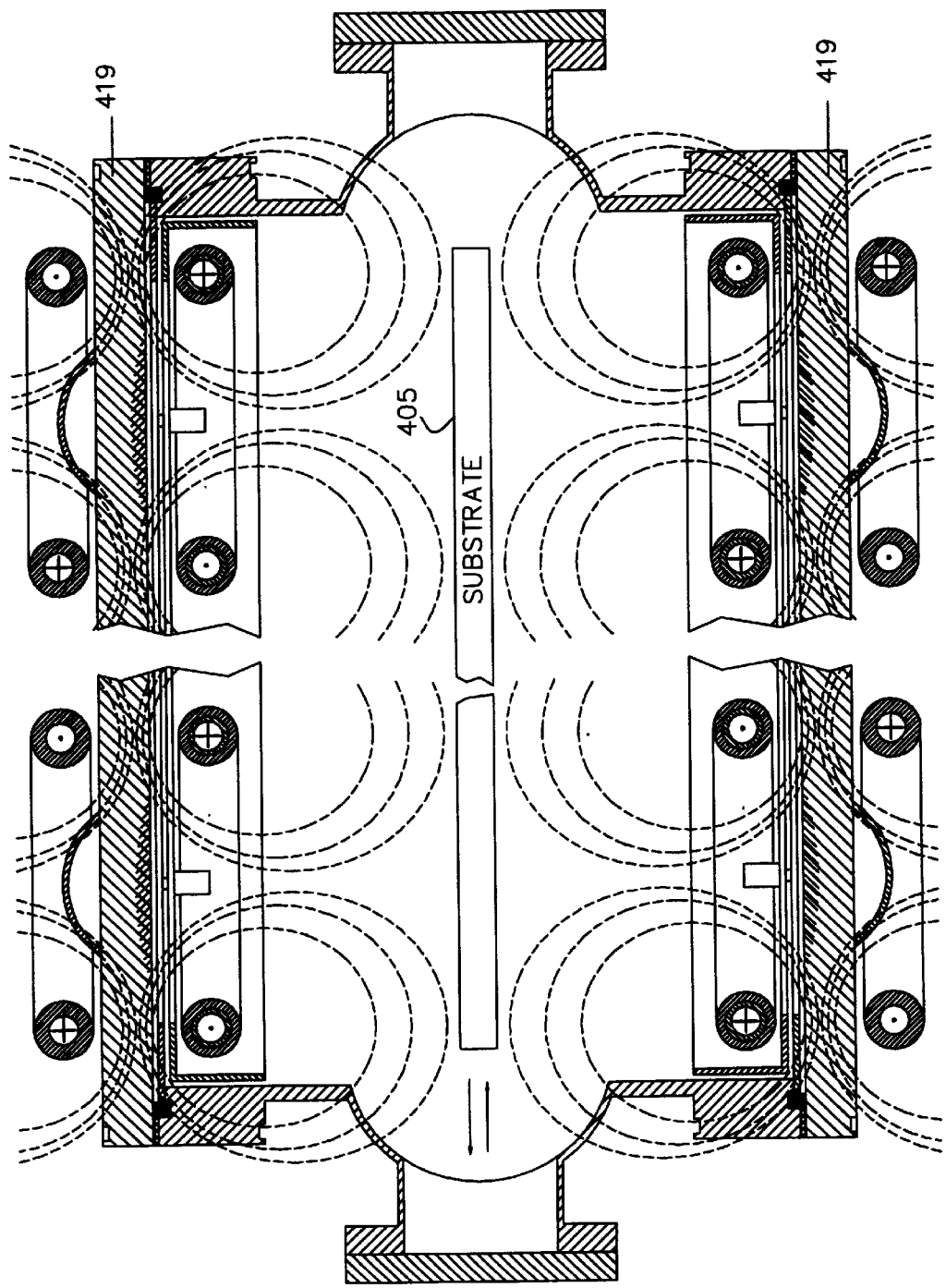
FIG. 23 is a sectional view of the apparatus of the fourth embodiment shown in FIG. 22 coating both sides of a flat substrate.

FIGS. 22 and 23 are cross sectional views of the chamber 404, substrate 405, and plasma generator assembly 401 showing the one- and two-sided variants of the serpentine multiple pass fourth embodiment.

With reference to FIG. 25, a combined assembly of a magnetic field generator and an anode electrode similar to the design detailed in FIG. 20a is placed on each side of a flat cathode 419. Preferably, the anti-parallel current carrying conductor assemblies are serpentine in shape. Each pass of each assembly is spaced apart by a distance D. The oppositely-flowing conductor assemblies are separated from each other by a spacing distance L. The conductor assemblies are aligned so that each straight or curved section of one assembly adjacent to the cathode is substantially directly above (or below) the corresponding section of the assembly on the opposite side of the cathode having magnetic field generating current flowing in the opposite direction. In the serpentine shape shown in FIGS. 24–25, while it is not necessary for the curbed sections which overhang the cathode boundary to be in alignment, it is most convenient for all sections of the assemblies to be in proper anti-parallel alignment. Such arrangement creates periodic quadrupole shaped magnetic fields 409 over the cathode working surface 402. The cathode 419 is connected to a negative pole of at least one arc discharge power supply. At least one positive pole of the arc discharge power supply is connected to the anode electrode portion of each current carrying conductor assembly 406, 407. The cathode may be provided with a number of current-collecting connectors 464 disposed around the cathode surface boundary against the magnetic field generator conductors and supplied with power by any convenient number of arc discharge power supplies 416. The positive poles of these arc discharge power supplies are connected to the anode electrode layer 459 at the ends of the linear section of the combined magnetic field generator/anode electrode current carrying conductor 406. The negative poles are connected to the nearest cathode connectors 464 to provide better arc control over the large area cathode.

To decrease the influence of arc current passing through the anode on discharge uniformity, the anode may be made as a separate electrode assembly that may be disposed in parallel to the magnetic field generator 406 and provided with separate anode conduits for arc current passage (not shown). Each anode conduit is disposed mainly in parallel to the neighboring portion of the magnetic field generator 406 and has the same direction and much less value of the current portion passing through it in comparison to the corresponding conductor current to minimize the arc discharge current influence. As in the thrid embodiment, each anode conduit may be provided with a magnetic core to eliminate the influence of the arc discharge current passage through the anode conduits.

Fifth Embodiment

With respect to FIGS. 26–27, a cathode arc deposition apparatus 501 according to the fifth embodiment comprises a sacrificial elongated cylindrical cathode 519 made of the material to be evaporated. The cathode is mounted within a vacuum chamber 504. At least one end of the elongated cathode is connected to a negative output of an arc discharge power supply 516 and a positive output of the power supply is connected to at least one of the nearest ends of the anode coil 558. Both ends of the cathode 519 may be connected to the negative output of the power supply 516 and both ends of the anode coils 558 may be connected to the positive output of the power supply 516. Each end of the elongated cathode may be connected to the negative outputs of the separate arc discharge power supplies and each portion of the anode electromagnetic coil may be connected to the positive outputs of the power supplies to provide better control of the arc spots motion in both directions along the cathode length. An appropriate cathode rotating mechanism (not shown) may be provided to turn the cathode periodically around the axis for more even consumption of the cathode material.

An anode may comprise at least a single electromagnetic coil having a bifilar winding with the pitch of the winding exceeding the distance to the cathode. The electromagnetic coil may consist of two separate helical portions winded together around the cylindrical cathode with a pitch of winding exceeding the distance to the cathode and supplied with opposite currents relative to each other from at least a single coil power supply. The electromagnetic coil portions may be connected to separate coil power supplies 513 to provide better control of the cathode arc spots.

Each end of the cathode is provided with inner and outer screen electrodes 521, 523 comprising trigger devices 522 for arc discharge initiation and to confine the arc discharge to the desirable portion of the cylindrical surface of the cathode. The inner or igniting screen electrode is connected to a pulsed power supply 517 for arc initiation. The trigger devices 522 are similar in function and structure to those described above in the context of the other embodiments.

One or more substrates 505 to be deposited with coatings are positioned opposite the cathode working surface outside of the anode electromagnetic coils and may be moved or rotated by a positioning fixture around the cathode for better uniformity of coating deposition. Preferably, bias is applied to the substrates by a substrate bias power supply 518.

Sixth Embodiment

Figure 28:
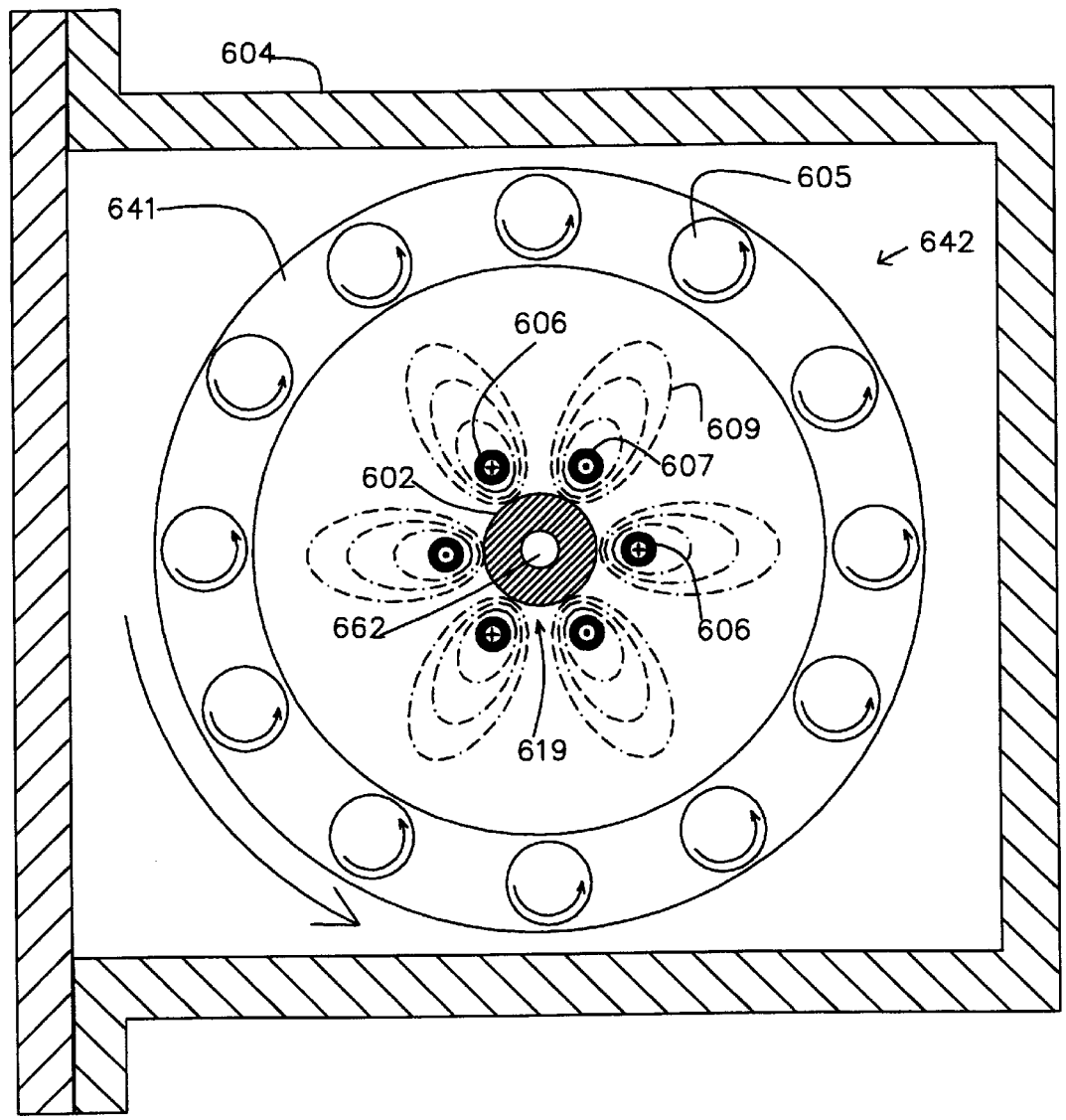
FIG. 28 is a view of the sixth embodiment installed in a vacuum chamber.

FIG. 28 is a plan view of the sixth embodiment of the plasma generator assembly. Material evaporated from the cathode working surface 602 of centrally disposed elongated cylindrical cathode 619 flows past a phalanx of current carrying conductor sections 606, 607 which create the characteristic cusp-shaped magnetic field indicated by lines of forces 609. The vapor is deposited onto substrates 605 carried by revolving substrate holder 641. The substrate positioner 642 includes planetary rotating means (not shown) which effect the indicated rotation of the substrates as the substrate holder 641 revolves about the cathode 619. Optionally, cathode central bore 662 may carry a cooling fluid, such as cooling water, to control the temperature of the cathode.

Figure 29:
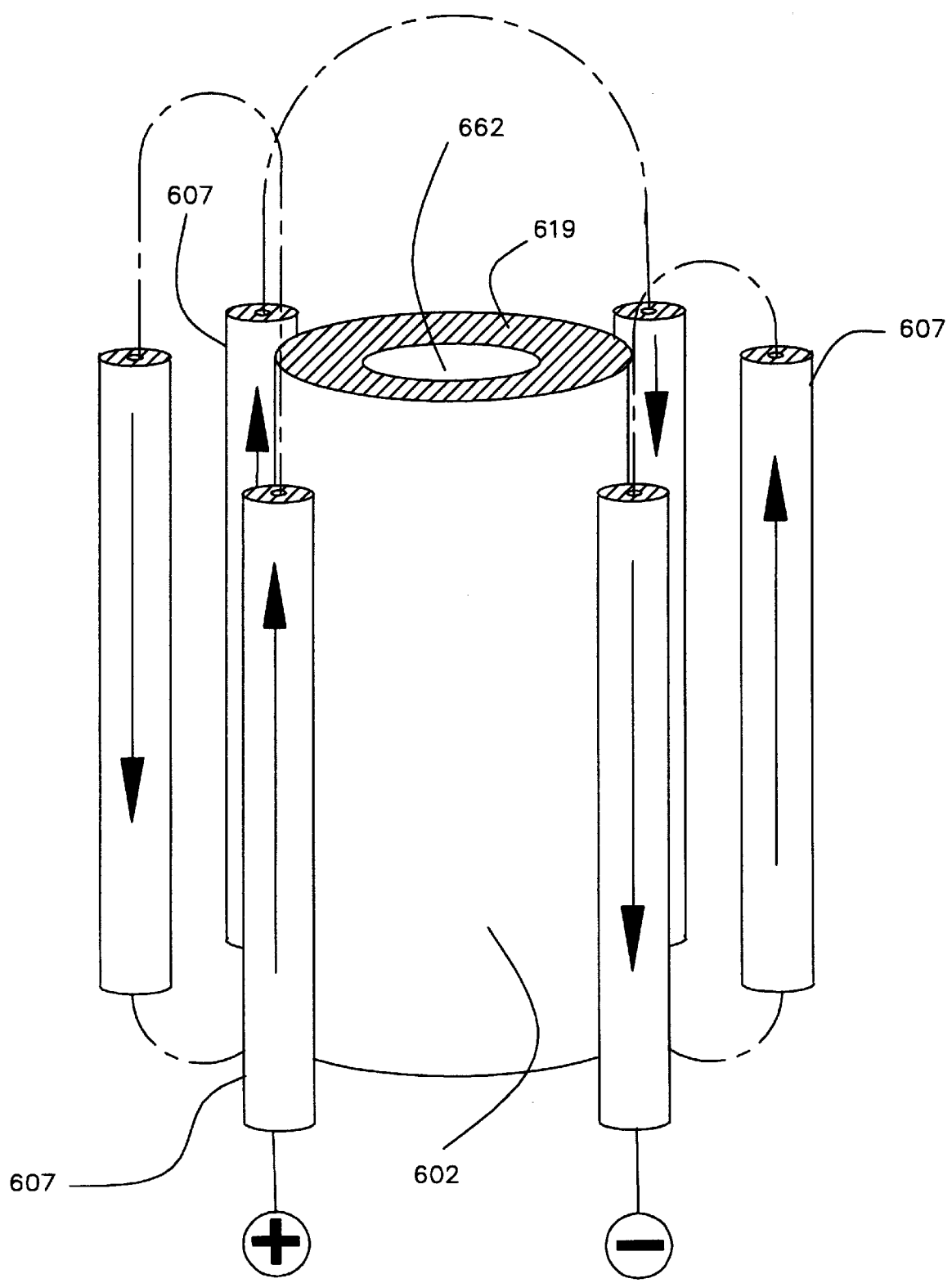
FIG. 29 is a perspective view of the cathode and current carrying conductor of the sixth embodiment.

The magnetic field generator in this embodiment is best shown in FIG. 29. The magnetic field generator is a single current carrying conductor having a plurality of first direction sections 606 carrying current in a first direction and a plurality of opposite direction sections 607 carrying current in a direction that is opposite to the first direction. Arrows have been added to sections 606, 607 to indicate the directional nature of the current flow through the current carrying conductor, but are not intended to indicate any particular limitation the "first direction" and "opposite direction" other than the limitation stated here, namely, that the current flow directions be opposite to one another. Similarly, the use of the "+" and "●" symbols in FIG. 28 are not intended to indicate any particular direction. Use of these symbols is intended only to indicate the opposite nature of current flow direction of adjacent sections. Preferably, a first direction section sections 606 is positioned approximately 1800 across the cathode center from an opposite direction flowing section 607. The curved sections of the current carrying conductor, shown by broken lines in FIG. 29, may connect adjacent sections of the conductor.

It will be clear from this disclosure that with respect to the current carrying conductor itself, the direction of flow of the current passing therethrough does not change. The direction "changes" to the opposite direction only with respect to the cathode working surface. In this way, at any given point along the cathode working surface 602, there is a strong magnetic field produced by the closest section of the current carrying conductor and a less strong anti-parallel magnetic field positioned at a point on the opposite side of the cathode. Since the current carrying conductor section on the opposite side of the cathode carries the same current but at a further distance, the vaporized cathode material immediately adjacent the cathode working surface is contained within a magnetic cusp and electron trap.

The value of the magnetic field ratio at the cathode working surface depends on the relative spacing of the sections 606, 607 from the cathode central axis (not shown), i.e., the "phalanx radius," and the cathode radius. By adjusting this geometric relationship, the preferred magnetic field ratio may be "built into" the apparatus. Of course, the phalanx radius and cathode radius may be adjusted easily at will.

While I have described what are presently contemplated as being the preferred embodiments of the present invention, further changes and modifications could be made by those skilled in the art without departing from the scope of the invention, and it is contemplated to claim all such changes and modifications. The embodiments described above arc non-limiting illustrations of the invention. For example, the coated products may be polished after the vapor deposition step.

I claim:

1. A plasma generator assembly for use in an electric arc vapor deposition coating apparatus, comprising: a stainless steel cathode having a working surface and a non-working surface; an outer screen electrode; an inner screen electrode co-axially aligned with the outer screen electrode, said inner screen electrode blocking a line of sight between said non-working surface and said outer screen electrode; an arc initiating device positioned between and in electrical contact with the inner screen electrode and the outer screen electrode, wherein at least a portion of the arc initiating device is a metallized ceramic tube or rod; an anode having an anode working surface at least a portion of which is along a line of sight of the cathode working surface, said anode being positioned radially beyond the inner and outer screen electrodes; a gas distributor capable of admitting gas between the cathode working surface and the anode working surface; and means for electrically connecting the arc initiating device to a pulsed power supply.

2. An apparatus for deposition a coating onto a substrate comprising: a cathode including a cathode working surface; an anode having an anode working surface; arc discharge power supply means for maintaining an electric arc discharge between said working surfaces, said power supply means being operatively connected to said cathode and said anode; a substrate support adapted to receive and support said substrate; a chamber containing said working surface and substrate support; and a magnetic field generator for applying a cusp-shaped magnetic field to at least a portion of the cathode, wherein said magnetic field generator includes a first magnetic field generator for generating a first field portion of said magnetic field and a second magnetic field generator for generating a second field portion of said magnetic field; said first magnetic field generator positioned in a region in front of the cathode working surface and the second magnetic field generator positioned in a region behind the cathode working surface.

3. The apparatus of claim 2 wherein said first field portion and said second field portion are oppositely polarized thereby defining between the first and second field portions a magnetic field center at which point the strength of the magnetic field is zero and a separatrix passing through said magnetic field center; and said magnetic field center is located within the cathode.

4. The apparatus of claim 3 wherein said first field generator includes a current carrying conductor.

5. The apparatus of claim 4 wherein the current carrying conductor is a coil.

6. The apparatus of claim 4 wherein the first field generator includes a substantially linear or curvilinear section of said current carrying conductor.

7. The apparatus of claim 6 wherein the first field generator includes a plurality of linear or curvilinear sections.

8. The apparatus of claim 7 wherein the current carrying conductor is "U"-shaped.

9. The apparatus of claim 7 wherein the shape of the current carrying conductor is periodic and said plurality of sections correspond to repeating units of the conductor.

10. The apparatus of claim 9 wherein the shape of the current carrying conductor is serpentine, square-wave, or saw-tooth.

11. The apparatus of claim 4 wherein the cathode working surface is substantially the entire circumferential surface of an elongated cathode.

12. The apparatus of claim 11 wherein the cathode is a cylinder or a polyhedron.

13. The apparatus of claim 11 wherein the first generator is a first section of said conductor,
    the second generator is a second section of said conductor, and said first and second sections of the conductor are disposed on opposite sides of the cathode in contrary to each other on the opposite sides of the cathode.

14. The apparatus of claim 13 wherein said first and second sections of the conductor are both together spirally or helically arranged constituting a bifilar spiral around the cathode.

15. The apparatus of claim 13 wherein the first and second sections of the conductor includes substantially linear and curvilinear portions of the conductor, the linear portions are extended along the length of the cathode, and the curvilinear portions of the conductor connect with linear portions to form a serpentine, square-wave, or saw tooth shaped periodic structure arranged around the cathode in such a way that electrical current in the adjacent linear portions of the conductor flows in an opposite direction.

16. The apparatus of claim 4 further comprising a first field generator power supply operatively connected to said first field generator for adjusting the magnetic field strength of the first field portion; or a second field generator power supply operatively connected to said second field generator for adjusting the magnetic field strength of the second field portion.

17. The apparatus of claim 3 wherein the strength of the first field does not equal the strength of the second field.

18. The apparatus of claim 17 wherein the first generator is between the cathode working surface and the substrate support, and the magnetic field ratio of the strength of the first field portion to the strength of the second field portion is 0.5–2.0.

19. The apparatus of claim 18 wherein the magnetic field ratio is 0.8–1.5.

20. The apparatus of claim 19 wherein the magnetic field ratio is 1.1–1.3.

21. The apparatus of claim 3 wherein the cathode working surface is axially displaced a predetermined distance from the separatrix.

22. The apparatus of claim 21 wherein the cathode working surface is axially displaced a predetermined distance toward the substrate support.

23. The apparatus of claim 22 wherein the predetermined distance is less than half of the distance between the first and second field generators.

24. The apparatus of claim 22 wherein the predetermined distance is 20 mm or less.

25. The apparatus of claim 24 wherein the predetermined distance is 5–15 mm.

26. The apparatus of claim 25 wherein the predetermined distance is about 10 mm.

27. The apparatus of claim 2 further comprising a gas distributor capable of admitting gas into the chamber in the vicinity of the intersection of the separatrix and the anode working surface.

28. The apparatus of claim 27 wherein the gas distributor is an integral portion of the anode.

29. The apparatus of claim 2 wherein the anode is electrically insulated from the chamber.

30. The apparatus of claim 2 further comprising an inner screen electrode and an outer screen electrode.

31. The apparatus of claim 2 further comprising an arc ignition device operatively connected to a pulsed power supply.

32. The apparatus of claim 31 wherein said arc ignition device is an arc igniting electrode positioned between an inner screen electrode and an outer screen electrode.

33. A process for cathode arc vapor deposition of a coating material onto a substrate, comprising: placing the substrate within a vacuum chamber; positioning a cathode made from a desired coating material within the chamber; reducing a chamber pressure to a desired operating pressure; applying an anti-parallel magnetic field to the cathode such that a magnetic field center having a zero field strength value is positioned within the cathode; and initiating an arc discharge.

34. The process of claim 33 wherein the magnetic field is asymmetrical.

35. The process of claim 33 wherein the applying step includes applying a magnetic field to an area in front of the cathode; and applying an oppositely polarized magnetic field to a rear area of the cathode.

36. The process of claim 35 wherein the ratio of the strength of the front magnetic field to the strength of the rear magnetic field is 0.5–2.0.

37. The process of claim 36 wherein the ratio of the strength of the front magnetic field to the strength of the rear magnetic field is 0.8–1.5.

38. The process of claim 37 wherein the ratio of the strength of the front magnetic field to the strength of the rear magnetic field is 1.1–1.3.

39. The process of claim 35 further comprising maintaining a predetermined axial displacement of the cathode working surface in front of the magnetic field center by adjusting the ratio of the strength of the front magnetic field to the strength of the rear magnetic field.

40. The process of claim 39 wherein the predetermined displacement is less than about 20 mm.

41. The process of claim 40 wherein the predetermined displacement is about 5–15 mm.

42. The process of claim 41 wherein the predetermined displacement is about 10 mm.

43. The process of claim 35 further comprising adjusting the magnetic field strength of either or both of the front and rear magnetic fields to increase the magnetic field strength ratio as the cathode is consumed.

44. The process of claim 33 wherein the coating material is stainless steel.

45. The process of claim 44 further comprising terminating arc discharge before a coating is 50 microns thick.

46. The process of claim 45 further comprising terminating arc discharge before the coating is 20 microns thick.

47. The process of claim 46 further comprising terminating arc discharge before the coating is 15 microns thick.

48. The process of claim 47 further comprising terminating arc discharge before the coating is 10 microns thick.

49. The process of claim 44 further comprising terminating arc discharge after the coating is at least 50 microns thick.

50. The process of claim 49 further comprising terminating arc discharge after the coating is at least 20 microns thick.

51. The process of claim 50 further comprising terminating arc discharge after the coating is at least 15 microns thick.

52. The process of claim 51 further comprising terminating arc discharge after the coating is at least 10 microns thick.

53. The process of claim 35 wherein the applying step includes applying the front magnetic field and rear magnetic field from positions located outside the vacuum chamber.

54. The process of claim 35 wherein the applying step includes applying at least one of said front and rear magnetic fields from a location within the vacuum chamber.

55. The process of claim 54 wherein the applying step includes applying both of said front and rear magnetic fields from a location within the vacuum chamber.

* * * * *